United States Patent
Kim et al.

(10) Patent No.: US 10,256,412 B2
(45) Date of Patent: *Apr. 9, 2019

(54) ANTHRACENE-BASED COMPOUND AND ORGANIC LIGHT-EMITTING DEVICE INCLUDING THE SAME

(71) Applicant: SAMSUNG DISPLAY CO., LTD., Yongin, Gyeonggi-Do (KR)

(72) Inventors: Young-Kook Kim, Yongin (KR); Seok-Hwan Hwang, Yongin (KR); Hye-Jin Jung, Yongin (KR); Jun-Ha Park, Yongin (KR); Jong-Woo Kim, Yongin (KR); Eun-Young Lee, Yongin (KR); Jin-O Lim, Yongin (KR); Sang-Hyun Han, Yongin (KR); Eun-Jae Jeong, Yongin (KR); Kwang-Hyun Kim, Yongin (KR); Soo-Yon Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 725 days.

This patent is subject to a terminal disclaimer.

(21) Appl. No.: 14/251,754

(22) Filed: Apr. 14, 2014

(65) Prior Publication Data

US 2015/0048321 A1    Feb. 19, 2015

(30) Foreign Application Priority Data

Aug. 14, 2013    (KR) .................. 10-2013-0096897

(51) Int. Cl.
*H01L 51/00* (2006.01)
*H01L 51/50* (2006.01)

(52) U.S. Cl.
CPC ...... *H01L 51/0058* (2013.01); *H01L 51/0052* (2013.01); *H01L 51/0054* (2013.01); *H01L 51/0081* (2013.01); *H01L 51/5016* (2013.01)

(58) Field of Classification Search
None
See application file for complete search history.

(56) References Cited

U.S. PATENT DOCUMENTS

| | | | | |
|---|---|---|---|---|
| 5,281,489 A | * | 1/1994 | Mori | ............ C09K 11/06 313/498 |
| 5,635,308 A | | 6/1997 | Inoue et al. | |
| 5,972,247 A | | 10/1999 | Shi et al. | |
| 6,361,886 B2 | * | 3/2002 | Shi | ............ H01L 51/005 252/301.16 |
| 6,465,115 B2 | | 10/2002 | Shi et al. | |
| 6,596,415 B2 | | 7/2003 | Shi et al. | |
| 9,178,001 B2 | * | 11/2015 | Kwak | ............ H01L 51/5265 |
| 9,425,407 B2 | * | 8/2016 | Hwang | ............ H01L 51/0058 |
| 9,583,715 B2 | * | 2/2017 | Park | ............ H01L 51/0058 |
| 2002/0132134 A1 | * | 9/2002 | Hu | ............ C07C 13/567 428/690 |
| 2006/0008672 A1 | * | 1/2006 | Jarikov | ............ C09K 11/06 428/690 |
| 2006/0014046 A1 | | 1/2006 | Wang et al. | |
| 2006/0234084 A1 | * | 10/2006 | Cosimbescu | ............ C09K 11/06 428/690 |
| 2007/0152565 A1 | | 7/2007 | Kubota et al. | |
| 2007/0247063 A1 | | 10/2007 | Murase et al. | |
| 2009/0200926 A1 | | 8/2009 | Lee et al. | |
| 2013/0001526 A1 | * | 1/2013 | Kwak | ............ H01L 51/5265 257/40 |

FOREIGN PATENT DOCUMENTS

| | | |
|---|---|---|
| EP | 1-341-242 A2 | 9/2003 |
| EP | 1-443-572 A2 | 8/2004 |
| JP | 8-12600 A | 1/1996 |
| JP | 11-003782 | 1/1999 |
| KR | 10-2006-0049909 A | 5/2006 |
| KR | 10-2006-0113954 A | 11/2006 |
| KR | 10-2007-0032658 A | 3/2007 |
| KR | 10-2009-0058063 A | 6/2009 |
| KR | 10-2012-0070468 A | 6/2012 |
| KR | 10-2012-0091969 A | 8/2012 |
| WO | WO 2010/090925 A1 * | 8/2010 |

* cited by examiner

*Primary Examiner* — Dawn L Garrett
(74) *Attorney, Agent, or Firm* — Lee & Morse, P.C.

(57) ABSTRACT

An anthracene-based compound and an organic light-emitting device including the anthracene-based compound, the anthracene-based compound being represented by Formula 1, below:

<Formula 1>

$(R_1)_{a1}$ $(R_2)_{a2}$ $-(L)_n-Ar]_m$

12 Claims, 1 Drawing Sheet

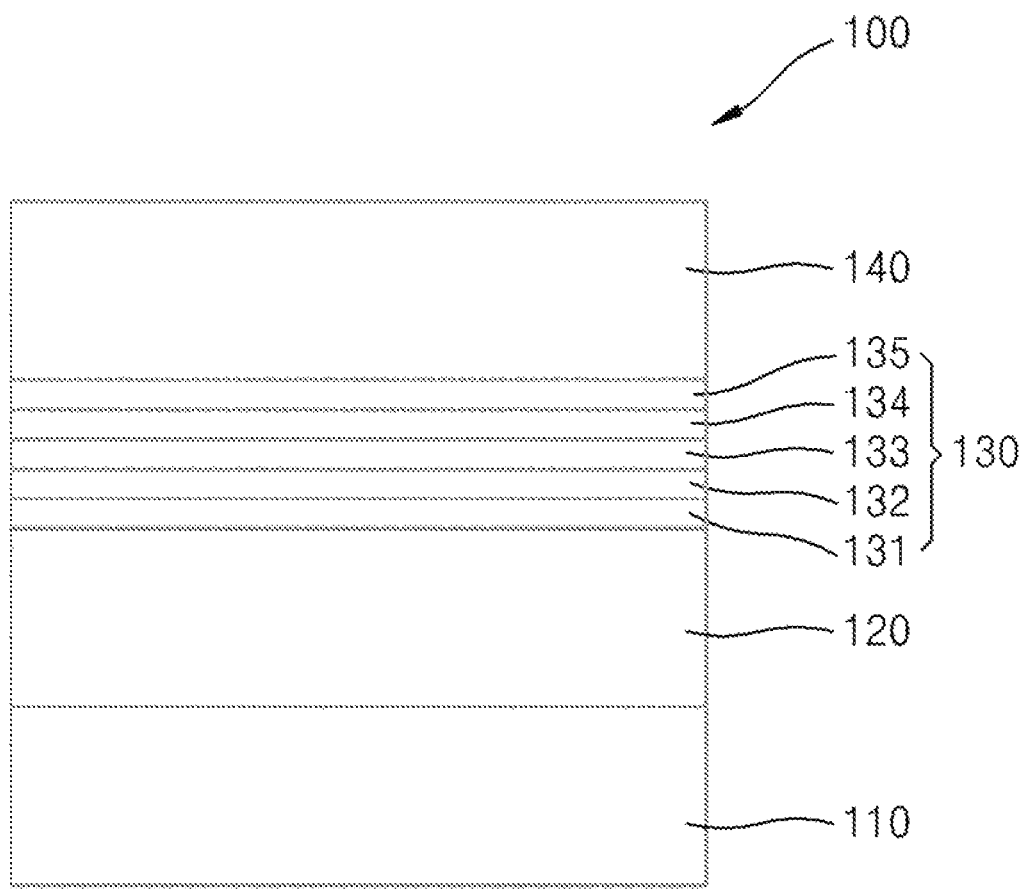

ANTHRACENE-BASED COMPOUND AND ORGANIC LIGHT-EMITTING DEVICE INCLUDING THE SAME

CROSS-REFERENCE TO RELATED APPLICATION

Korean Patent Application No. 10-2013-0096897, filed on Aug. 14, 2013, in the Korean Intellectual Property Office, and entitled: "Anthracene-Based Compounds and Organic Light-Emitting Device Comprising The Same," is incorporated by reference herein in its entirety.

BACKGROUND

1. Field

Embodiments relate to an anthracene-based compound and an organic light-emitting device including the same.

2. Description of the Related Art

Organic light-emitting devices (OLEDs) are self-emitting devices that have advantages such as wide viewing angles, excellent contrast, quick response time, and excellent brightness, driving voltage, and response speed characteristics, and can provide multicolored images.

SUMMARY

Embodiments are directed to an anthracene-based compound and an organic light-emitting device including the same.

According to one or more embodiments, provided is an anthracene-based compound represented by Formula 1 below:

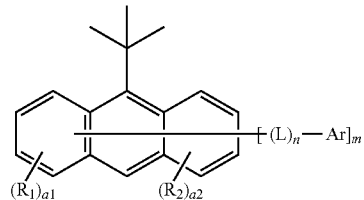

<Formula 1> in Formula 1 above,

L is selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterycloalkylene group, a substituted or unsubstituted $C_2$-$C_{10}$ hetercycloalkenylene group, and a substituted or unsubstituted $C_2$-$C_{60}$ heteroarylene group;

n is an integer of 0 to 3;

Ar is selected from a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_2$-$C_{10}$ hetercycloalkyl group, a substituted or unsubstituted $C_2$-$C_{10}$ hetercycloalkenyl group, and a substituted or unsubstituted $C_2$-$C_{60}$ heteroaryl group;

m is an integer of 1 to 3;

$R_1$ and $R_2$ are each independently selected from hydrogen, deuterium, halogen, a hydroxyl group, a cyano group, a nitro group, an amino group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{10}$ hetercycloalkyl group, a substituted or unsubstituted $C_2$-$C_{10}$ hetercycloalkenyl group and a substituted or unsubstituted $C_2$-$C_{30}$ heteroaryl group; and a1 and a2 are each independently an integer of 0 to 2.

According to one or more embodiments, provided is an organic light-emitting device including a first electrode; a second electrode disposed opposite to the first electrode; and an organic layer disposed between the first electrode and the second electrode and includes an emission layer, wherein the organic layer includes the anthracene-based compound.

BRIEF DESCRIPTION OF THE DRAWING

Features will be apparent to those of skill in the art by describing in detail exemplary embodiments with reference to the attached drawing in which:

The FIGURE illustrates a cross-sectional view of a structure of the organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

Expressions such as "at least one of," when preceding a list of elements, modify the entire list of elements and do not modify the individual elements of the list.

An anthracene-based compound may be represented by Formula 1, below.

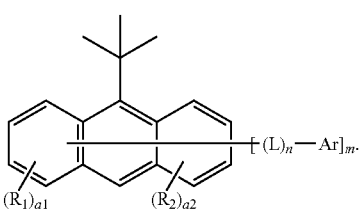

<Formula 1>

In Formula 1, above, L may be selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ hetercycloalkylene group, a substituted or unsubstituted $C_2$-$C_{10}$ hetercycloalkenylene group, and a substituted or unsubstituted $C_2$-$C_{60}$ heteroarylene group.

For example, in Formula 1 above, L may be selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, and a substituted or unsubstituted benzcarbazolylene group.

As another example, in Formula 1 above, L may be selected from i) a phenylene group, a pentalenylene group, an indenylene group, a naphthylene group, a azulenylene group, a heptalenylene group, an indacenylene group, acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, benzoimidazolylene group, a furanylene group, benzofuranylene group, thiophenylene group, benzothiophenylene group, a thiazolylene group, isothiazolylene group, benzothiazolylene group, an isoxazolylene group, an oxazolylene group, a triazolylene group, a tetrazolylene group, an oxadiazolylene group, a triazinylene group, a benzooxazolylene group, dibenzofuranylene group, dibenzothiophenylene group, and a benzcarbazolylene group; and ii) a phenylene group, a pentalenylene group, a indenylene group, a naphthylene group, a azulenylene group, a heptalenylene group, a indacenylene group, acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, benzoimidazolylene group, a furanylene group, benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzofuranylene group, a dibenzothiophenylene group, and a benzcarbazolylene group, each substituted with at least one of hydrogen, deuterium, halogen, a hydroxyl group, a cyano group, a nitro group, an amino group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{10}$ hetercycloalkyl group, a substituted or unsubstituted $C_2$-$C_{10}$ hetercycloalkenyl group and a substituted or unsubstituted $C_2$-$C_{30}$ heteroaryl group.

As another example, in Formula 1 above, L may be selected from i) a phenylene group, a naphthylene group, an anthracenylene group, a pyrenylene group, and a fluorenylene group; and ii) a phenylene group, a naphthylene group, an anthracenylene group, a pyrenylene group and a fluorenylene group, each substituted with at least one of hydrogen, deuterium, halogen, a hydroxyl group, a cyano group, a nitro group, an amino group, a carboxylic acid group, a substituted or unsubstituted $C_1$-$C_{30}$ alkyl group, a substituted or unsubstituted $C_2$-$C_{30}$ alkenyl group, a substituted or unsubstituted $C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{10}$ hetercycloalkyl group, a substituted or unsubstituted $C_2$-$C_{10}$ hetercycloalkenyl group, and a substituted or unsubstituted $C_2$-$C_{30}$ heteroaryl group.

As another example, in Formula 1 above, L may be selected from i) a phenylene group, a naphthylene group, an anthracenylene group, a pyrenylene group, and a fluorenylene group; and ii) a phenylene group, a naphthylene group, an anthracenylene group, a pyrenylene group, and a fluorenylene group, each substituted with at least one of deuterium, —F, a cyano group, a nitro group, a methyl group, an ethyl group, an n-propyl group, an iso-propyl group, an n-butyl group, a sec-butyl group, an iso-butyl group, and a tert-butyl group.

In Formula 1 above, n is the number of Ls, and n may be an integer of 0 to 3. When n is an integer of 2 or greater, the n number of Ls may be the same or different. In an implementation, when n is 0, Ar may be bound directly to anthracene core.

For example, in Formula 1 above, n may be from 0 to 2.

According to an embodiment, in Formula 1 above, a moiety represented by $(L)_n$, may be selected from Formulae 2-1 to 2-9. For example, when n is 1 or greater, the moiety represented by $(L)_n$ may be selected from Formulae 2-1 to 2-9.

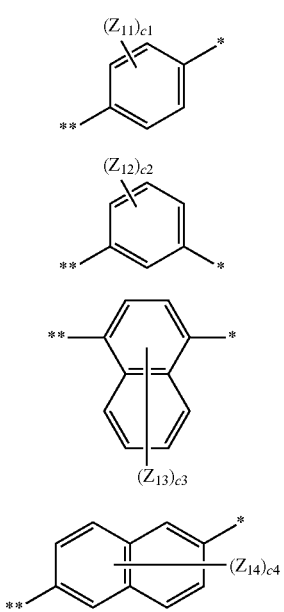

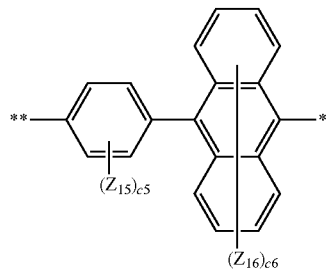

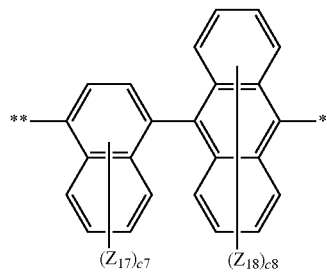

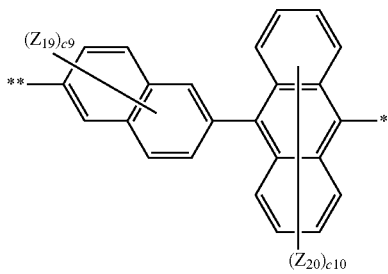

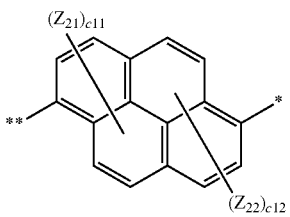

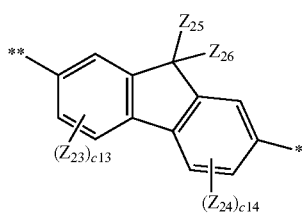

In Formulae 2-1 to 2-9 above, $Z_{11}$ to $Z_{26}$ may be each independently selected from deuterium, —F, a cyano group, a nitro group, a methyl group, an ethyl group, an n-propyl group, an iso-propyl group, an n-butyl group, a sec-butyl group, an iso-butyl group, and a tert-butyl group; c1 to c14 may be each independently an integer of 0 to 3; ** is a binding site to an anthracene core and * is a binding site to Ar.

According to another embodiment, in Formula 1 above, a moiety represented by $(L)_n$ may be selected from Formulae 3-1 to 3-9 below. For example, when n is 1 or greater, the moiety represented by $(L)_n$ may be selected from Formulae 3-1 to 3-9 below.

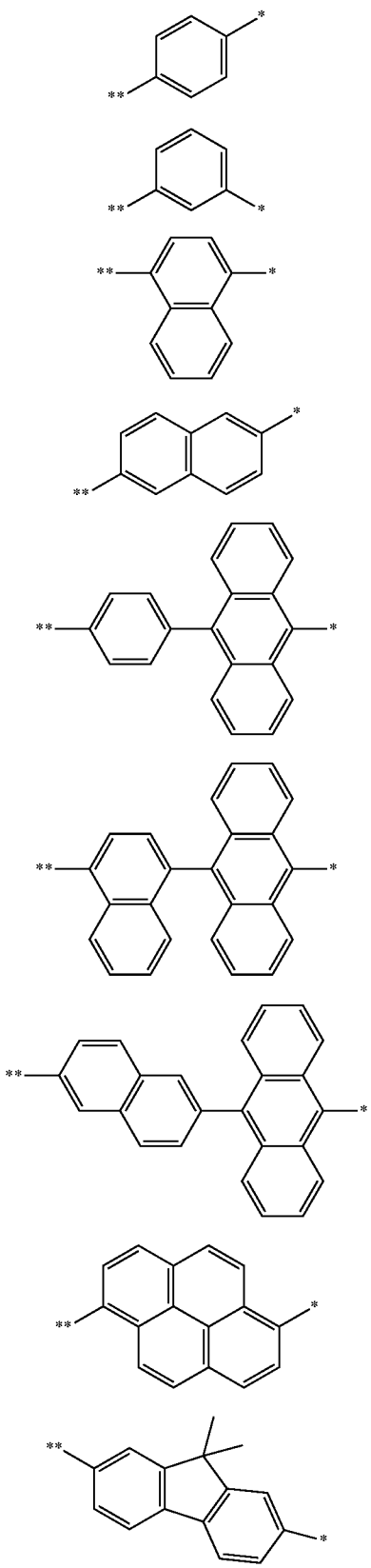

In Formulae 3-1 to 3-9 above, ** is a binding site to an anthracene core, and * is a binding site to Ar.

In Formula 1 above, Ar may be selected from a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_2$-$C_{10}$ hetercycloalkyl group, a substituted or unsubstituted $C_2$-$C_{10}$ hetercycloalkenyl group and a substituted or unsubstituted $C_2$-$C_{60}$ heteroaryl group.

For example in Formula 1 above, Ar may be selected from a substituted or unsubstituted phenyl group, a substituted or unsubstituted pentalenyl group, a substituted or unsubstituted naphthyl group, a substituted or unsubstituted azulenyl group, a substituted or unsubstituted heptalenyl group, a substituted or unsubstituted indacenyl group, a substituted or unsubstituted cenaphthyl group, a substituted or unsubstituted fluorenyl group, a substituted or unsubstituted spirofluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group. a substituted or unsubstituted picenyl group, a substituted or unsubstituted perylenyl group, a substituted or unsubstituted pentaphenyl group, a substituted or unsubstituted hexacenyl group, a substituted or unsubstituted benzofluorenyl group, a substituted or unsubstituted cyclopentaphenanthrenyl group, a substituted or unsubstituted indenofluorenyl group, a substituted or unsubstituted indenopyrenyl group, a substituted or unsubstituted indenophenanthrenyl group, a substituted or unsubstituted indenoanthracenyl group, a substituted or unsubstituted indenochrysenyl group, a substituted or unsubstituted benzodihydroanthracenyl group, a substituted or unsubstituted fluoranthenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isooxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, and a substituted or unsubstituted dibenzothiophenyl group.

As another example, in Formula 1 above, Ar may be selected from i) a phenyl group, a naphthyl group, an anthracenyl group, an indenoanthracenyl group, a phenanthrenyl group, an indenophenanthrenyl group, a pyrenyl group, an indenopyrenyl group, a fluorenyl group, a spiro-fluorenyl group, a benzofluorenyl group, an indenofluorenyl group, a cyclopentaphenanthrenyl group, a perylenyl group, a chrysenyl group, a triphenyl group, an indenochrysenyl group, a benzodihydroanthracenyl group, and a fluoranthenyl group;

ii) a phenyl group, a naphthyl group, an anthracenyl group, an indenoanthracenyl group, a phenanthrenyl group, an indenophenanthrenyl group, a pyrenyl group, an indenopyrenyl group, a fluorenyl group, a spiro-fluorenyl group, a benzofluorenyl group, an indenofluorenyl group, a cyclopentaphenanthrenyl group, a perylenyl group, a chrysenyl group, a triphenyl group, an indenochrysenyl group, a benzodihydroanthracenyl group, and a fluoranthenyl group, each substituted with at least one of deuterium, a halogen atom, a cyano group, a nitro group, a $C_1$-$C_{10}$ alkyl group, and —Si($Q_1$)($Q_2$)($Q_3$), in which $Q_1$ to $Q_3$ are each independently a $C_1$-$C_{10}$ alkyl group or a $C_6$-$C_{30}$ aryl group;

iii) a phenyl group, a naphthyl group, an anthracenyl group, an indenoanthracenyl group, a phenanthrenyl group, an indenophenanthrenyl group, a pyrenyl group, an indenopyrenyl group, a fluorenyl group, a spiro-fluorenyl group, a benzofluorenyl group, an indenofluorenyl group, a cyclopentaphenanthrenyl group, a perylenyl group, a chrysenyl group, a triphenyl group, an indenochrysenyl group, a benzodihydroanthracenyl group, and a fluoranthenyl group, each substituted with at least one of a $C_6$-$C_{30}$ aryl group and a $C_2$-$C_{30}$ heteroaryl group; and iv) a phenyl group, a naphthyl group, an anthracenyl group, an indenoanthracenyl group, a phenanthrenyl group, an indenophenanthrenyl group, a pyrenyl group, an indenopyrenyl group, a fluorenyl group, a spiro-fluorenyl group, a benzofluorenyl group, an indenofluorenyl group, a cyclopentaphenanthrenyl group, a perylenyl group, a chrysenyl group, a triphenyl group, an indenochrysenyl group, a benzodihydroanthracenyl group, and a fluoranthenyl group, each substituted with at least one of a $C_6$-$C_{30}$ aryl group and a $C_2$-$C_{30}$ heteroaryl group, which are each substituted with at least one of deuterium, a halogen atom, a cyano group, a nitro group, a methyl group, an ethyl group, an n-propyl group, and a tert-butyl group.

As another example, in Formula 1, Ar may be selected from i) a phenyl group, a naphthyl group, an indenoanthracenyl group, a phenanthrenyl group, an indenophenanthrenyl group, a pyrenyl group, an indenopyrenyl group, a fluorenyl group, a spiro-fluorenyl group, a benzofluorenyl group, an indenofluorenyl group, a cyclopentaphenanthrenyl group, a perylenyl group, a chrysenyl group, a triphenyl group, an indenochrysenyl group, a benzodihydroanthracenyl group, and a fluoranthenyl group;

ii) a phenyl group, a naphthyl group, an indenoanthracenyl group, a phenanthrenyl group, an indenophenanthrenyl group, a pyrenyl group, an indenopyrenyl group, a fluorenyl group, a spiro-fluorenyl group, a benzofluorenyl group, an indenofluorenyl group, a cyclopentaphenanthrenyl group, a perylenyl group, a chrysenyl group, a triphenyl group, an indenochrysenyl group, a benzodihydroanthracenyl group, and a fluoranthenyl group, each substituted with at least one of deuterium, a halogen atom, a cyano group, a nitro group, a methyl group, an ethyl group, a tert-butyl group, and —Si($Q_1$)($Q_2$)($Q_3$), in which $Q_1$ to $Q_3$ are each independently a methyl group or a phenyl group;

iii) a phenyl group, a naphthyl group, an indenoanthracenyl group, a phenanthrenyl group, an indenophenanthrenyl group, a pyrenyl group, an indenopyrenyl group, a fluorenyl group, a spiro-fluorenyl group, a benzofluorenyl group, an indenofluorenyl group, a cyclopentaphenanthrenyl group, a perylenyl group, a chrysenyl group, a triphenyl group, an indenochrysenyl group, a benzodihydroanthracenyl group, and a fluoranthenyl group, each substituted with at least one of a phenyl group, a naphthyl group, a fluorenyl group, a benzofluorenyl group, and a cyclopentaphenanthrenyl group; and iv) a phenyl group, a naphthyl group, an indenoanthracenyl group, a phenanthrenyl group, an indenophenanthrenyl group, a pyrenyl group, an indenopyrenyl group, a fluorenyl group, a spiro-fluorenyl group, a benzofluorenyl group, an indenofluorenyl group, a cyclopentaphenanthrenyl group, a perylenyl group, a chrysenyl group, a triphenyl group, an indenochrysenyl group, a benzodihydroanthracenyl group, and a fluoranthenyl group, each substituted with at least one of a phenyl group, a naphthyl group, a fluorenyl group, a benzofluorenyl group and a cyclopentaphenanthrenyl group, which are each substituted with at least one of deuterium, a halogen atom, a cyano group, a nitro group and a methyl group.

As another example, in Formula 1 above, Ar may be selected from Formulae 4-1 to 4-27 below.

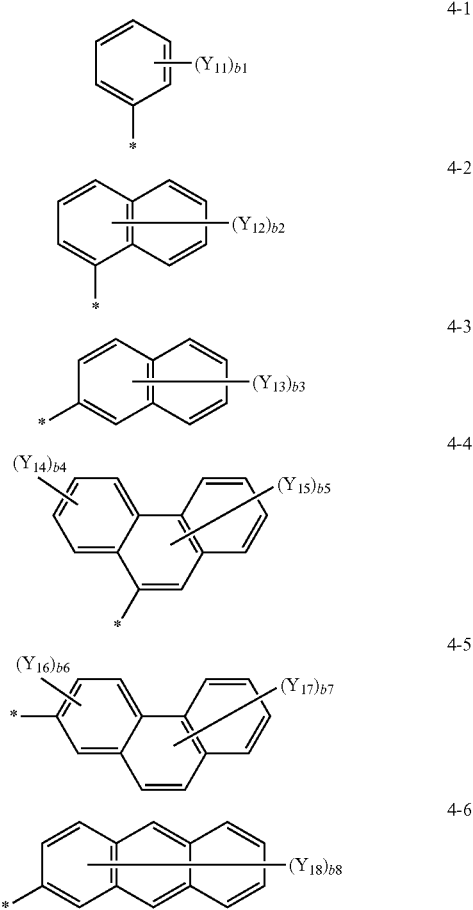

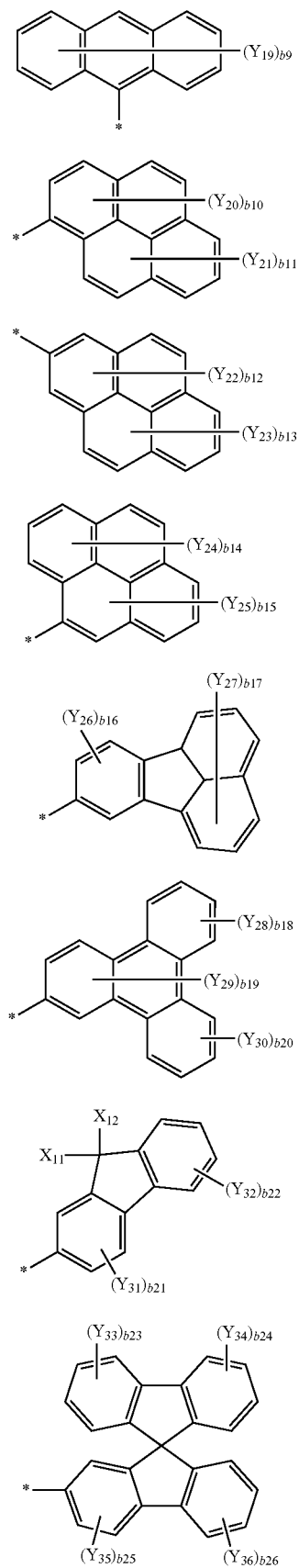
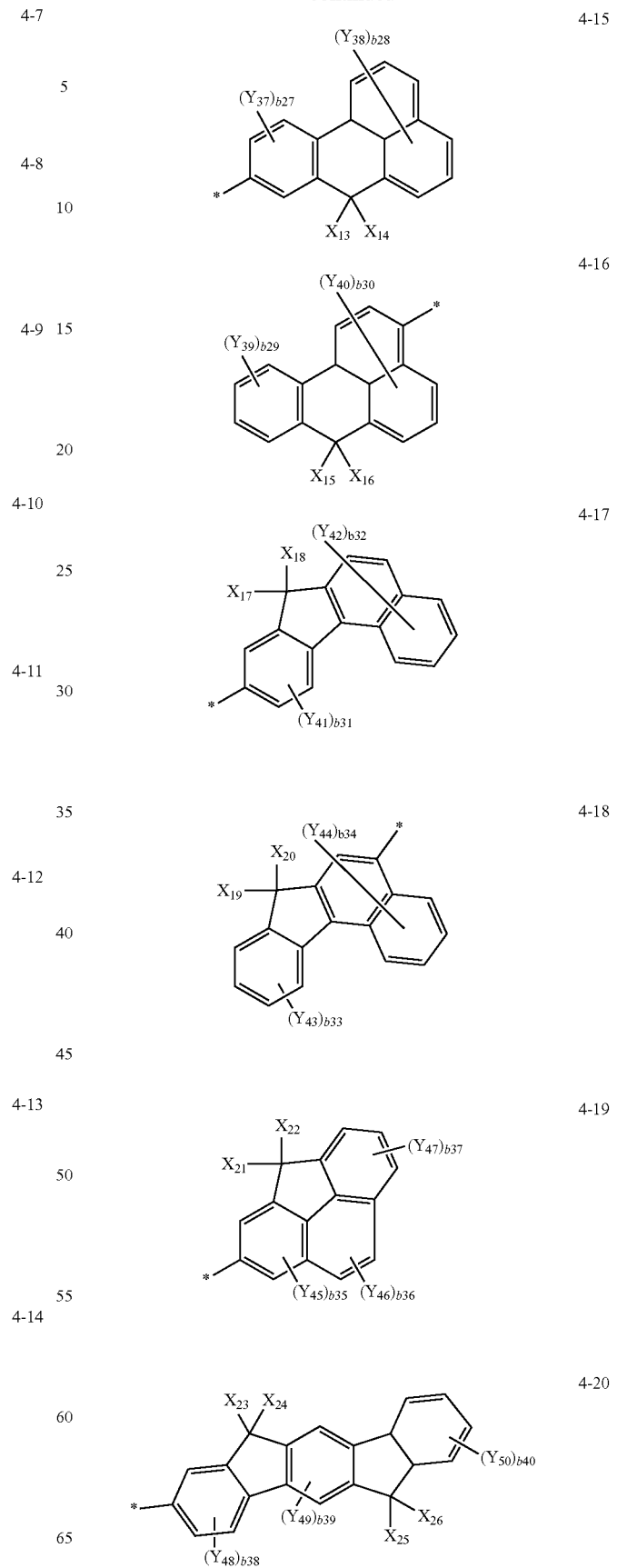

-continued 4-21

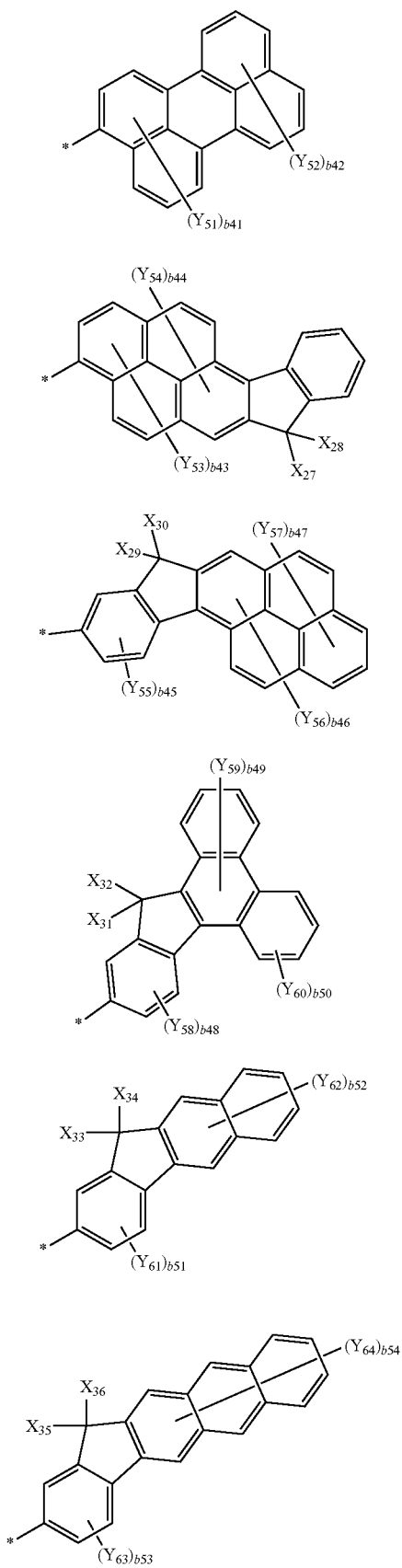

4-22

4-23

4-24

4-25

4-26

-continued 4-27

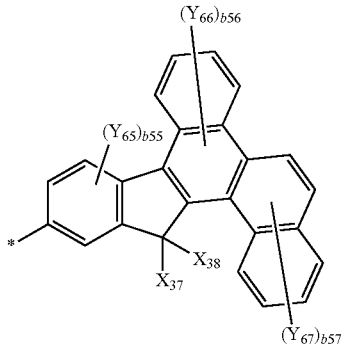

in Formulae 4-1 to 4-27, $Y_{11}$ to $Y_{67}$ may be each independently selected from i) deuterium, a halogen atom, a cyano group, a nitro group, a methyl group, an ethyl group, a tert-butyl group, and —Si$(Q_1)(Q_2)(Q_3)$, in which $Q_1$ to $Q_3$ are each independently a methyl group or a phenyl group; and ii) a phenyl group, a naphthyl group, a fluorenyl group, a benzofluorenyl group, and a cyclopentaphenanthrenyl group, each substituted with a methyl group;

b1 to b57 may be each independently an integer of 0 to 2;

$X_{11}$ to $X_{38}$ may be each independently, a methyl group and a phenyl group;

\* is a binding site to an anthracene core or to L.

In Formula 1 above, m represents the number of moieties represented by —[(L)$_n$-Ar], and m is an integer of 1 to 3. When m is an integer of 2 or greater, the m number of moieties represented by —[(L)$_n$-Ar] may be the same or different.

In Formula 1 above, $R_1$ and $R_2$ may be each independently selected from hydrogen, deuterium, halogen, a hydroxyl group, a cyano group, a nitro group, an amino group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{10}$ hetercycloalkyl group, a substituted or unsubstituted $C_2$-$C_{10}$ hetercycloalkenyl group, and a substituted or unsubstituted $C_2$-$C_{30}$ heteroaryl group.

For example, in Formula 1 above, $R_1$ and $R_2$ may be each independently selected from i) hydrogen, deuterium, halogen, a hydroxyl group, a cyano group, a nitro group, an amino group, a carboxylic acid group and $C_1$-$C_{30}$ alkyl group; and ii) a $C_6$-$C_{30}$ aryl group and a $C_2$-$C_{30}$ heteroaryl group, each substituted with at least one of hydrogen, deuterium, halogen, a hydroxyl group, a cyano group, a nitro group, an amino group, a carboxylic acid group and $C_1$-$C_{30}$ alkyl group.

In Formula 1 above, a1 represents the number of $R_1$s, and a1 may be an integer of 0 to 2. When a1 is an integer of 2, the 2 of $R_1$s may be the same or different. a2 represents the number of $R_2$s, and a2 may be an integer of 0 to 2. When a2 is an integer of 2, the 2 $R_2$s may be the same or different.

For example, in Formula 1 above, a1 and a2 may simultaneously be an integer of 0, but they are not limited thereto.

According to an embodiment, the anthracene-based compound represented by Formula 1 may be represented by Formula 1a below:

<Formula 1a>

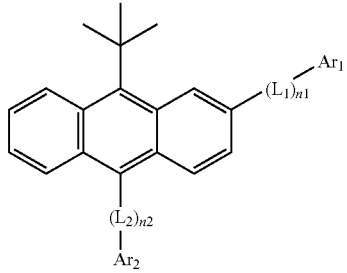

In Formula 1a, above, $L_1$ and $L_2$ may be each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ hetercycloalkylene group, a substituted or unsubstituted $C_2$-$C_{10}$ hetercycloalkenylene group, and a substituted or unsubstituted $C_2$-$C_{60}$ heteroarylene group;

n1 and n2 may be each independently an integer of 0 to 2; and $Ar_1$ and $Ar_2$ may be each independently selected from a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_2$-$C_{10}$ hetercycloalkyl group, a substituted or unsubstituted $C_2$-$C_{10}$ hetercycloalkenyl group, and a substituted or unsubstituted $C_2$-$C_{60}$ heteroaryl group.

In Formula 1a above, $L_1$ and $L_2$ may be each independently selected from i) a phenylene group, a naphthylene group, an anthracenylene group, a pyrenylene group and a fluorenylene group; and ii) a phenylene group, a naphthylene group, an anthracenylene group, a pyrenylene group, and a fluorenylene group, each substituted with at least one of deuterium, —F, a cyano group, a nitro group, a methyl group, an ethyl group, an n-propyl group, an iso-propyl group, an n-butyl group, a sec-butyl group, an iso-butyl group, and a tert-butyl group.

In Formula 1a above, moieties represented by $(L_1)_{n1}$ and $(L_2)_{n2}$ may be each independently selected from Formulae 3-1 to 3-9 below. For example, when n1 or n2 are 1 or greater, the moieties represented by $(L_1)_{n1}$ and $(L_2)_{n2}$ may be each independently selected from Formulae 3-1 to 3-9 below.

3-1

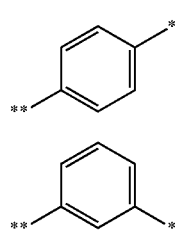

3-2

3-3

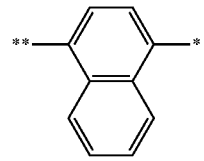

3-4

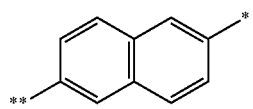

3-5

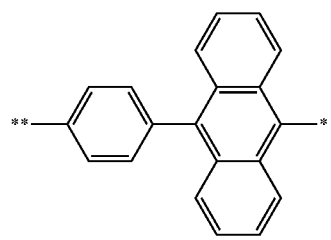

3-6

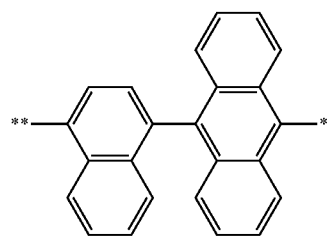

3-7

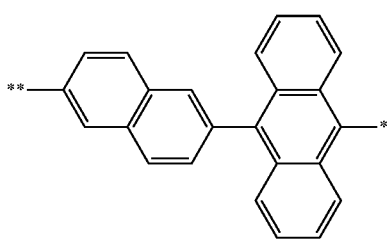

3-8

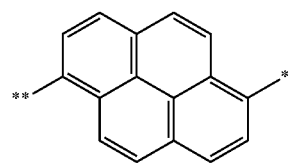

3-9

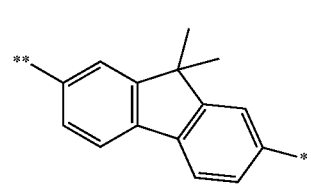

In Formulae 3-1 to 3-9 above, ** is a binding site to an anthracene core, * is a binding site to $Ar_1$ or $Ar_2$.

In Formula 1a above, $Ar_1$ and $Ar_2$ may be each independently selected from Formulae 4-1 to 4-27 below.

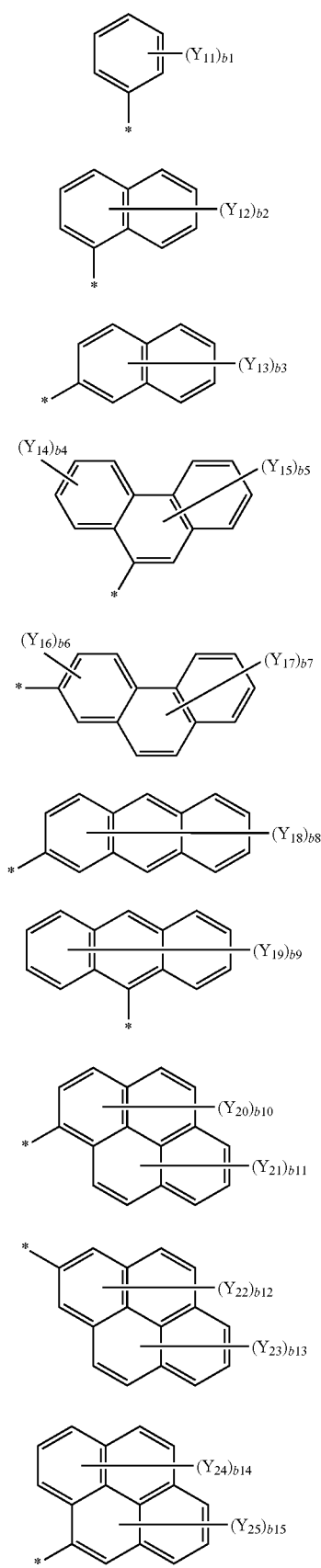
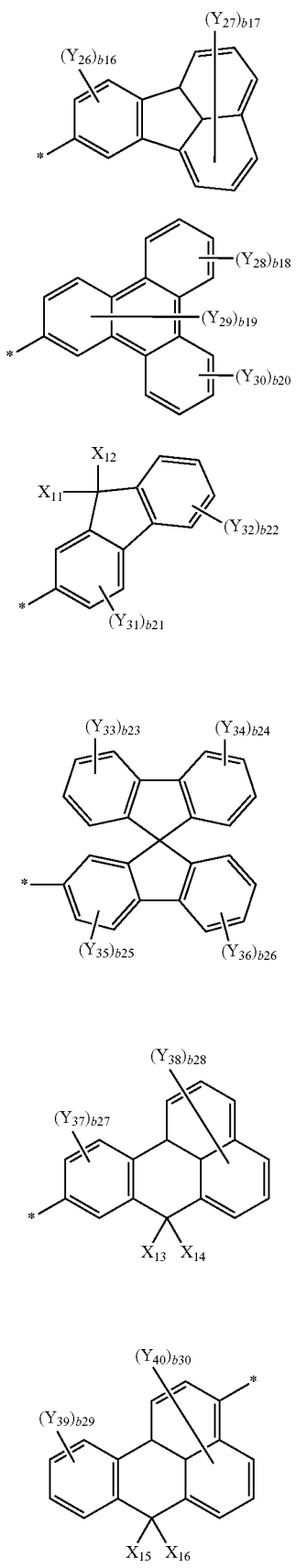

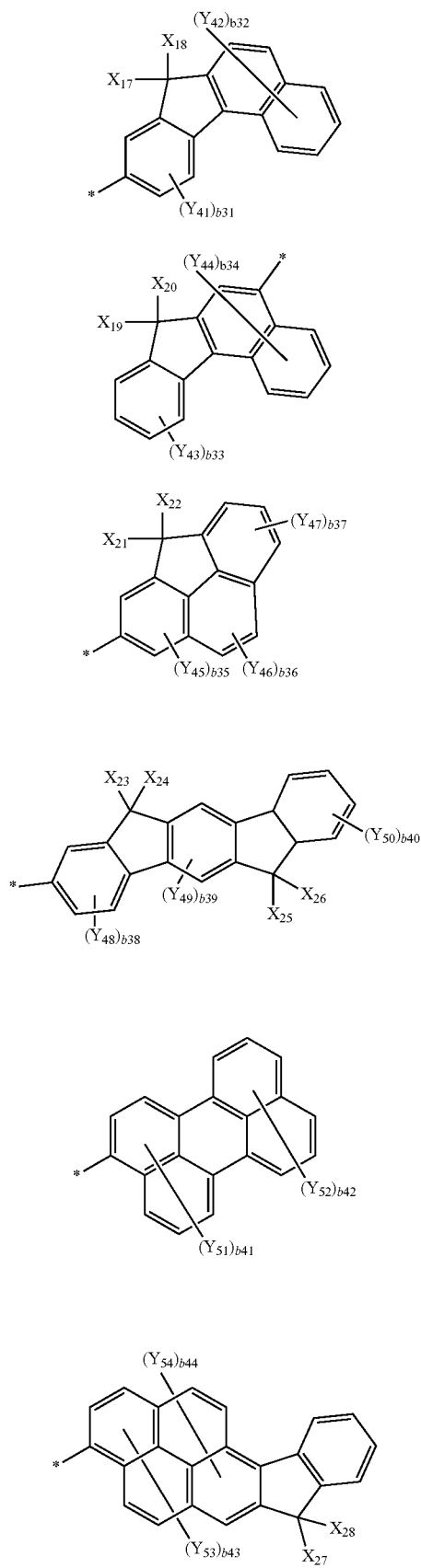
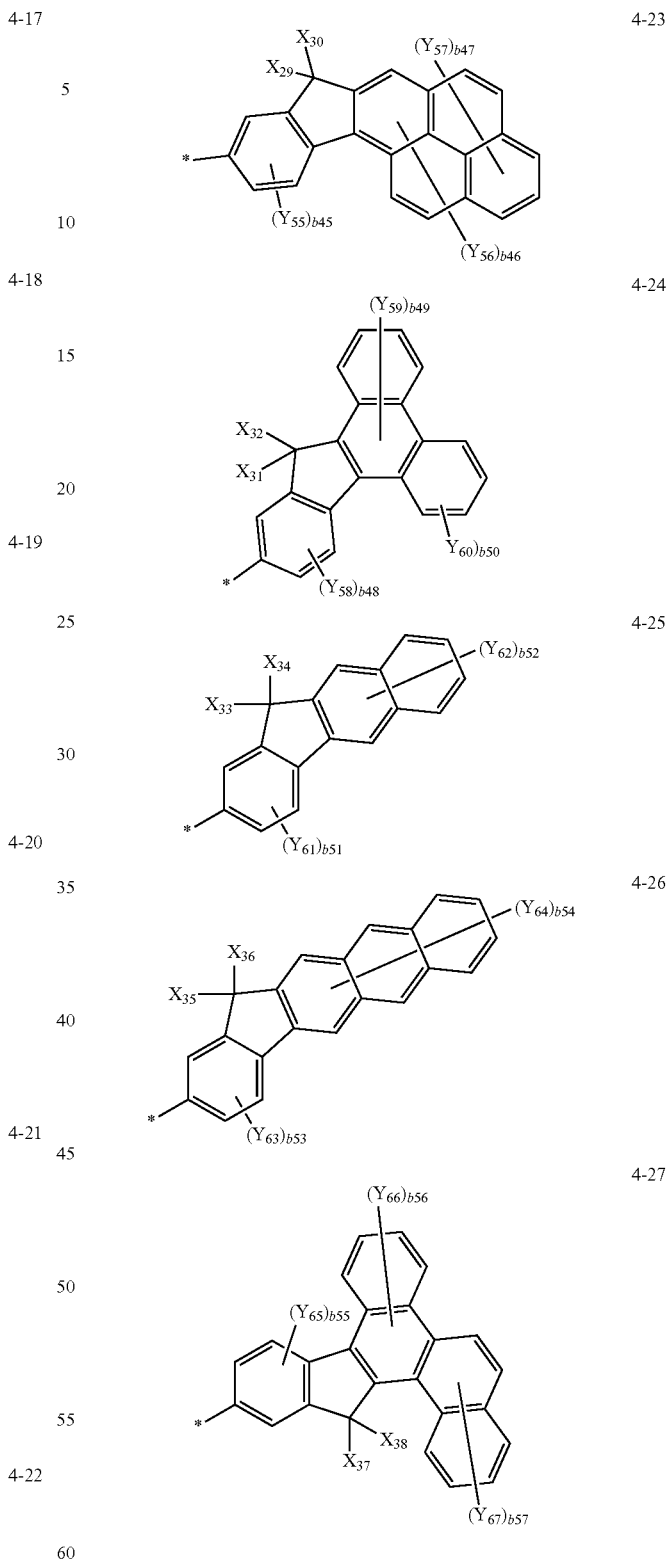
In Formulae 4-1 to 4-27,
$Y_{11}$ to $Y_{67}$ may be each independently selected from i) deuterium, a halogen atom, a cyano group, a nitro group, a methyl group, an ethyl group, a tert-butyl group, and —Si$(Q_1)(Q_2)(Q_3)$, $Q_1$ to $Q_3$ are each independently a methyl group or a phenyl group; and ii) a phenyl group, a naphthyl group, a fluorenyl group, a benzofluorenyl group, and a cyclopentaphenanthrenyl group, each substituted with a methyl group;

b1 to b57 may be each independently an integer of 0 to 2;

$X_{11}$ to $X_{38}$ may be each independently a methyl group and a phenyl group; and

* is a binding site to the anthracene core or to $L_1$ or $L_2$.

According to another embodiment, the anthracene-based compound may be represented by any one selected from Formulae 1b to 1d below.

<Formula 1b>

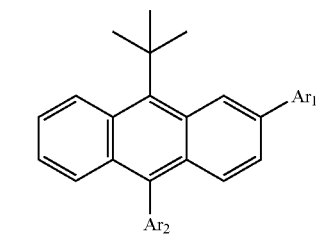

<Formula 1c>

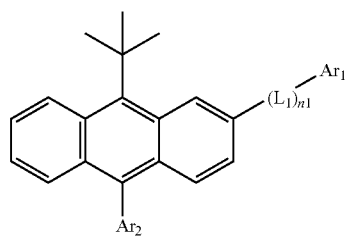

<Formula 1d>

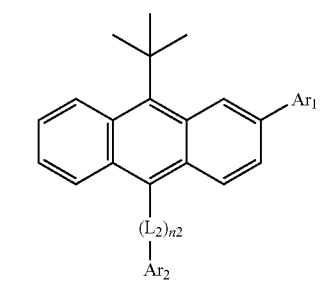

In Formulae 1b to 1d, $L_1$ and $L_2$ may be each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ hetercycloalkylene group, a substituted or unsubstituted $C_2$-$C_{10}$ hetercycloalkenylene group, and a substituted or unsubstituted $C_2$-$C_{60}$ heteroarylene group;

n1 and n2 may be each independently an integer of 1 or 2; and $Ar_1$ and $Ar_2$ may be each independently selected from a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_2$-$C_{10}$ hetercycloalkyl group, a substituted or unsubstituted $C_2$-$C_{10}$ hetercycloalkenyl group, and a substituted or unsubstituted $C_2$-$C_{60}$ heteroaryl group.

In Formulae 1b to 1d, moieties represented by $(L_1)_{n1}$ and $(L_2)_{n2}$ may be each independently selected from Formulae 3-1 to 3-9, below.

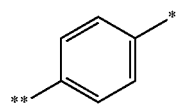
3-1

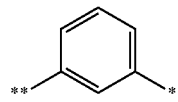
3-2

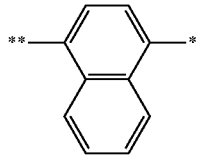
3-3

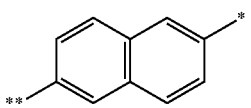
3-4

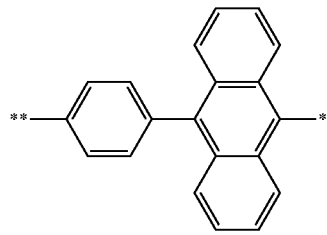
3-5

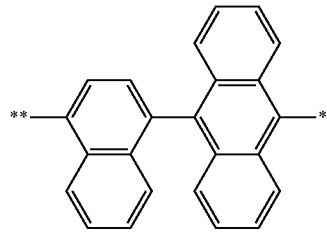
3-6

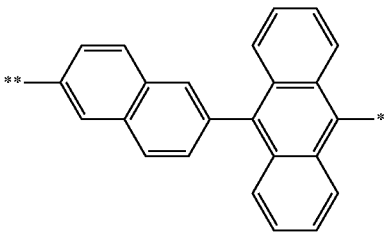
3-7

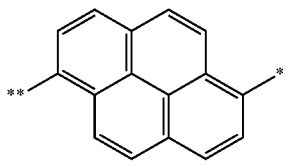
3-8

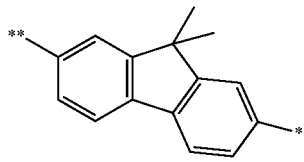
3-9

In Formulae 3-1 to 3-9, ** is a binding site to an anthracene core, * is a binding site to $Ar_1$ or $Ar_2$.

$Ar_1$ and $Ar_2$ may be each independently selected from Formulae 4-1 to 4-27.
According to another embodiment, the anthracene-based compound may be any one selected from Compounds 1 to 134, below.
1
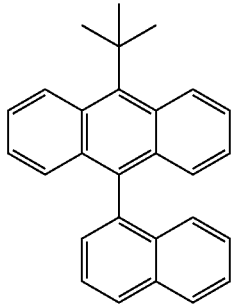
2
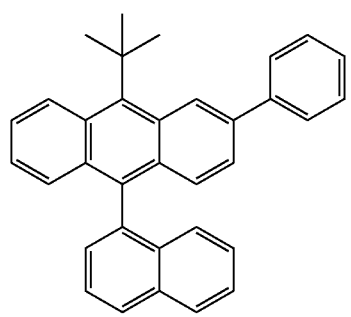
3
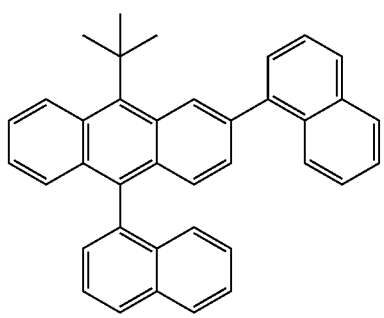
4
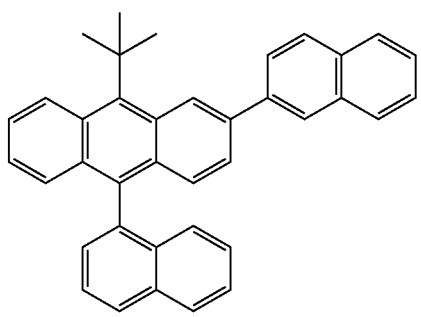
5
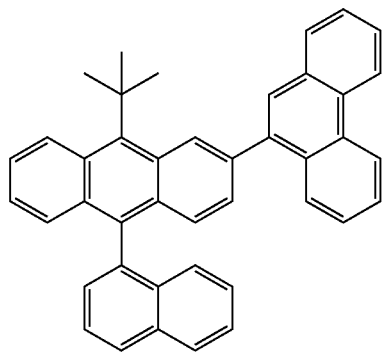
6
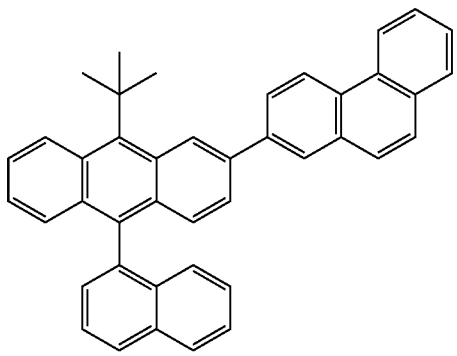
7
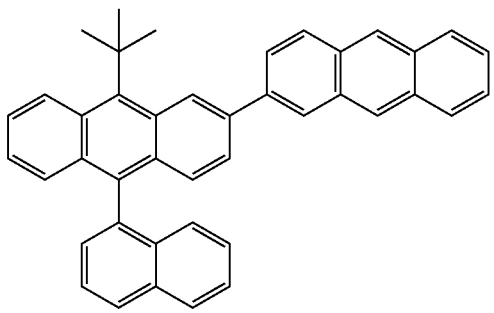
8
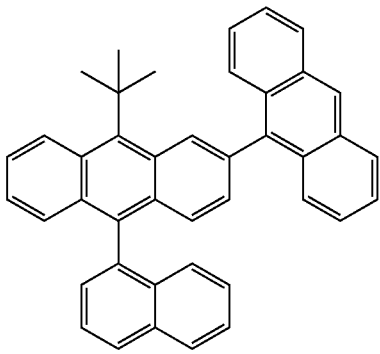

9
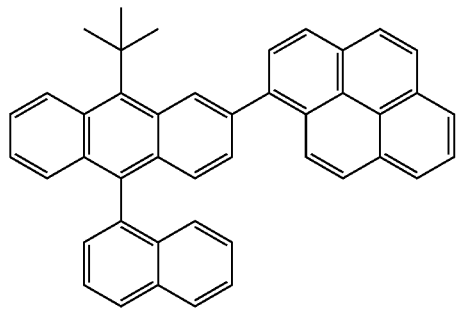
10
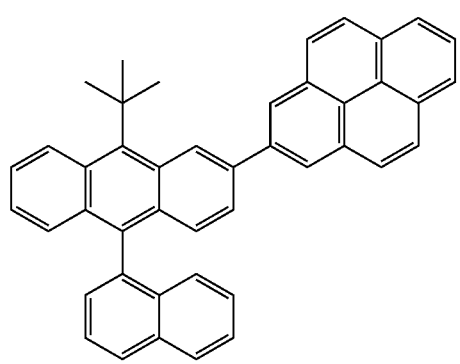
11
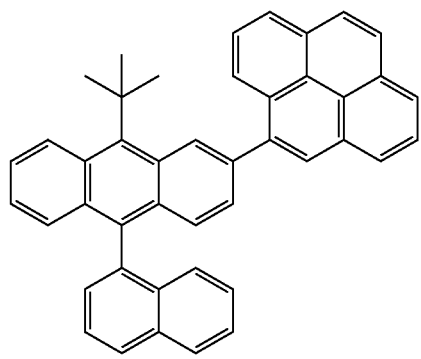
12
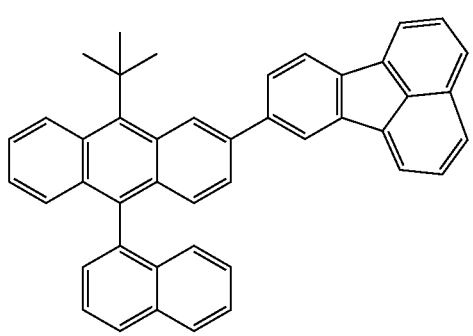
13
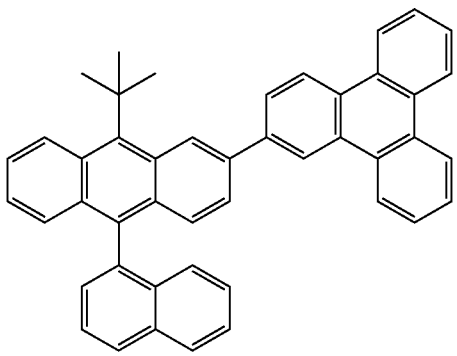
14
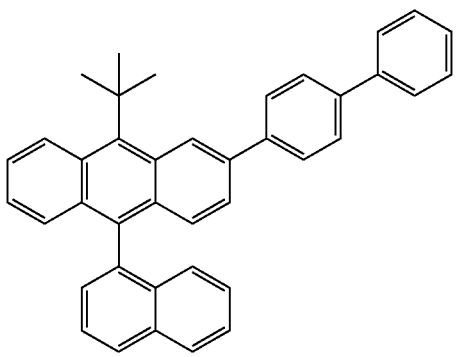
15
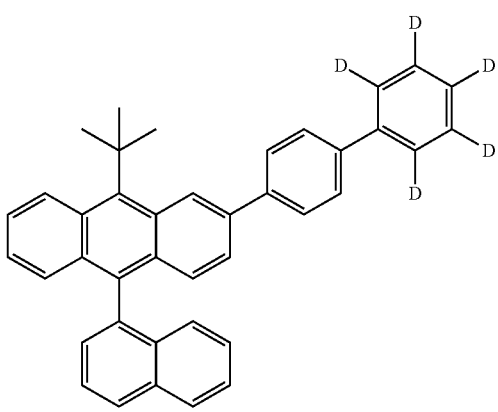
16
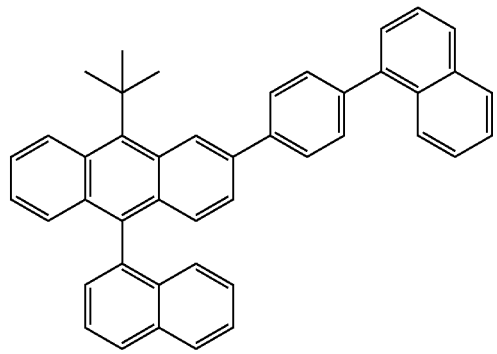

-continued
17
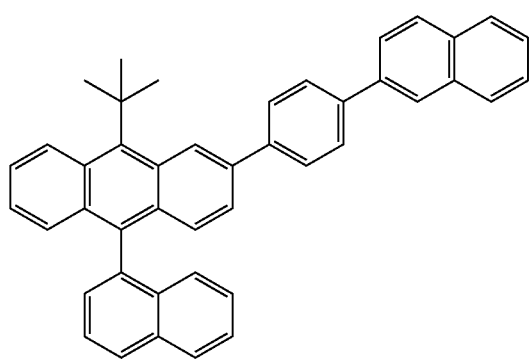
18
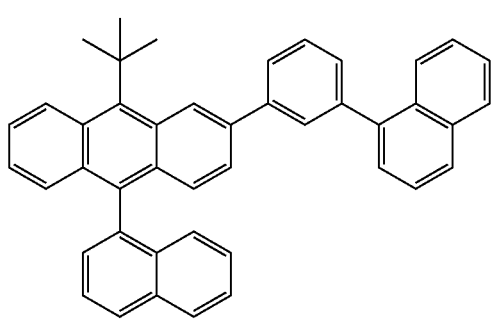
19
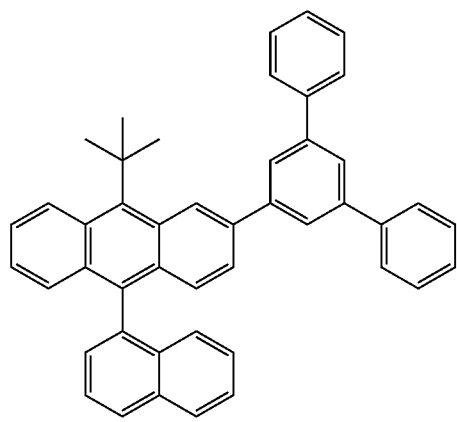
20
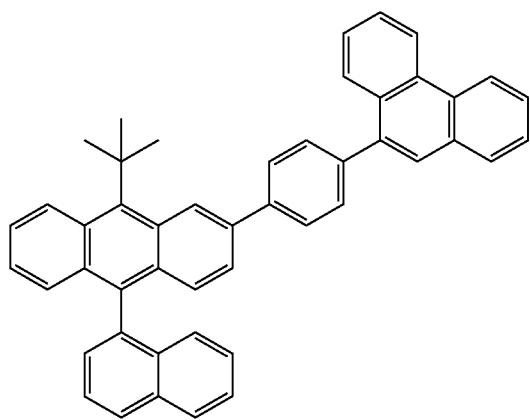
-continued
21
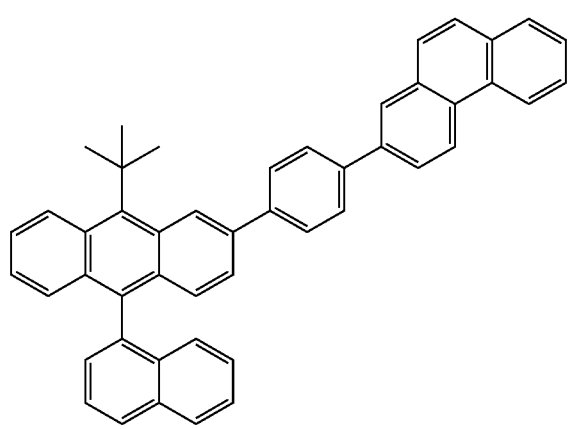
22
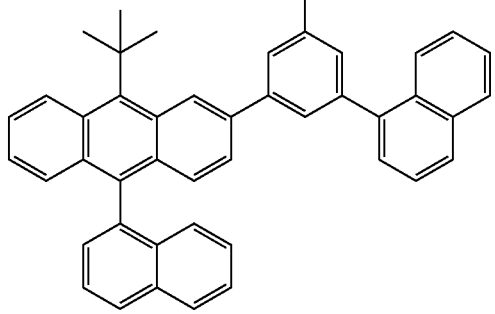
23
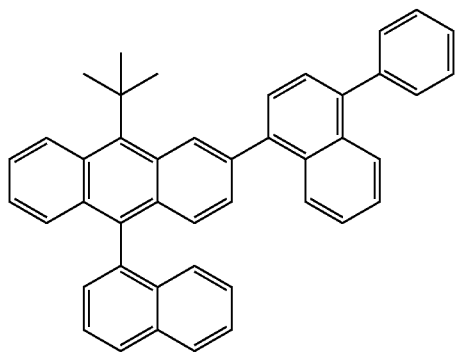
24
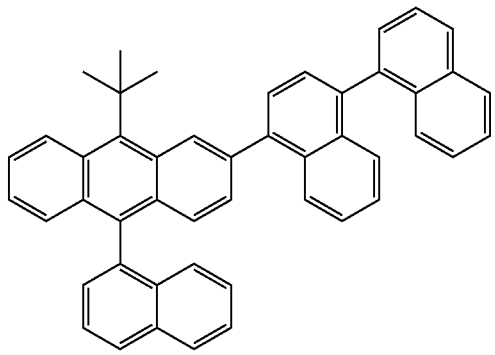

25
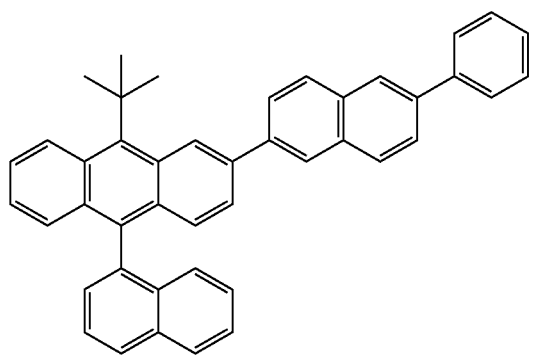
26
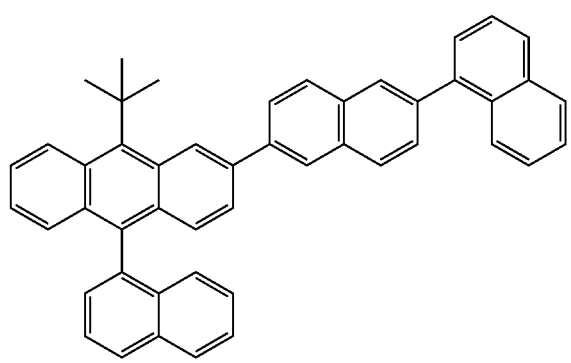
27
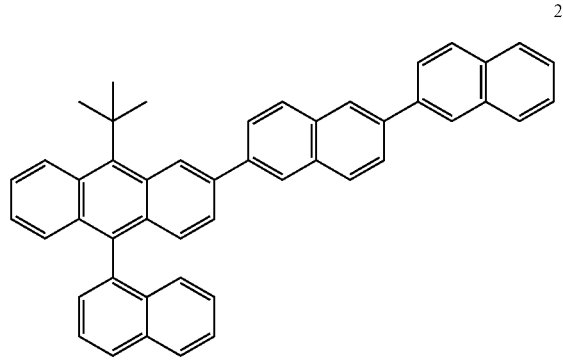
28
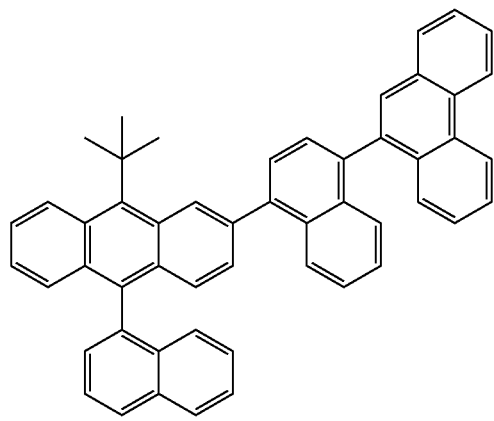
29
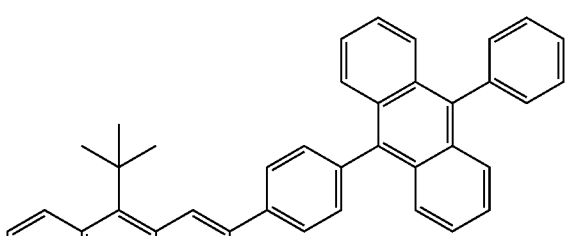
30
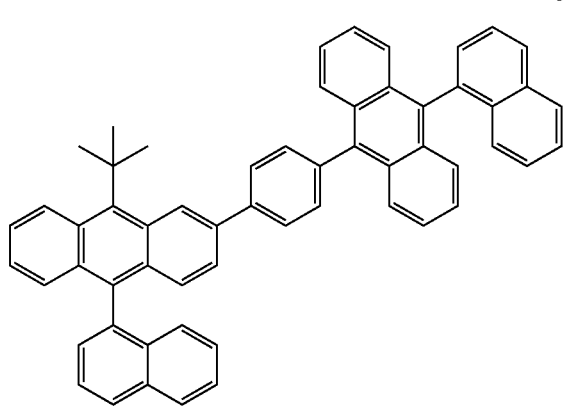
31
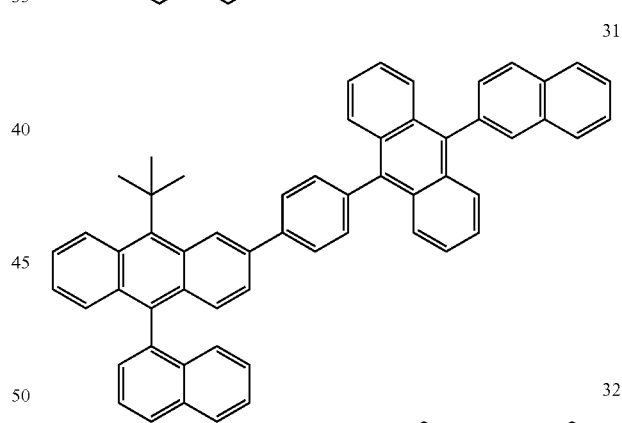
32
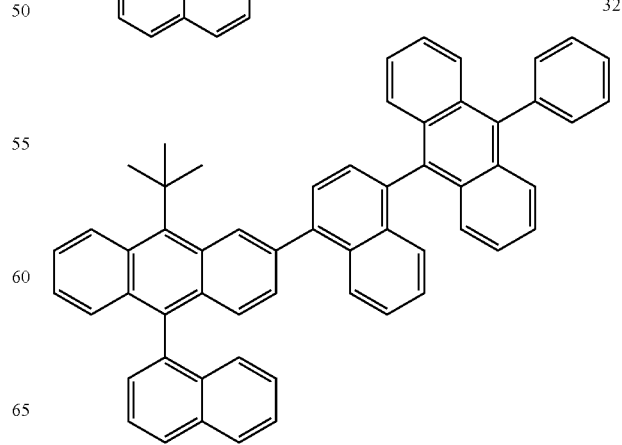

33
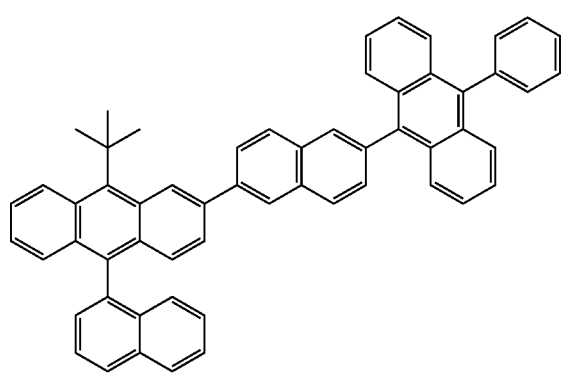
34
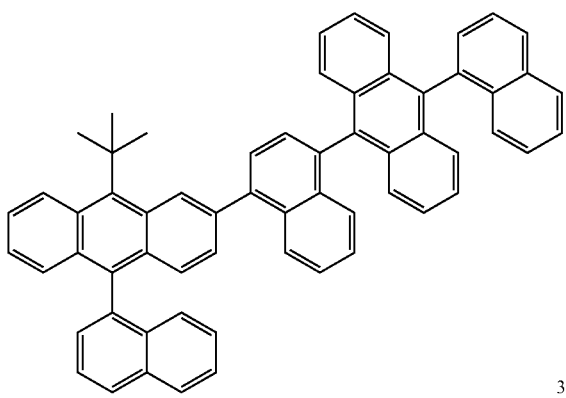
35
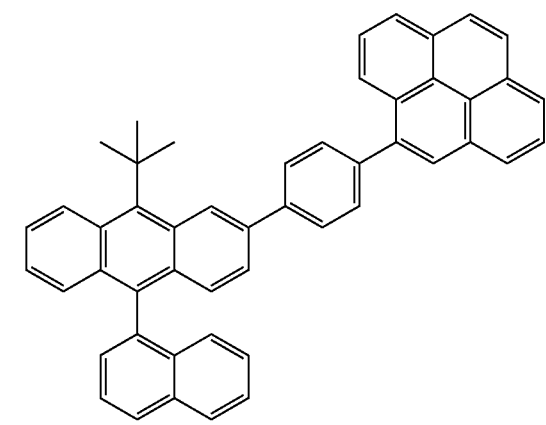
36
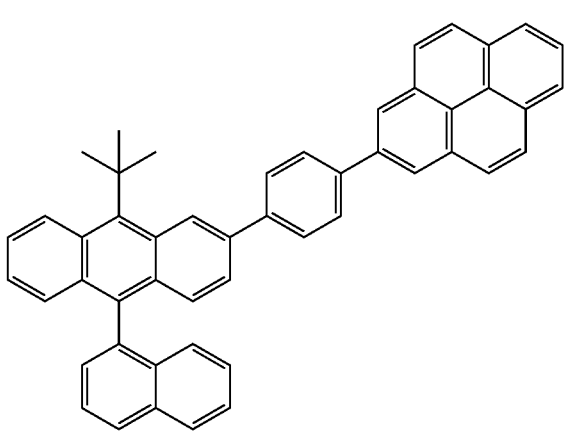
37
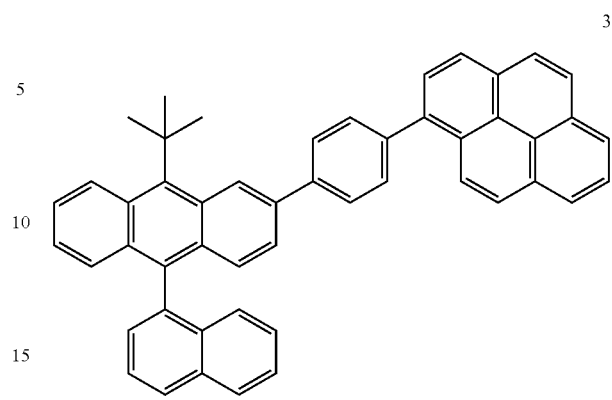
38
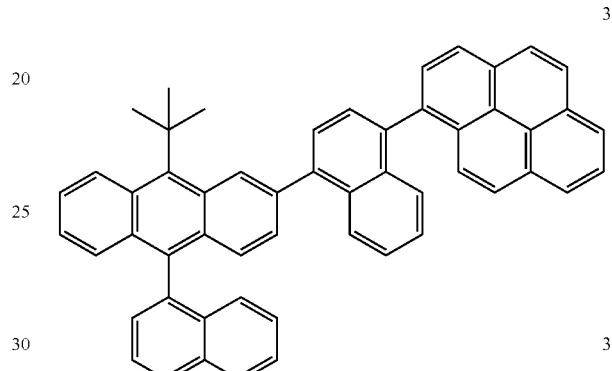
39
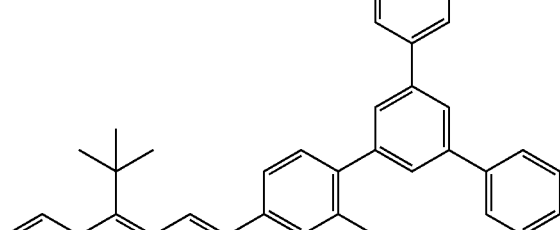
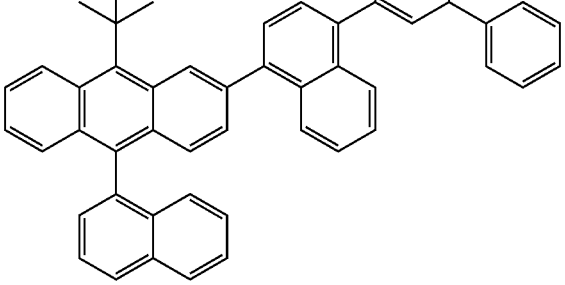
40
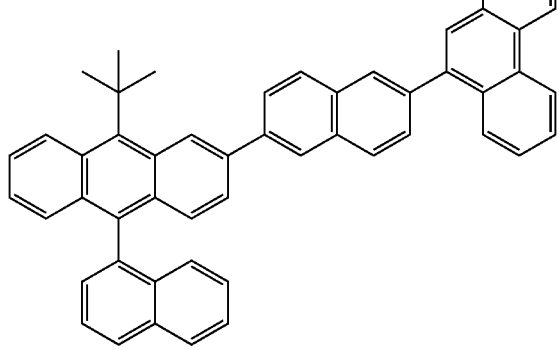

41
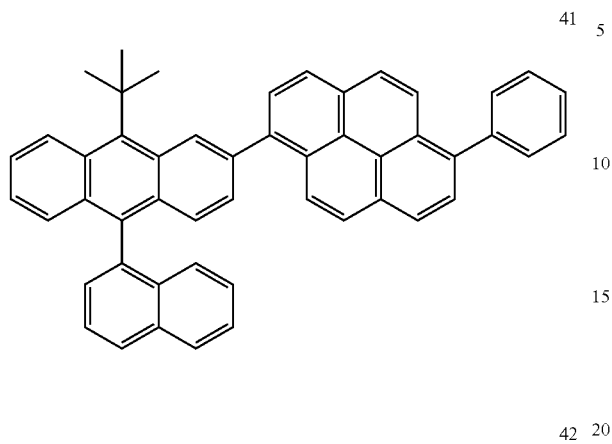
42
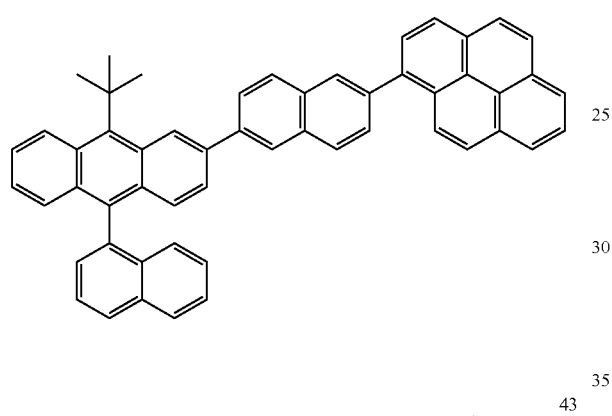
43
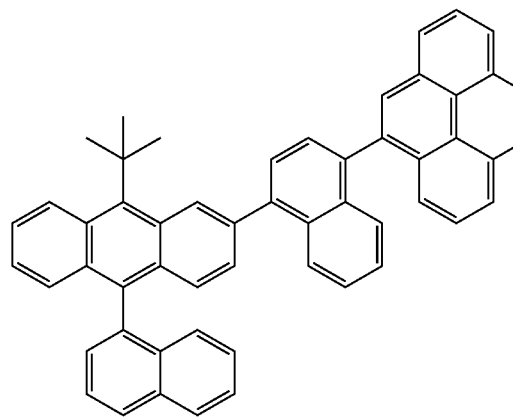
44
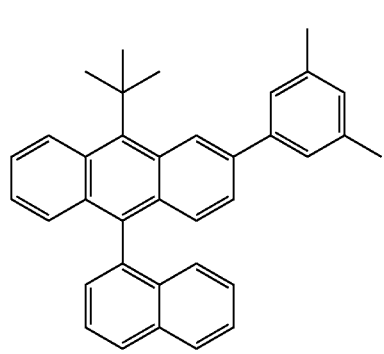
45
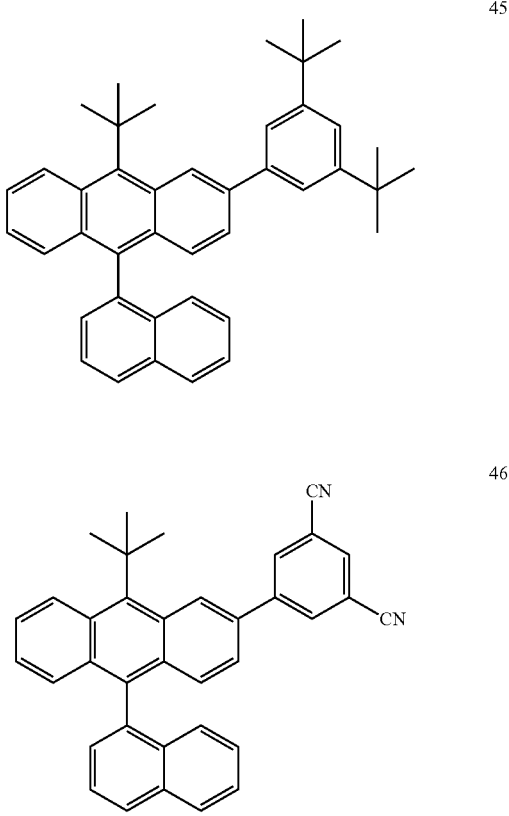
46
47
48
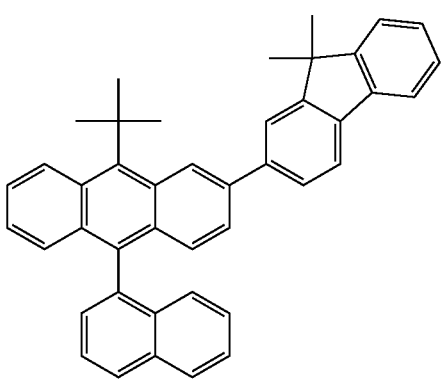

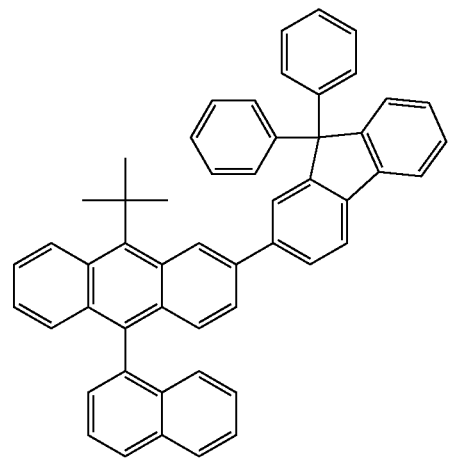
49
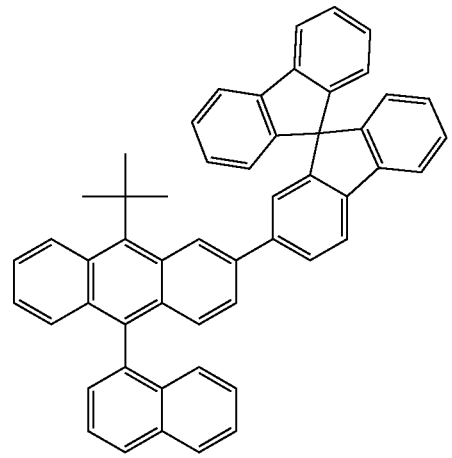
50
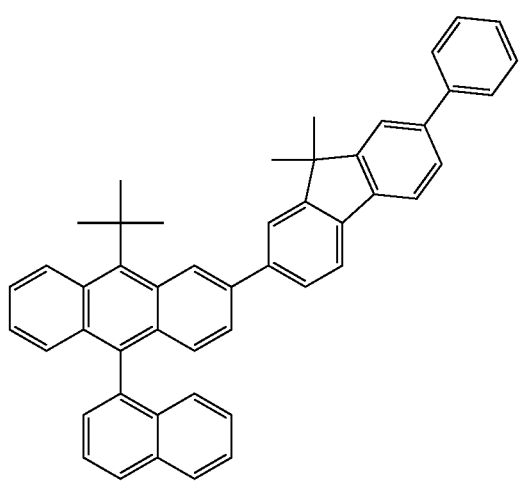
51
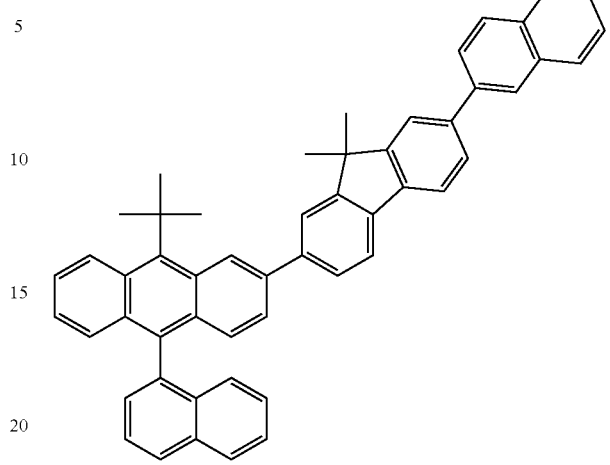
52
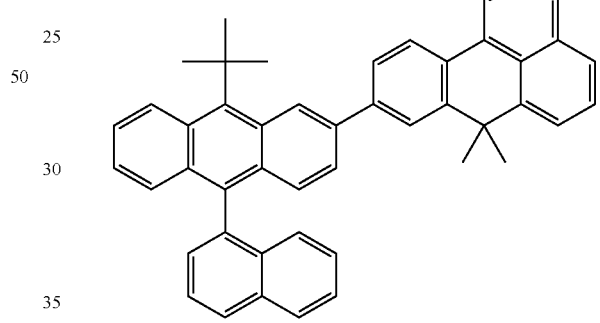
53
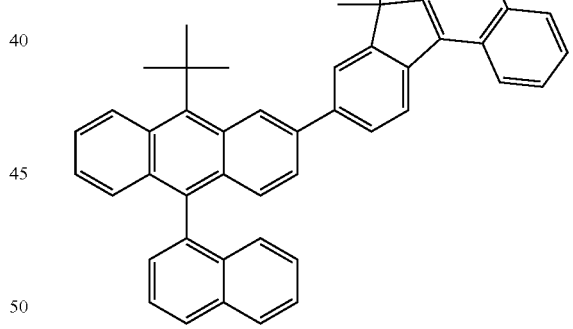
54
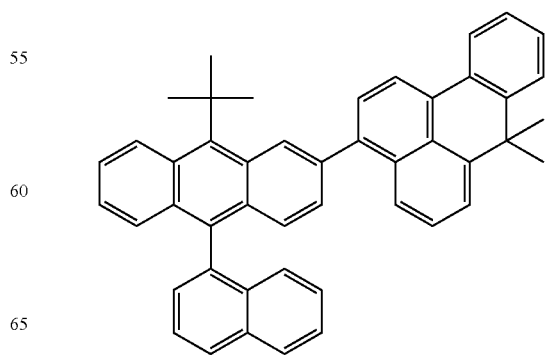
55

56
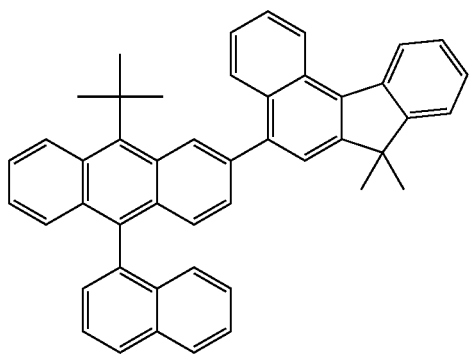
57
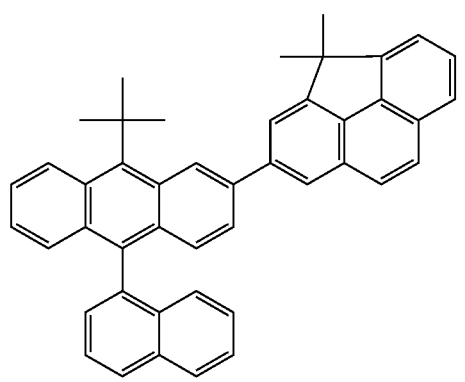
58
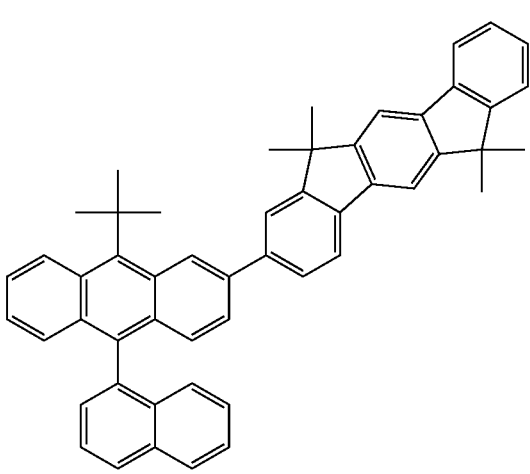
59
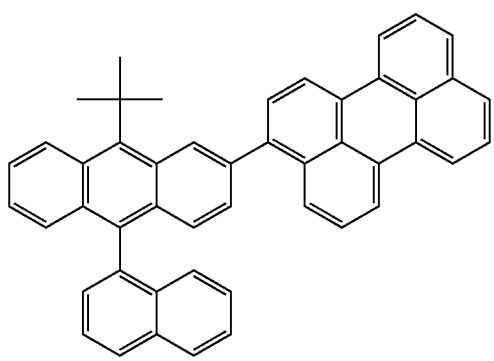
60
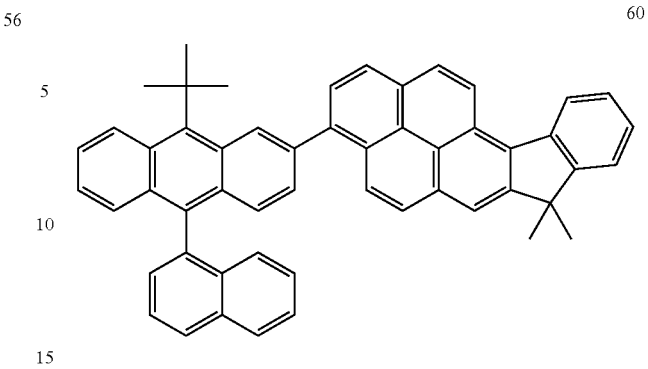
61
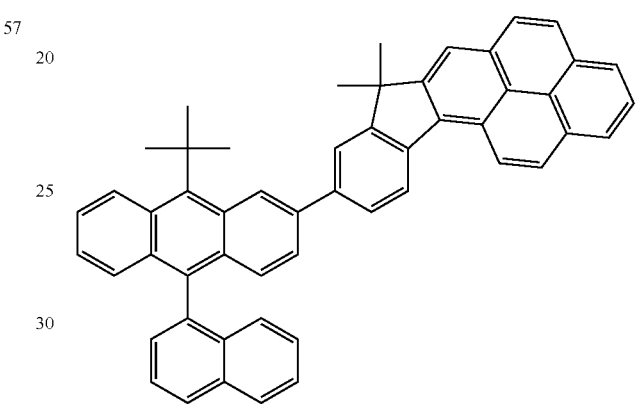
62
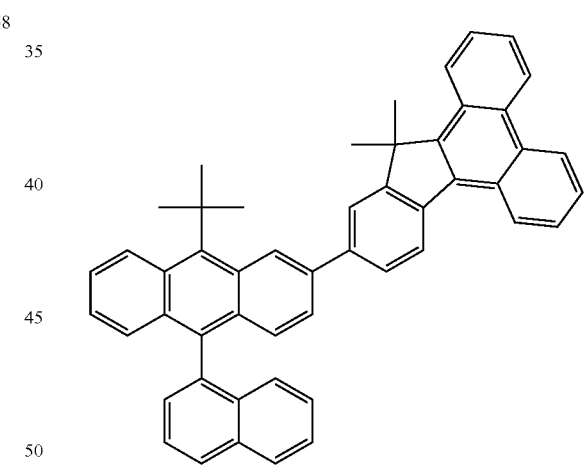
63
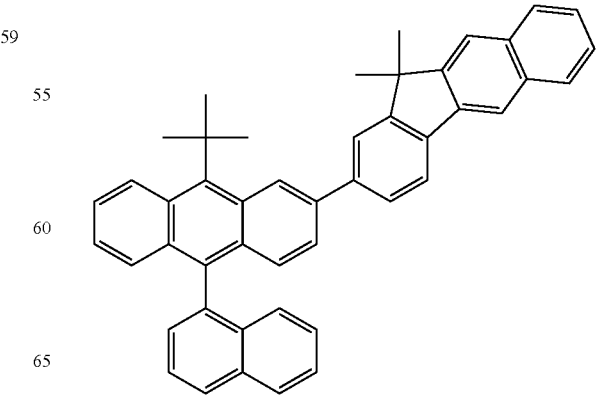

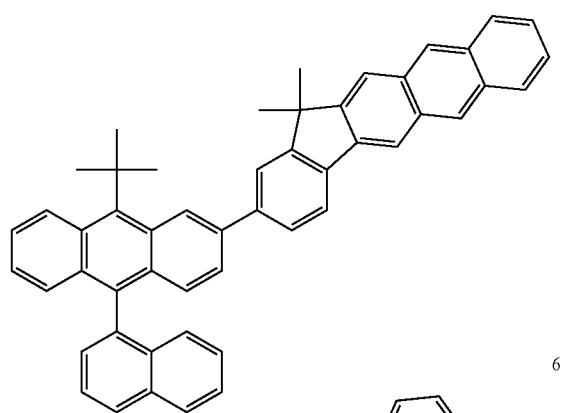
64
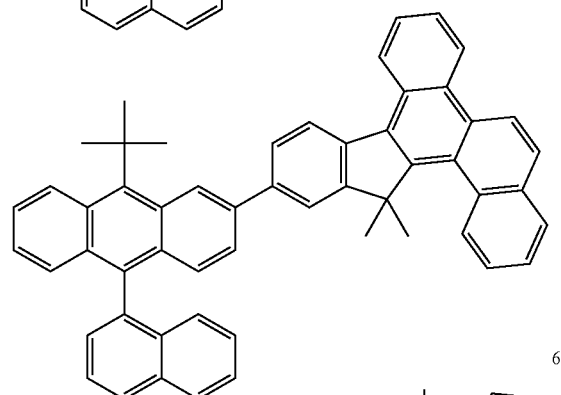
65
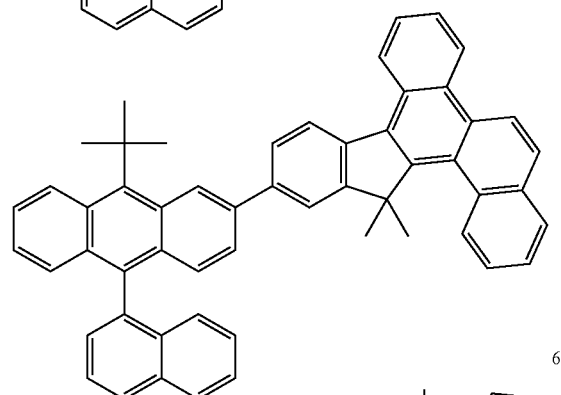
66
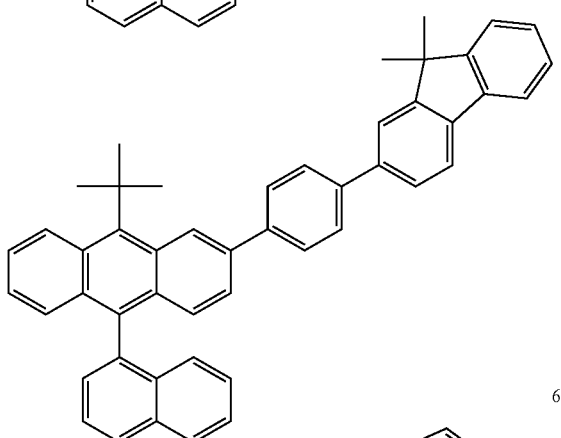
67
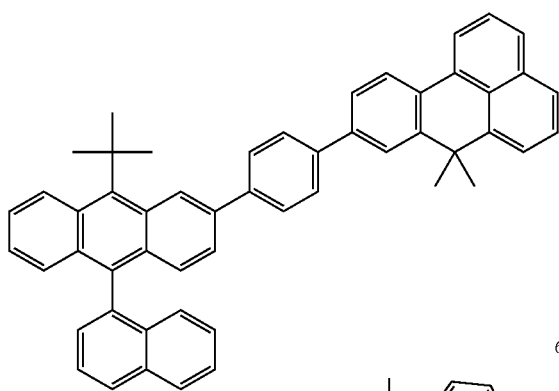
68
69
70
71

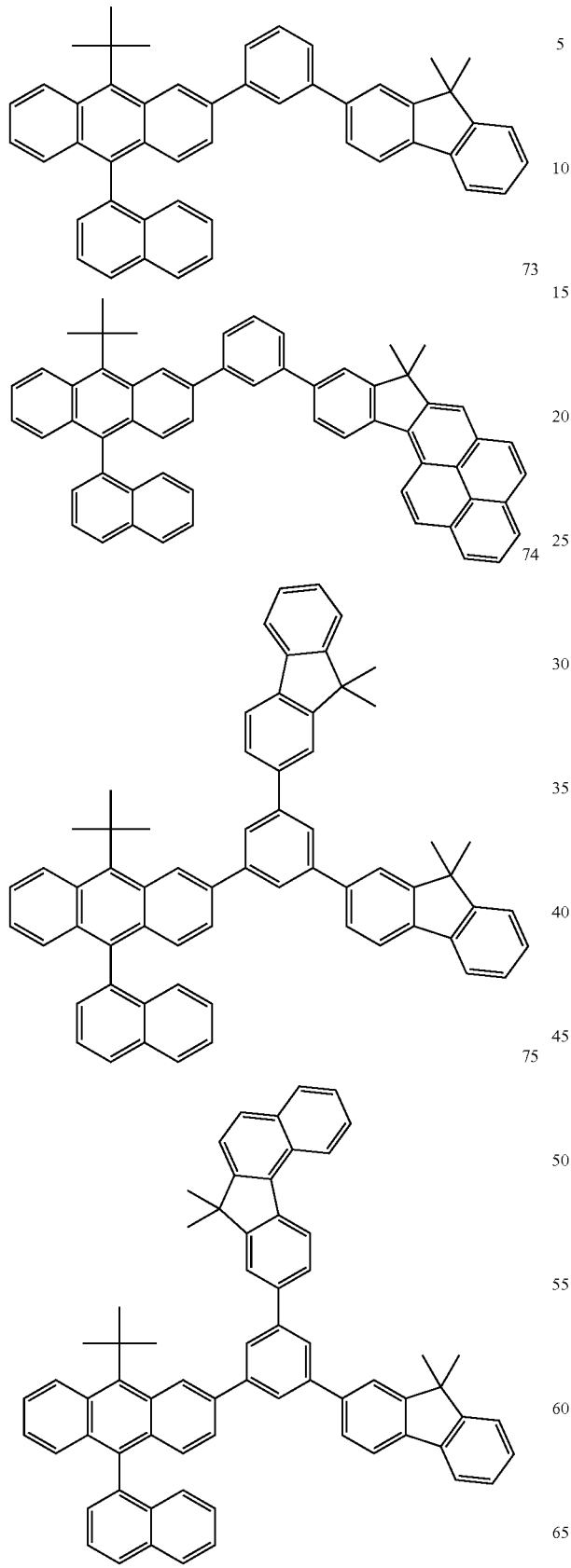
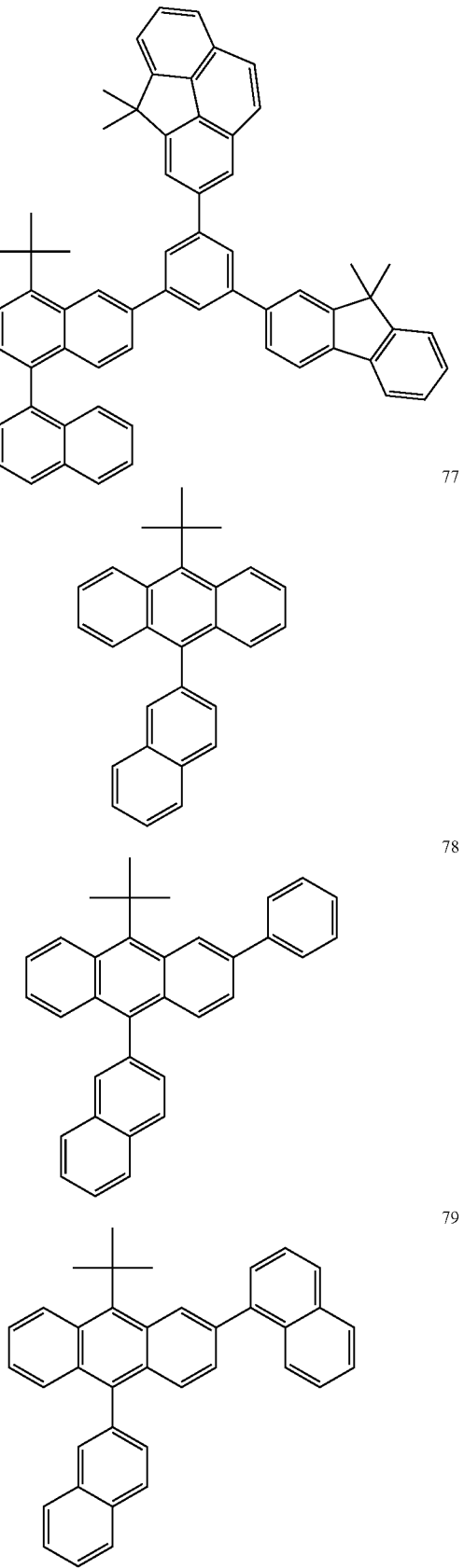

80
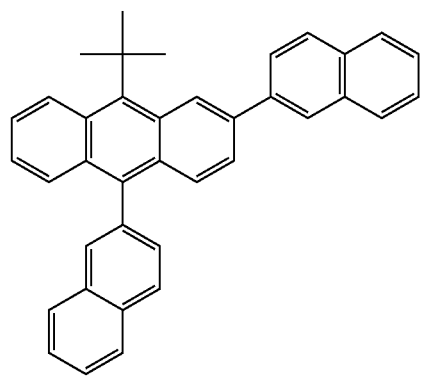
81
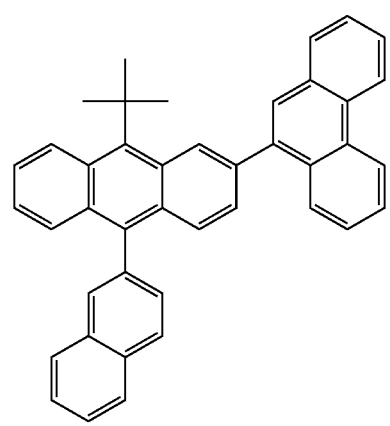
82
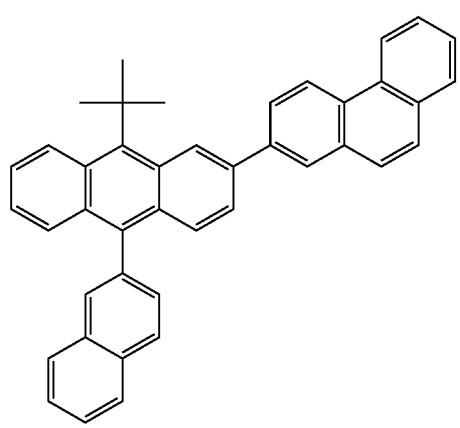
83
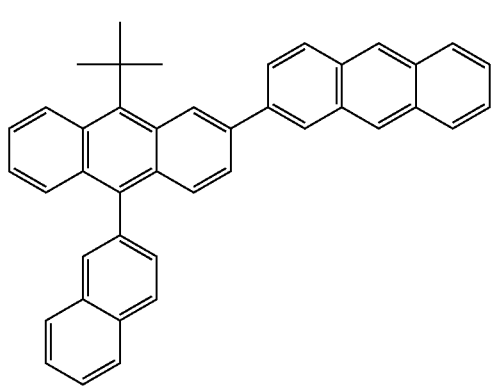
84
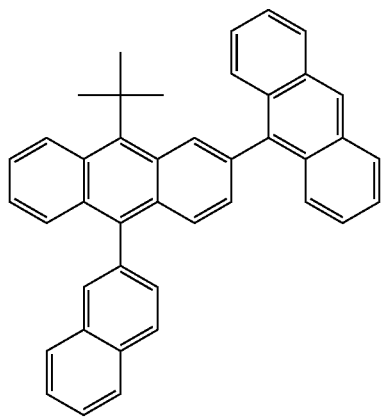
85
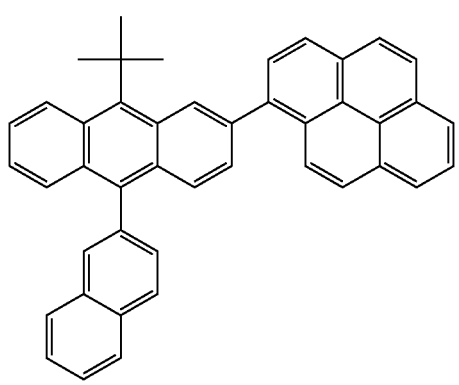
86
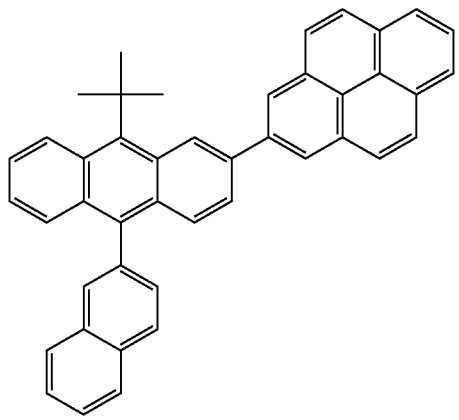
87
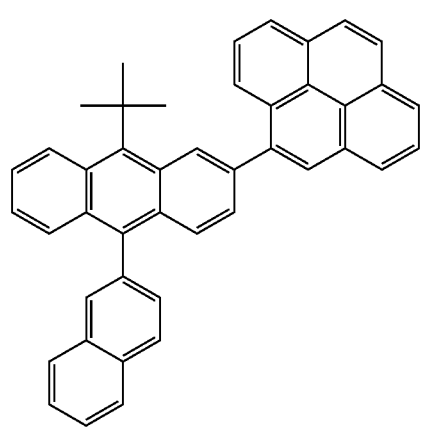

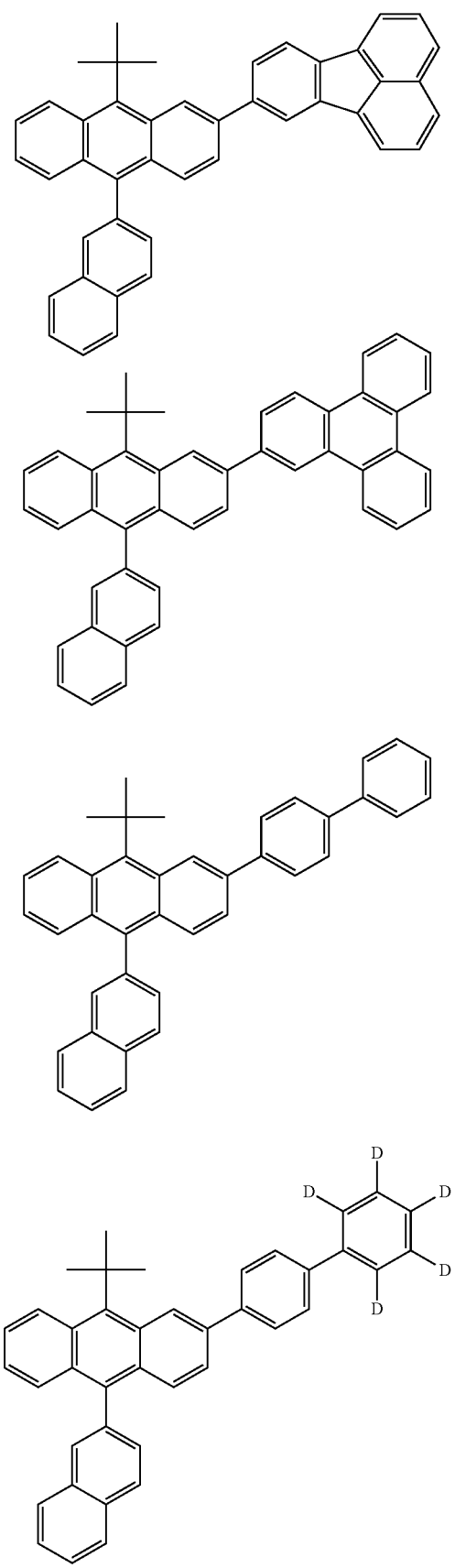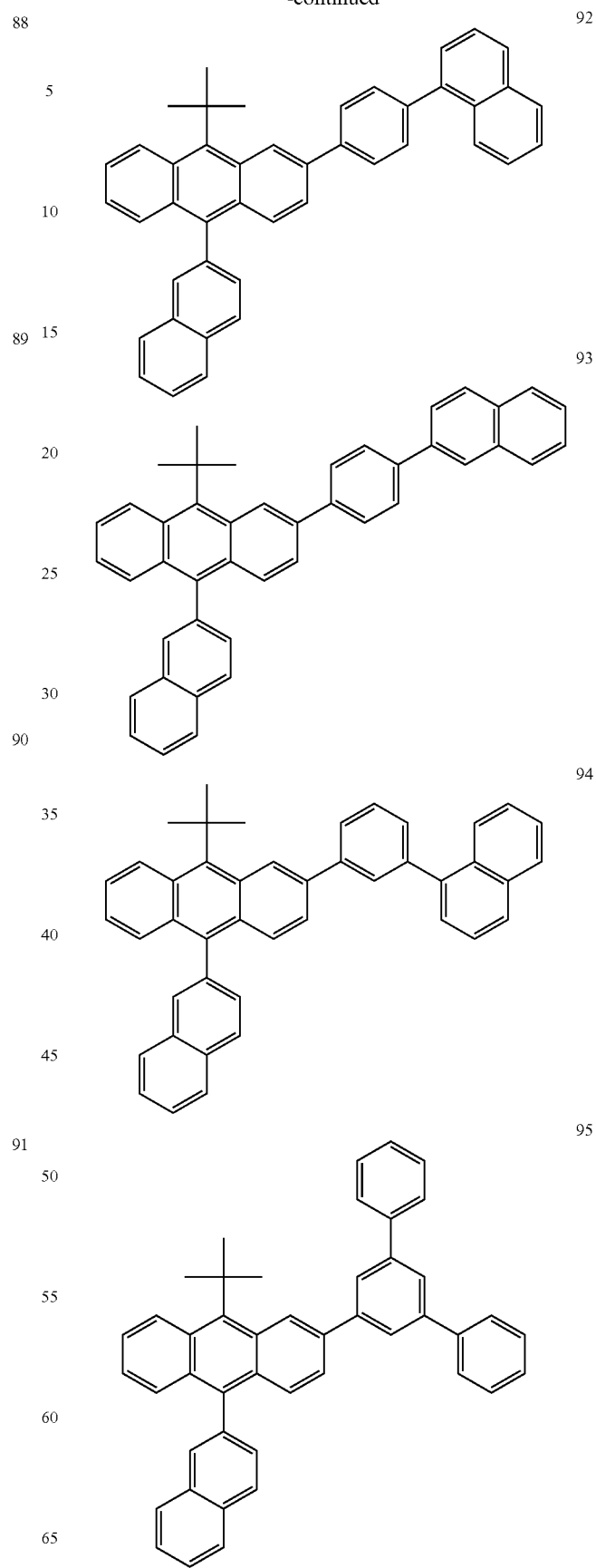

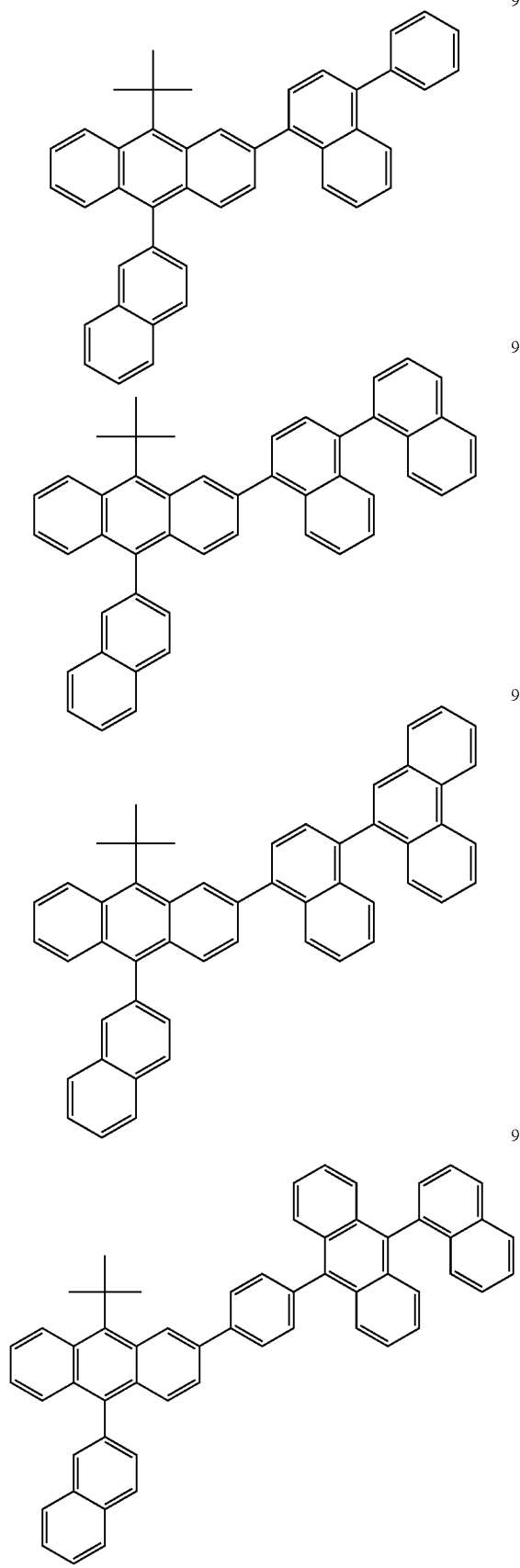
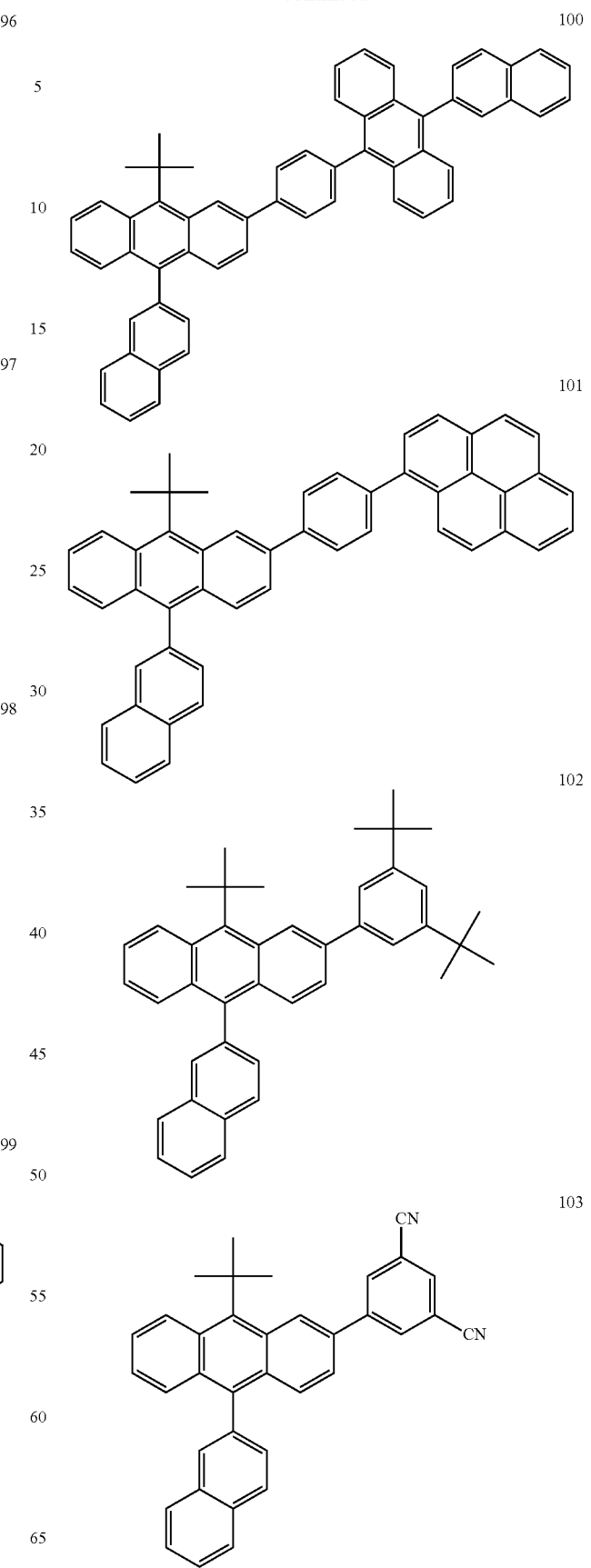

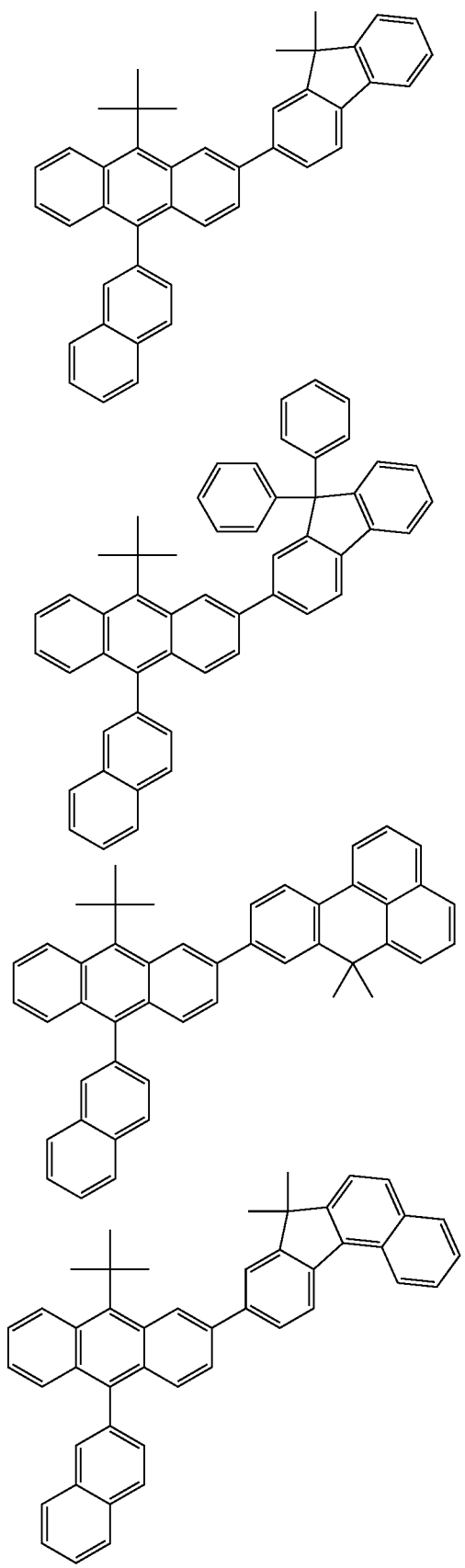
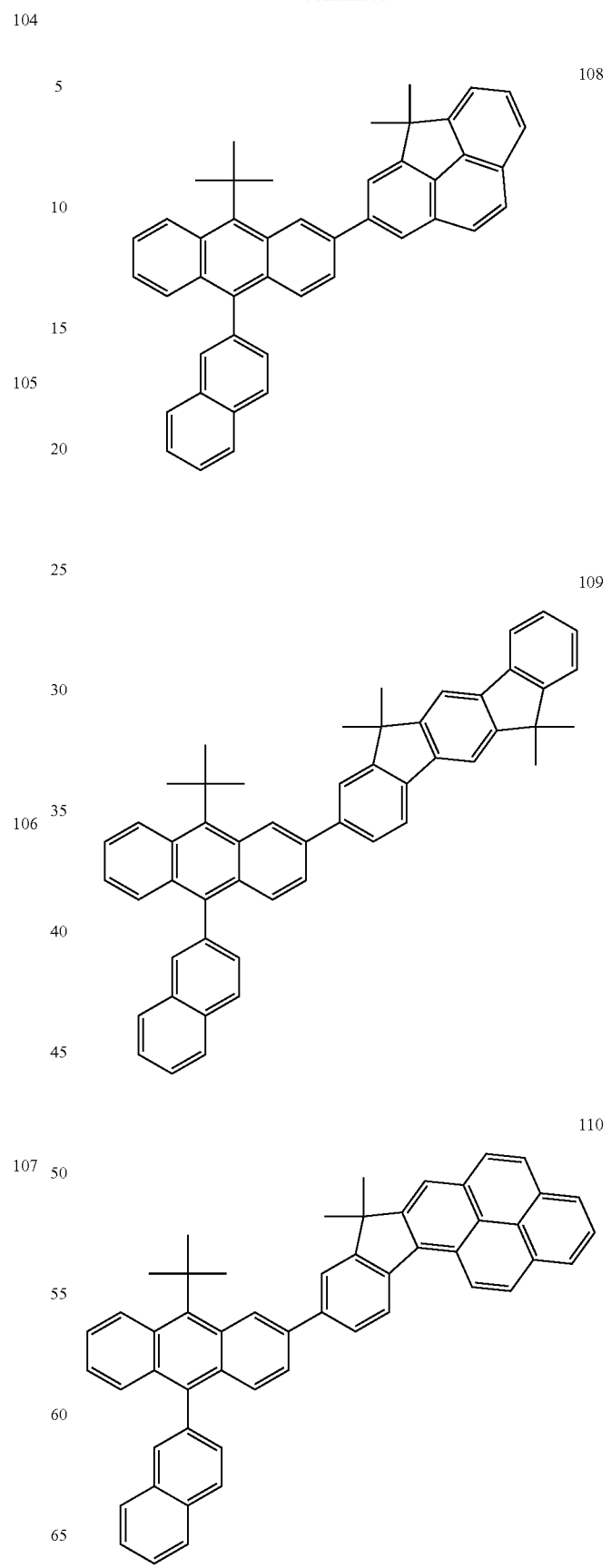

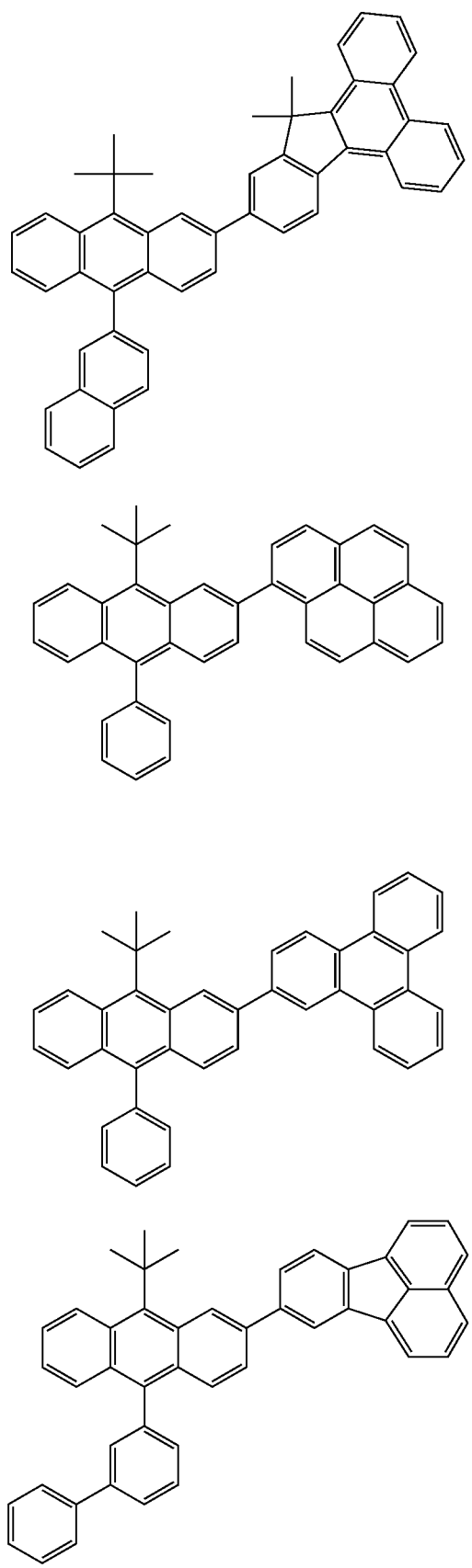
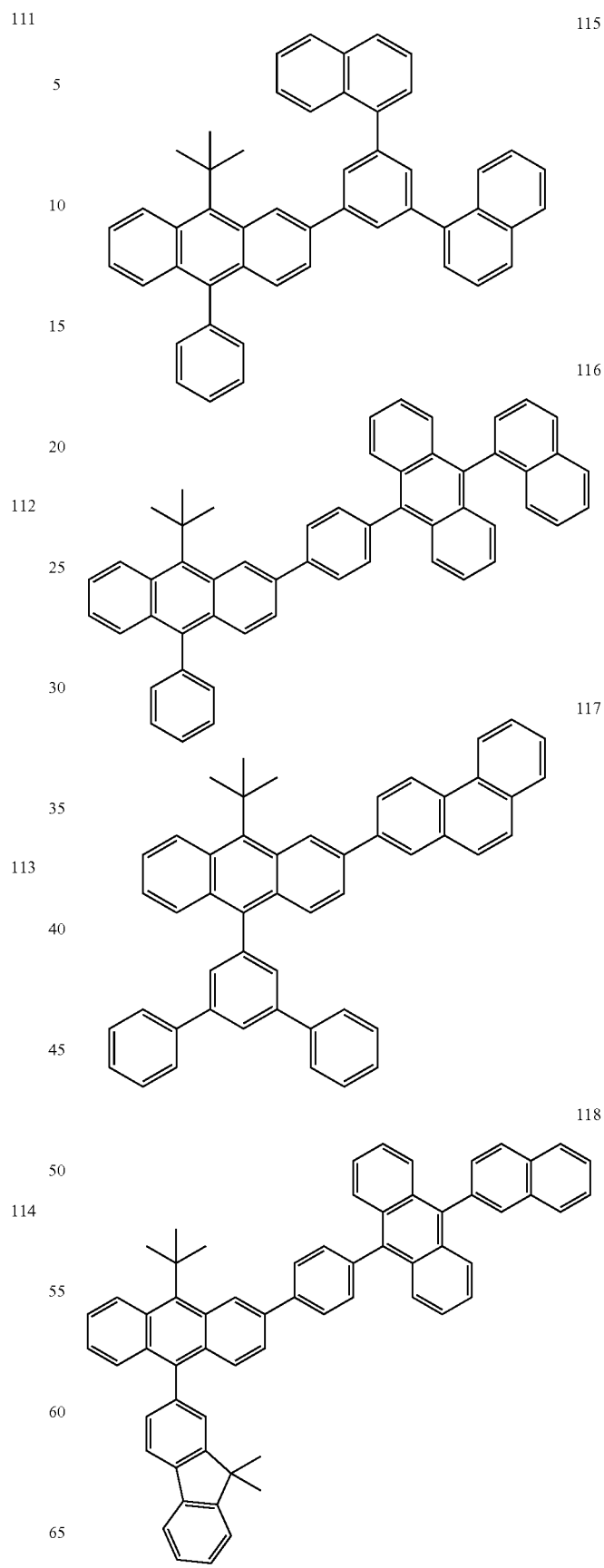

119
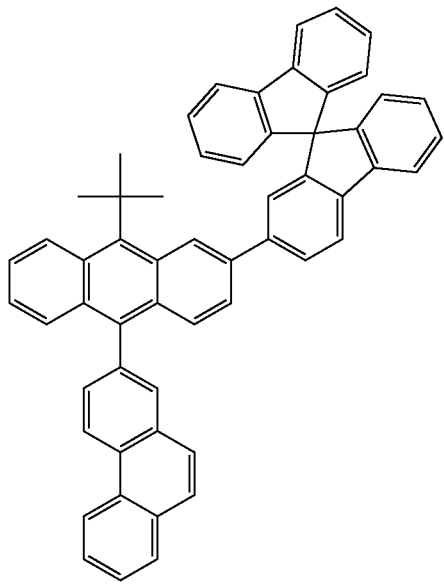
120
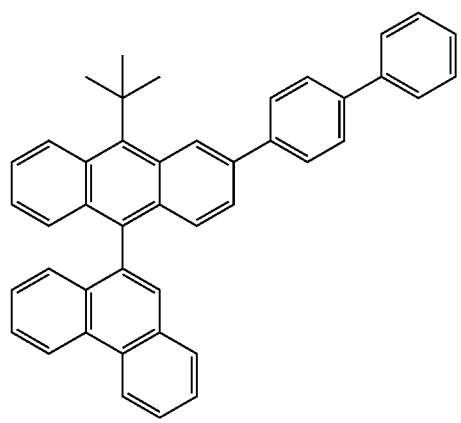
121
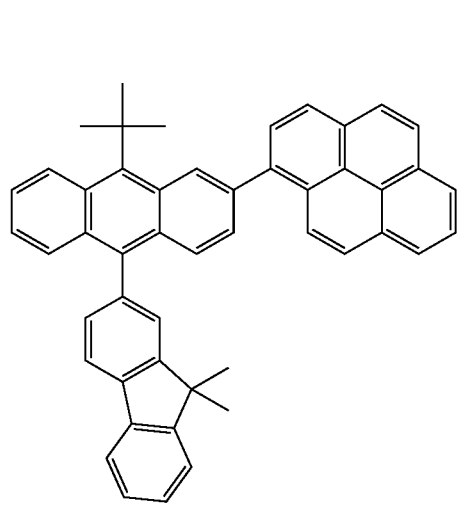
122
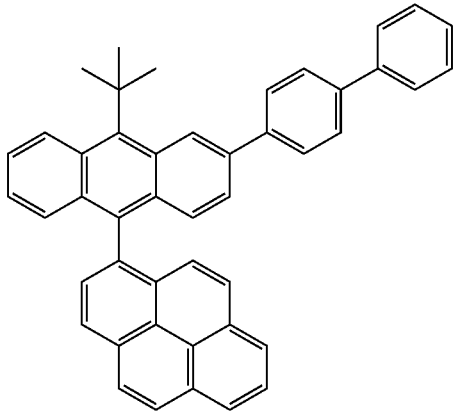
123
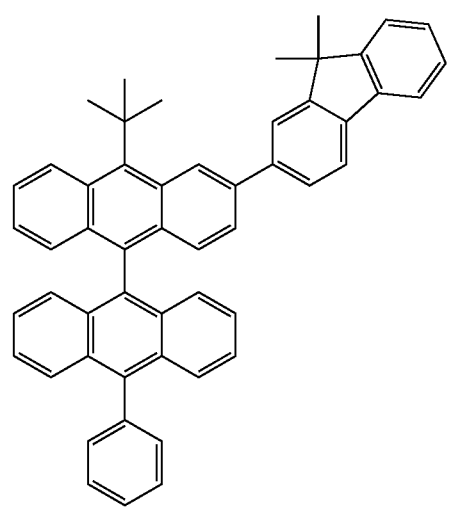
124
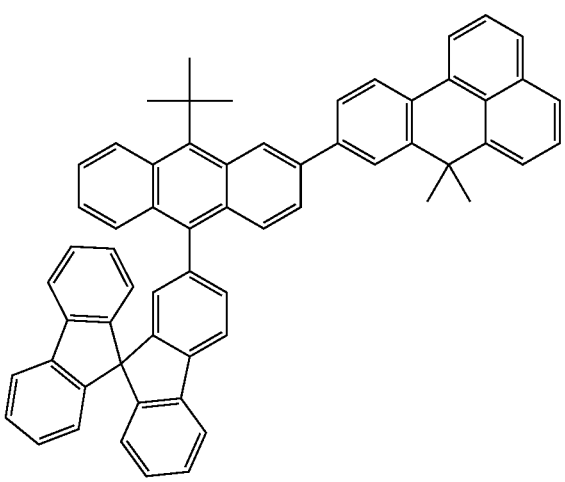

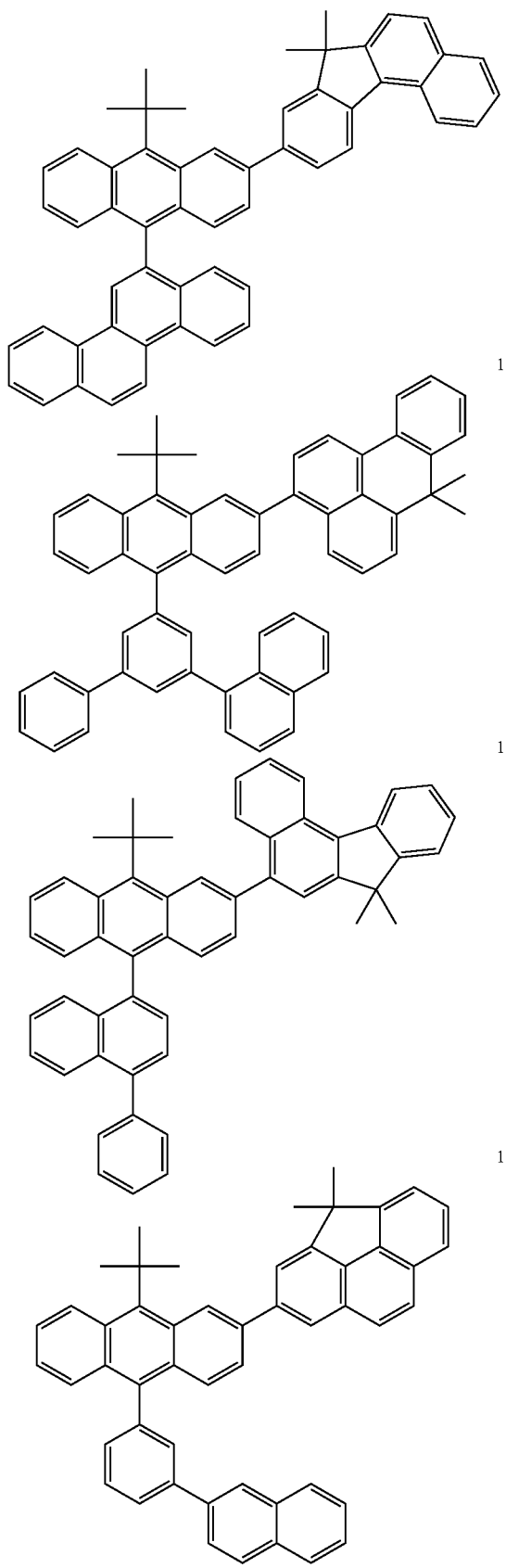
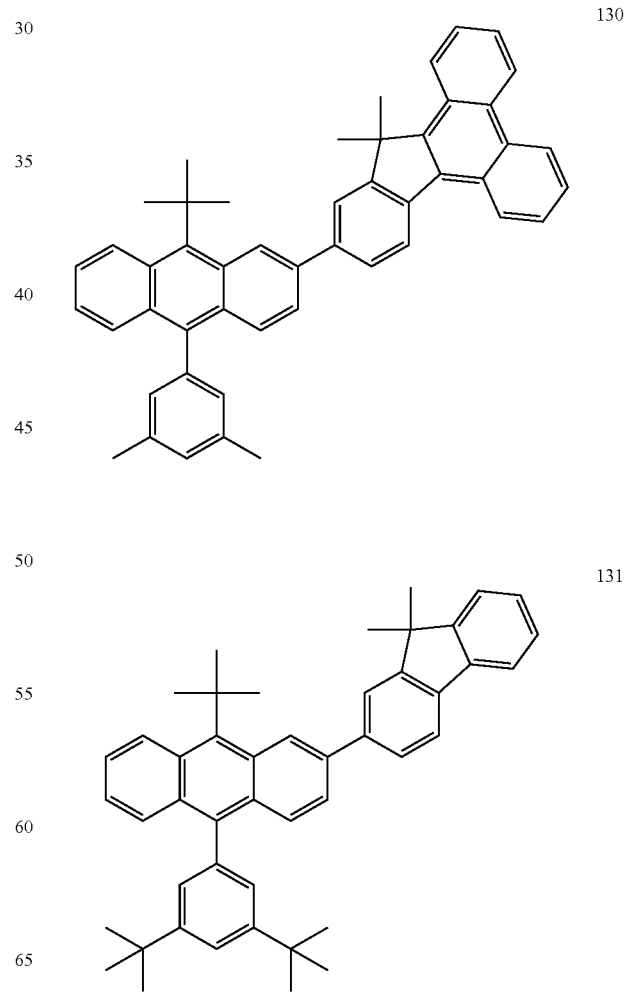

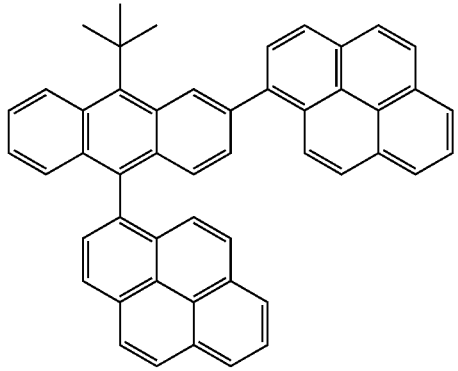

131

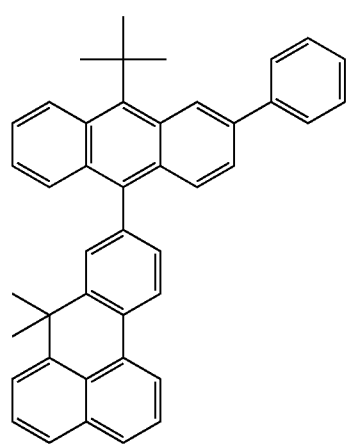

132

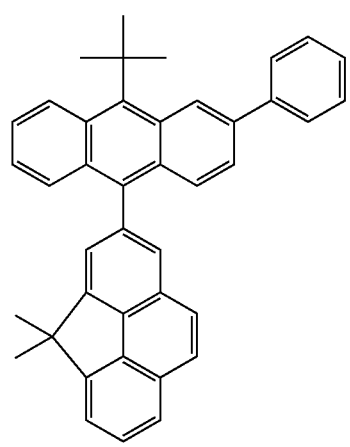

133

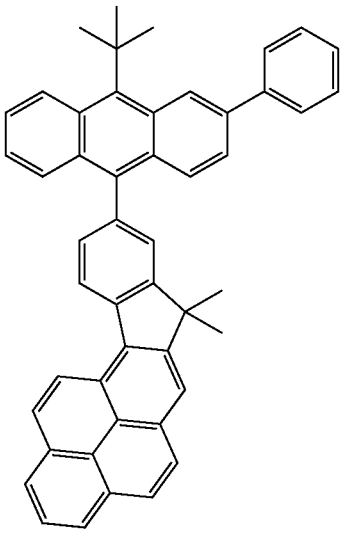

134

Examples of other anthracene-based compounds that are used in organic light-emitting devices include ADN and TBADN. The other anthracene-based compounds have aryl groups substituted at carbon numbers 9 and 10 of an anthracene ring, which enables the conjugation of the entire anthracene ring and the aryl group to stabilize the HOMO and LUMO energy levels of the other anthracene-based compound to thereby reduce the size of the overall bandgap energy.

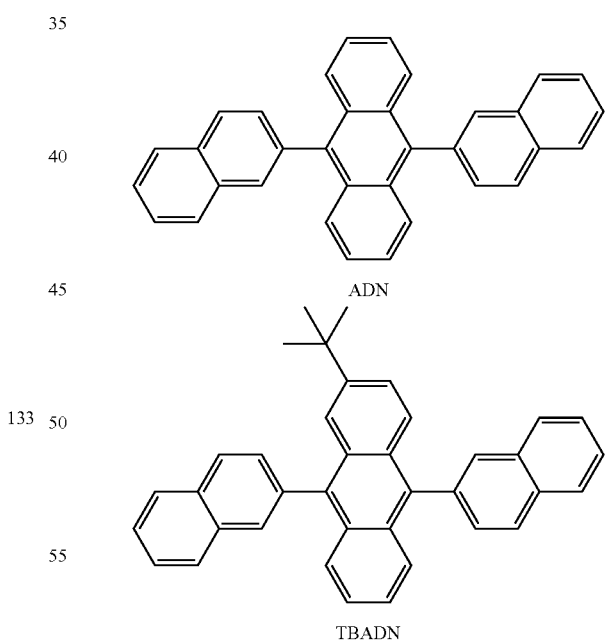

ADN

TBADN

However, the other anthracene-based compounds may have abundant electron density and thus, the other anthracene-based compounds may be highly reactive with respect to radical positive ions or radical negative ions. Accordingly, when voltage is applied to an organic light-emitting device including the other anthracene-based compound, high reactivity of the other anthracene-based compound may cause degeneration of the other anthracene-based compound, which in turn may shorten the lifespan of the organic light-emitting device.

The anthracene-based compound according to an embodiment has a carbon number 9 of the anthracene ring substituted with a tert-butyl group, which does not have π-electrons. Thus, the anthracene-based compound and the tert-butyl may not form conjugation therebetween. Accordingly, the anthracene ring may be relatively deficient of π-electrons and thus, the anthracene-based compound represented by Formula 1, above, may be relatively stable. Accordingly, an organic light-emitting device including the anthracene-based compound according to an embodiment may have longer lifespan.

Furthermore, the anthracene-based compound represented by Formula 1 has a substituent having a large steric hindrance, such as a tert-butyl group and thus, the above-described compounds may not have a regular orientation. Accordingly, the anthracene-based compound represented by Formula 1 above may have a high glass transition temperature (Tg) and thus, stability of the anthracene-based compound may be high during the formation of a thin film.

Also, it may seem desirable to use compounds having tert-butyl groups on carbon atoms 9 and 10. However, such compounds may be too deficient of π-electrons in the anthracene ring, to thereby reduce electron transporting capability of such compounds. Accordingly, use of such compounds may decrease efficiency of the organic light-emitting device and thus, the compounds may not be suitable as a host material or an electron transporting material.

Accordingly, the anthracene-based compound represented by Formula 1 may include, e.g., a tert-butyl group on carbon number 9 and an aryl group on carbon number 10. Thus, an organic light-emitting device including the anthracene-based compound may have high efficiency and a long lifespan.

At least one anthracene-based compound represented by Formula 1 above may be used in a layer between a pair of electrodes of an organic light-emitting device. For example, at least one anthracene-based compound represented by Formula 1 above may be used in an emission layer. For example, at least one anthracene-based compound represented by Formula 1 above may be used as a host in the emission layer.

Accordingly, the embodiments may provide an organic light-emitting device including a first electrode; a second electrode opposite to the first electrode; and an organic layer between the first electrode and the second electrode. The organic layer may include a emission layer. The organic layer may include at least one anthracene-based compound represented by Formula 1, described above.

As used herein, the expression "(organic layer) includes at least one anthracene-based compound" may be construed as "(organic layer) includes one anthracene-based compound in the range of Formula 1 above or two different anthracene-based compounds in the range of Formula 1".

For example, the organic layer may be or may include an anthracene-based compound, which may only include Compound 1 above. In this regard, e.g., Compound 1 may be present on a hole-transporting layer (HTL) of the organic light-emitting device. Also, the organic layer may be or may include an anthracene-based compound, which may include Compound 1 and Compound 2, described above. In this regard, e.g., Compound 1 and Compound 2 may be present on the same layer or different layers (for example, an emission layer (EML), or a first EML and a second EML).

For example, the anthracene-based compound may be present on or in the EML. In some embodiments, the EML may further include a dopant, and the anthracene-based compound may be a host.

As used herein, the term "organic layer" refers to a single and/or a plurality of layers disposed between the first electrode and the second electrode in an organic light-emitting device.

The FIGURE illustrates a cross-sectional view of a structure of the organic light-emitting device 100 according to an embodiment. Hereinafter, a structure and a method of manufacturing the organic light-emitting device according to an embodiment will be described with reference to the FIGURE.

The organic light-emitting device 100 may include a first electrode 120, an organic layer 130, and a second electrode 140.

The substrate 110 may be a suitable substrate that is used in organic light emitting devices, e.g., a glass substrate or a transparent plastic substrate having strong mechanical strength, thermal stability, transparency, surface smoothness, ease of handling, and water resistance.

The first electrode 120 may be formed on the substrate by depositing or sputtering a first electrode-forming material onto a surface of the substrate 110. When the first electrode 120 is an anode, a material having a high work function may be used as the first electrode-forming material to facilitate hole injection. The first electrode 120 may be a reflective electrode or a transmission electrode. Materials having excellent transparent and conductive capabilities, e.g., indium tin oxide (ITO), indium zinc oxide (IZO), tin oxide ($SnO_2$), and zinc oxide (ZnO) may be used to form the first electrode 120. In other embodiments, magnesium (Mg), aluminum (Al), aluminum-lithium (Al—Li), calcium (Ca), magnesium-indium (Mg—In), magnesium-silver (Mg—Ag), and the like may be used to form the first electrode 120 as a reflective electrode.

The first electrode 120 may have a single layer or a multi-layer structure including two or more layers. For example, the first electrode 120 may have a three-layered structure of ITO/Ag/ITO, but is not limited thereto.

An organic layer 130 may be disposed on the first electrode 120.

The organic layer 130 may include an emission layer (EML) 133.

The organic layer 130 may further include a hole-transporting region between the first electrode 120 and the EML 133. The hole-transporting region may include at least one layer of a hole-injection layer 131, HTL 132, a functional layer having both hole-injection and hole-transporting capabilities (hereinafter, "H-functional layer"), a buffer layer, and an electron blocking layer.

The organic layer 130 may further include an electron-transporting region disposed between the second electrode 140 and the EML 133. The electron-transporting region may include at least one layer selected from an electron-transporting layer (ETL) 134, an electron-injection layer (EIL) 135, a functional layer having both electron-injection and electron-transporting capabilities (hereinafter, "E-functional layer"), and a hole-blocking layer.

The HIL 131 may be formed on the first electrode 120 by various methods such as vacuum deposition, spin coating, casting, or Langmuir-Blodgett (LB) deposition.

When the HIL 131 is formed by using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec.

When the HIL is formed by using spin coating, the coating conditions may vary according to the compound that is used to form the HIL, and the desired structure and thermal properties of the HIL to be formed. For example, the coating rate may be in a range of about 2,000 rpm to about 5,000 rpm, and a temperature at which heat treatment is performed to remove a solvent after coating may be in a range of about 80° C. to about 200° C.

The HIL may be formed of a suitable HIL material. Examples of the material for the HIL may include N,N'-diphenyl-N,N'-bis-[4-(phenyl-m-tolyl-amino)-phenyl]-biphenyl-4,4'-diamine (DNTPD); a phthalcyanine compound such as copper phthalcyanine; 4,4',4"-tris(3-methylphenyl-phenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and (polyaniline)/poly(4-styrenesulfonate) (PANI/PSS):

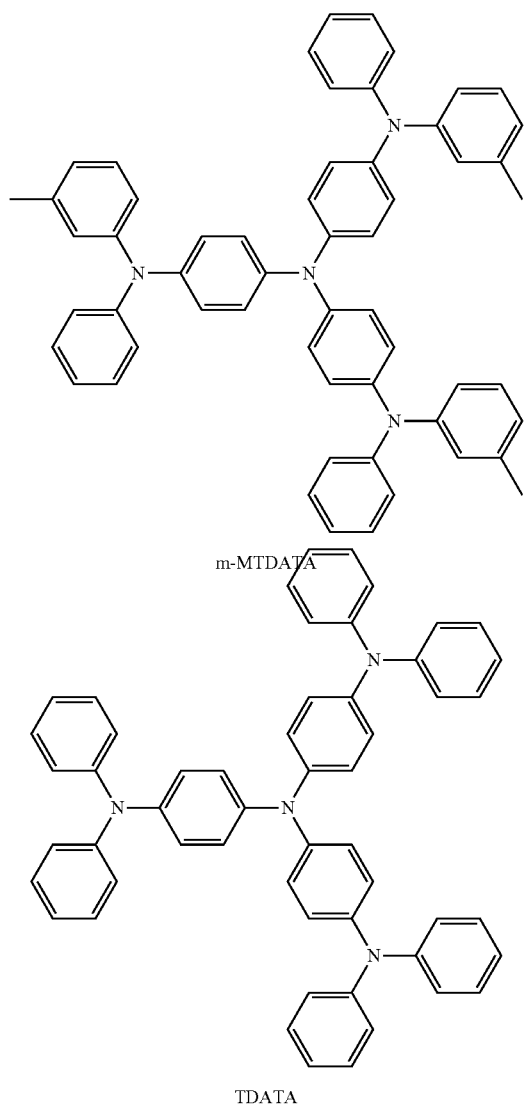

m-MTDATA

TDATA

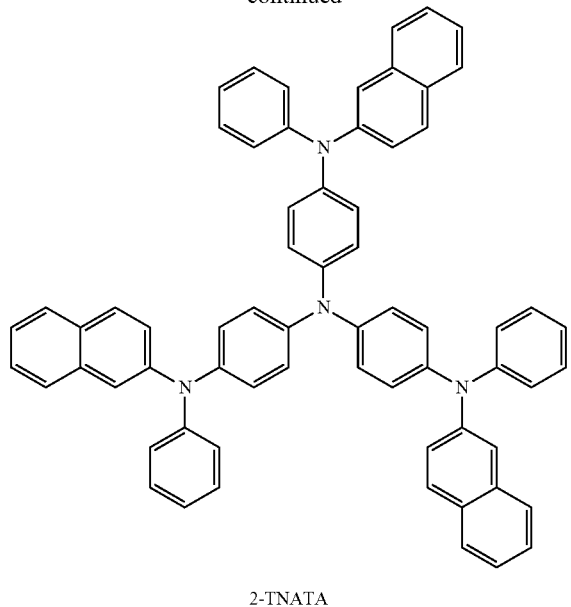

2-TNATA

A thickness of the HIL may be about 100 Å to about 10,000 Å, e.g., about 100 Å to about 1,000 Å. When the thickness of the HIL is within these ranges, the HIL may have good hole-injecting ability without a substantial increase in driving voltage.

In addition to the above-described hole-injecting materials, the HIL may further include a charge-generating material. The charge-generating material may include a quinone derivative such as tetracyanoquinonedimethane (TCNQ) and 2,3,5,6-tetrafluoro-tetracyano-1,4-benzoquinonedimethane (F4-TCNQ); a metal oxide such as tungsten oxide and molybdenum oxide; and a cyano-group-containing compound such as Compound 100 below.

<Compound 100>

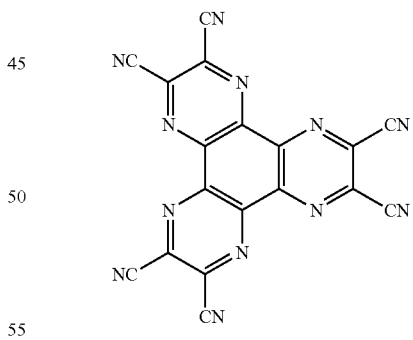

When the HIL further includes the charge-generating material, the charge-generating material may be homogeneously dispersed or heterogeneously distributed in the HIL.

Then, the HTL 132 may be formed on the HIL 131 by using various methods, such as vacuum deposition, spin coating, casting, and LB deposition. When the HTL 132 is formed using vacuum deposition or spin coating, the deposition and coating conditions may be similar to those for the formation of the HIL 131, though the conditions for deposition and coating may vary according to the material that is used to form the HTL 132.

Examples of suitable hole-transporting materials may include carbazole derivatives such as N-phenylcarbazole and polyvinylcarbazole; N,N'-bis(3-methyl phenyl)-N,N'-diphenyl-[1,1-biphenyl]-4,4'-diamine (TPD), 4,4',4"-tris(N-carbazolyl) triphenylamine (TCTA), and N,N'-di(1-naphthyl-N,N'-diphenylbenzidine) (NPB).

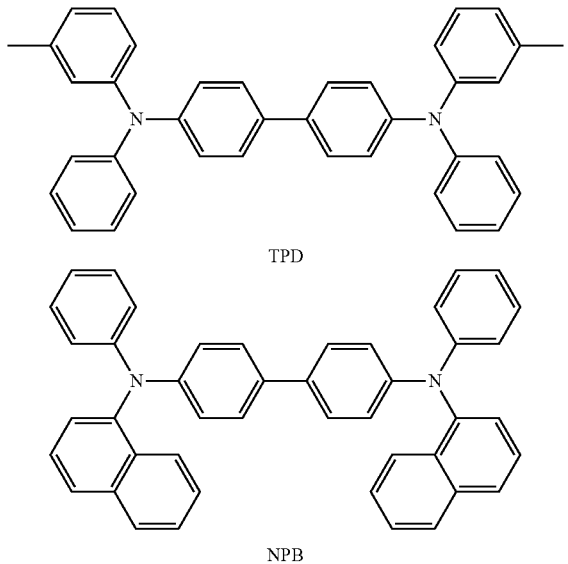

TPD

NPB

A thickness of the HTL 132 may be from about 50 Å to about 2,000 Å, e.g., about 100 Å to about 1,500 Å. When the thickness of the HTL 132 is within these ranges, the HTL 132 may have good hole-transporting ability without a substantial increase in driving voltage.

The H-functional layer (having both hole-injecting and hole-transporting capabilities) may include at least one material from each group of the HIL materials and HTL materials. The thickness of the H-functional layer may be from about 50 Å to about 10,000 Å, e.g., about 100 Å to about 1,000 Å. When the thickness of the H-functional layer is within these ranges, the H-functional layer may have good hole-injecting and transporting abilities without a substantial increase in driving voltage.

In an implementation, at least one selected from the HIL, HTL, and H-functional layer may include at least one compound of Formula 300 below and a compound of Formula 301 below:

<Formula 300>

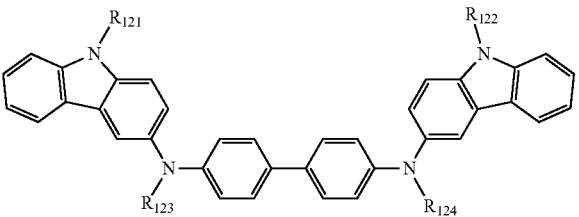

<Formula 301>

In Formula 300 above, $Ar_{101}$ and $Ar_{102}$ may be each independently a substituted or unsubstituted $C_6$-$C_{60}$ arylene group. For example, $Ar_{101}$ and $Ar_{102}$ may be each independently a phenylene group, a pentalenylene group, a indenylene group, a naphthylene group, a azulenylene group, a heptalenylene group, a substituted or unsubstitutedcenaphthylene group, a fluorenylene group, a phenalenylene group, a phenanthrenylene group, an anthrylene group, a fluoranthenylene group, a triphenylenylene group, a pyrenylene group, a chrysenylenylene group, a naphthacenylene group, a picenylene group, a perylenylene group and a pentacenylene group; and a phenylene group, a pentalenylene group, a indenylene group, a naphthylene group, a azulenylene group, a heptalenylene group, a substituted or unsubstitutedcenaphthylene group, a fluorenylene group, a phenalenylene group, a phenanthrenylene group, an anthrylene group, a fluoranthenylene group, a triphenylenylene group, a pyrenylene group, a chrysenylenylene group, a naphthacenylene group, a picenylene group, a perylenylene group, and a pentacenylene group, each substituted with at least one of deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ hetercycloalkyl group, a $C_2$-$C_{10}$ hetercycloalkenyl group, a $C_6$-$C_{60}$ aryl group, a $C_6$-$C_{60}$ aryloxy group, a $C_6$-$C_{60}$arylthio group, and a $C_2$-$C_{60}$ heteroaryl group.

In Formula 300 above, xa and xb may be each independently an integer of 0 to 5, or 0, 1, or 2. For example, xa may be 1, and xb may be 0.

In Formulae 300 and 301 above, $R_{101}$ to $R_{108}$, $R_{111}$ to $R_{119}$, and $R_{121}$ to $R_{124}$ may be each independently hydrogen, deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$arylthio group. For example, $R_{51}$ to $R_{58}$, $R_{61}$ to $R_{69}$, and $R_{71}$ and $R_{72}$ are each independently, hydrogen; deuterium; halogen atom; a hydroxyl group; a cyano group; a nitro group; an amino group; an amidino group; hydrazine group; hydrazone group; a carboxylic acid group or a salt thereof; a sulfonic acid group or a salt thereof; phosphoric acid or a salt thereof;

$C_1$-$C_{10}$ alkyl group (for example, a methyl group, an ethyl group, a propyl group, a butyl group, a pentyl group, and a hexyl group); a $C_1$-$C_{10}$ alkoxy group (for example, a methoxy group, an ethoxy group, a propoxy group, a butoxy group, and a pentoxy group); a $C_1$-$C_{10}$ alkyl group and a $C_1$-$C_{10}$ alkoxy group, each substituted with at least one of deuterium, a halogen atom, a hydroxyl group, a cyano group, a nitro group, an amino group, an amidino group, hydrazine, hydrazone, a carboxylic acid group or a salt thereof, a sulfonic acid group or a salt thereof, and phosphoric acid or a salt thereof; phenyl group; naphthyl group; anthryl group; fluorenyl group; pyrenyl group; a phenyl group, a naphthyl group, anthryl group, a fluorenyl group, and a pyrenyl group, each substituted with at least one of deuterium, a halogen atom, a hydroxyl group, a cyano group, a nitro group, an amino group, an amidino group, hydrazine, hydrazone, a carboxylic acid group or a salt thereof, a sulfonic acid group or a salt thereof, phosphoric acid or a salt thereof, a $C_1$-$C_{10}$ alkyl group, and a $C_1$-$C_{10}$ alkoxy group.

In formula 300 above, $R_{109}$ may be selected from a phenyl group; a naphthyl group; an anthryl group; a biphenyl group; a pyridinyl group; and a phenyl group, a naphthyl group, an anthryl group, a biphenyl group, and a pyridinyl group, each substituted with at least one of deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, phosphoric acid or a salt thereof, a substituted or unsubstituted $C_1$-$C_{20}$ alkyl group, and a substituted or unsubstituted $C_1$-$C_{20}$ alkoxy group.

According to an embodiment, a compound represented by Formula 300 above may be represented by Formula 300 A below.

<Formula 300A>

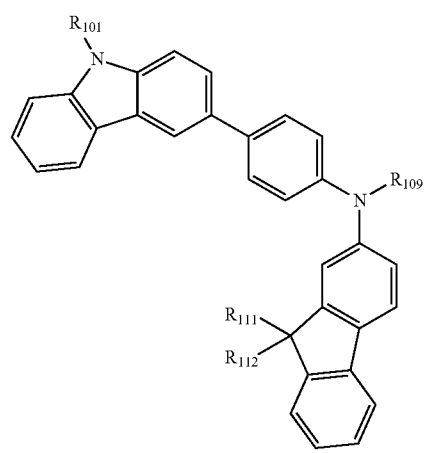

In Formula 300A, $R_{101}$, $R_{109}$, $R_{111}$, and $R_{112}$ may be as described above.

For example, at least one layer of the HIL, HTL and H-functional layer may include at least one of Compounds 301 to 320, below.

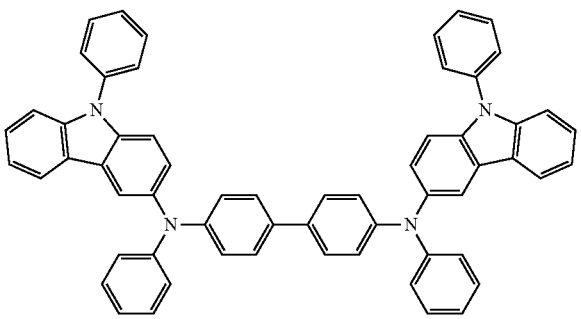

301

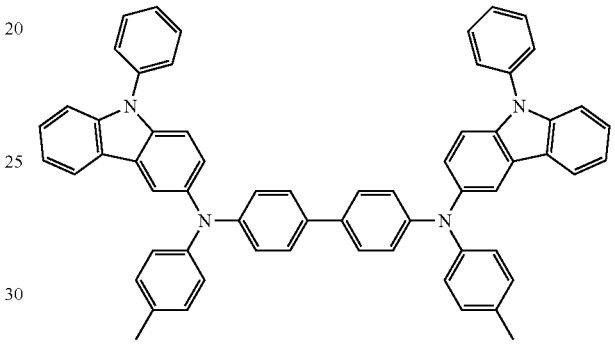

302

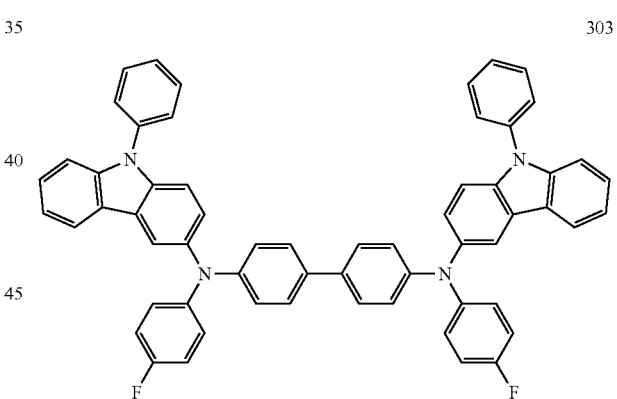

303

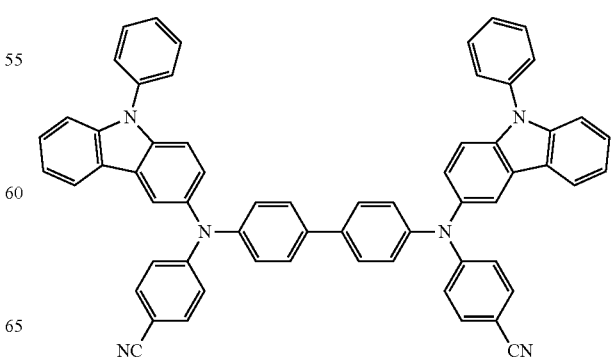

304

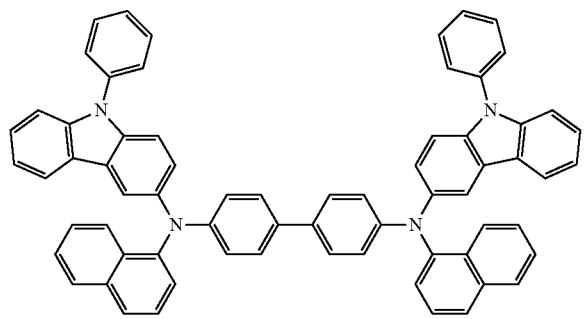
305
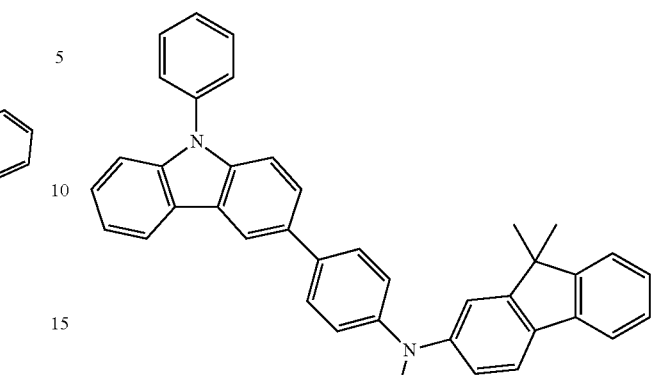
309
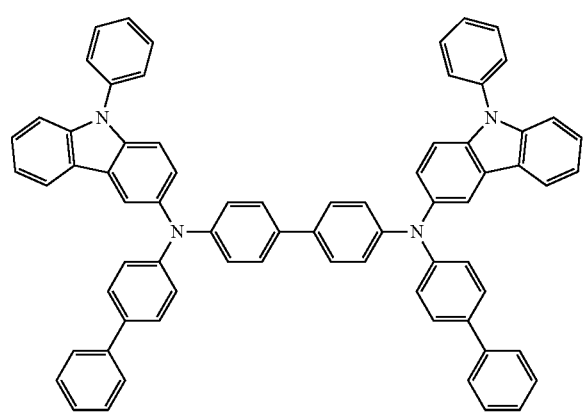
306
310
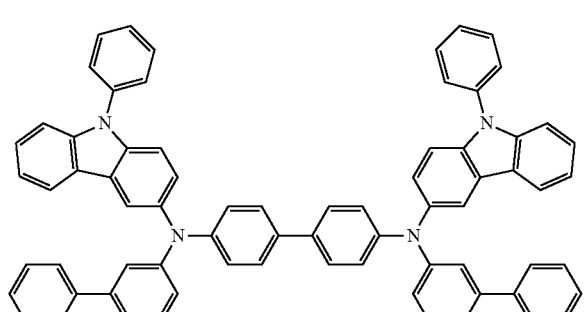
307
311
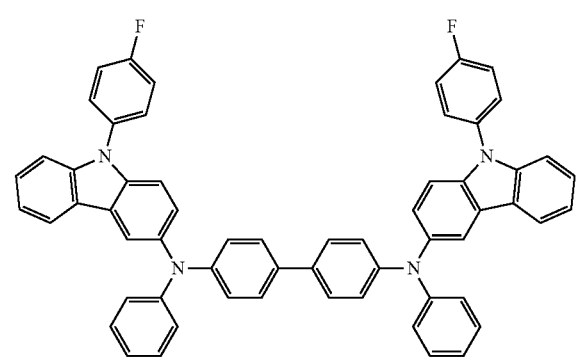
308

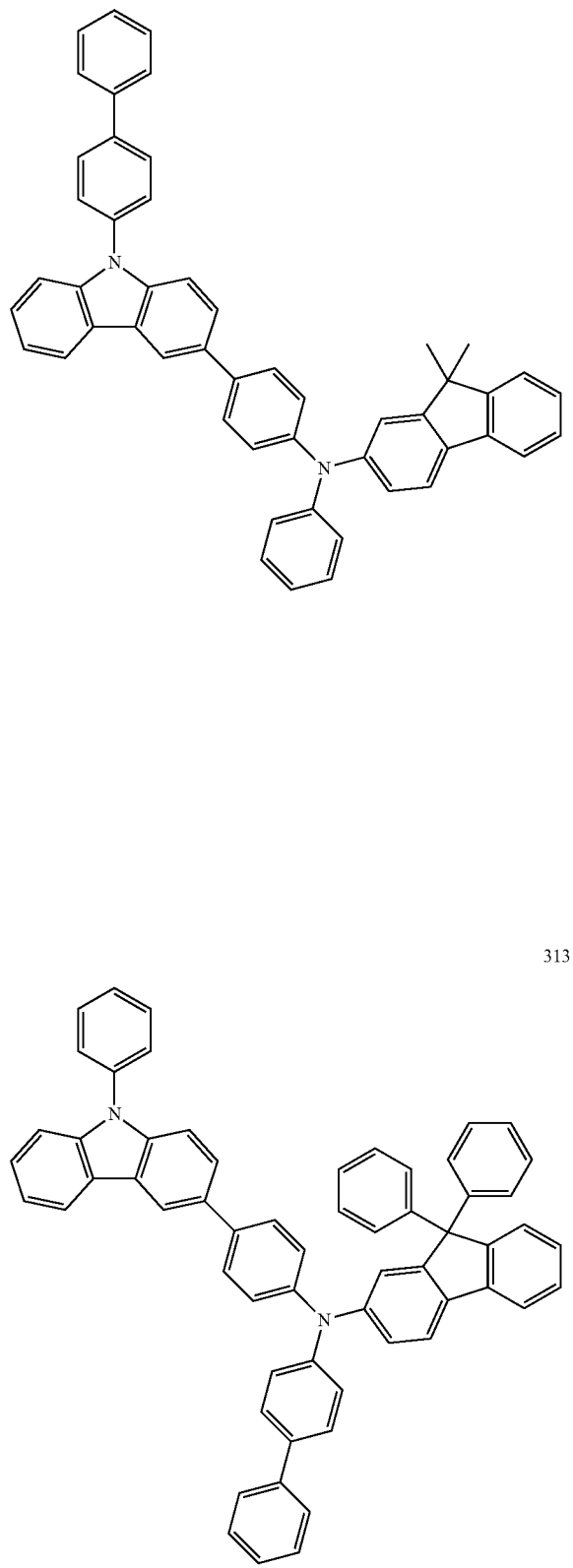
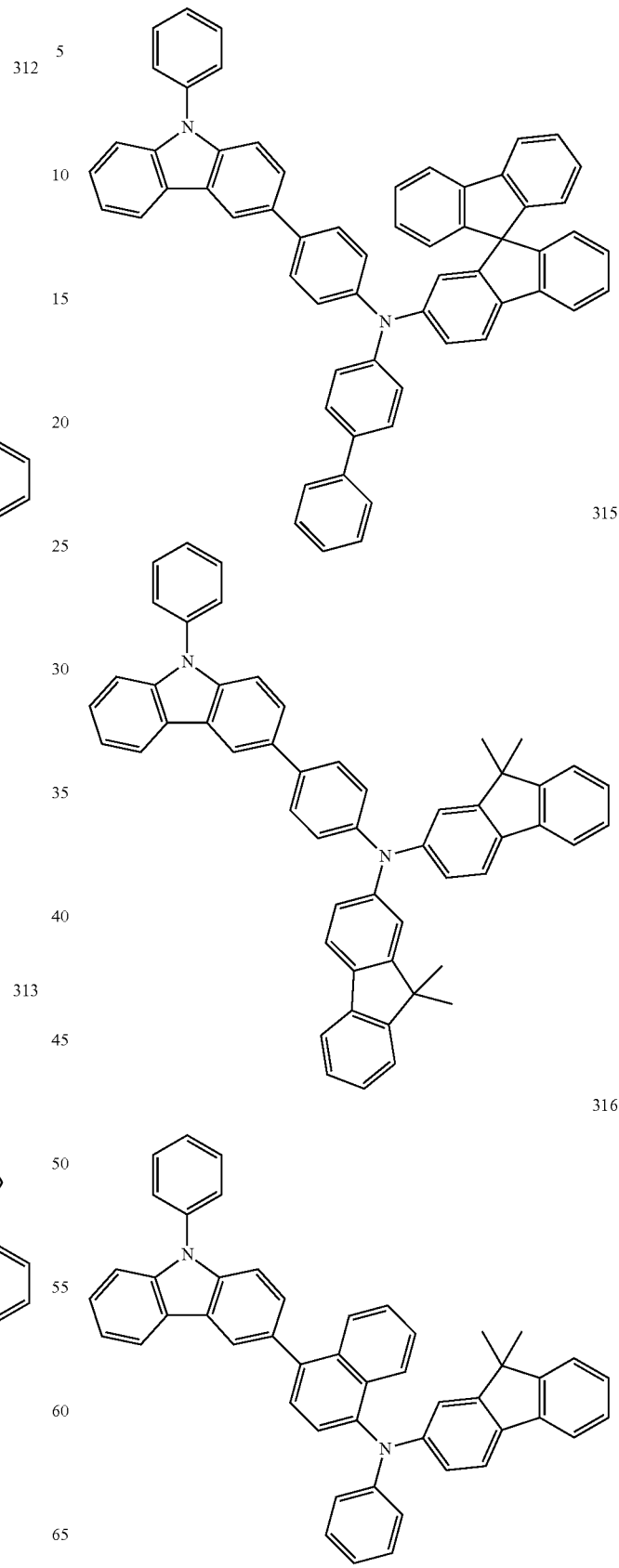

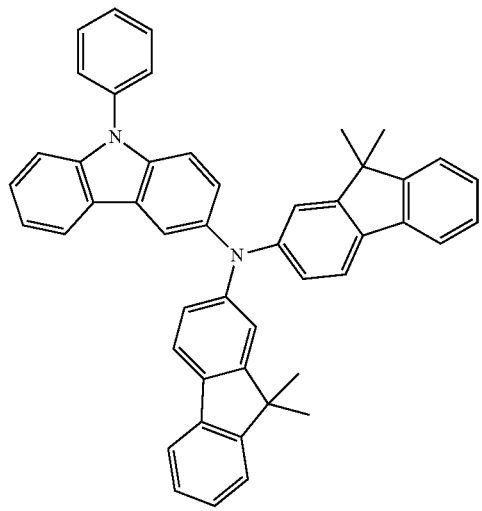
317

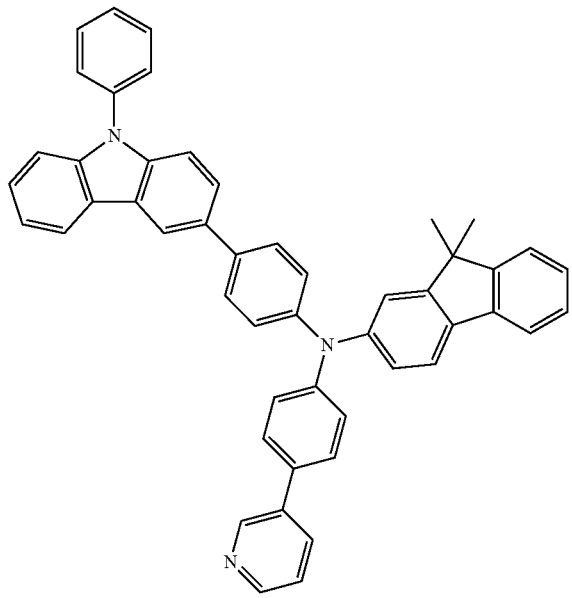
318

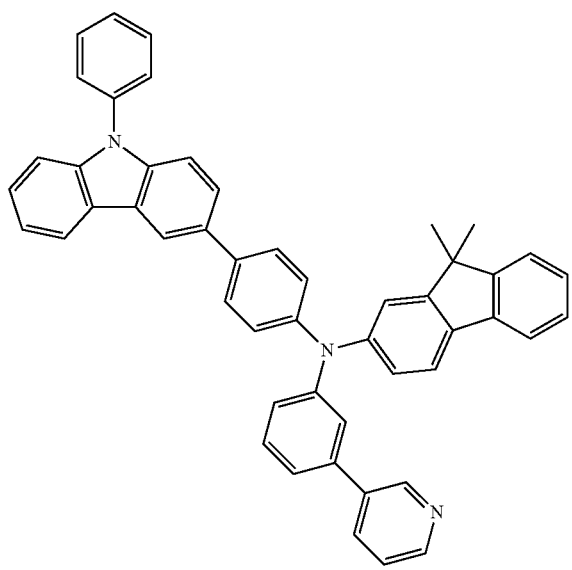
319

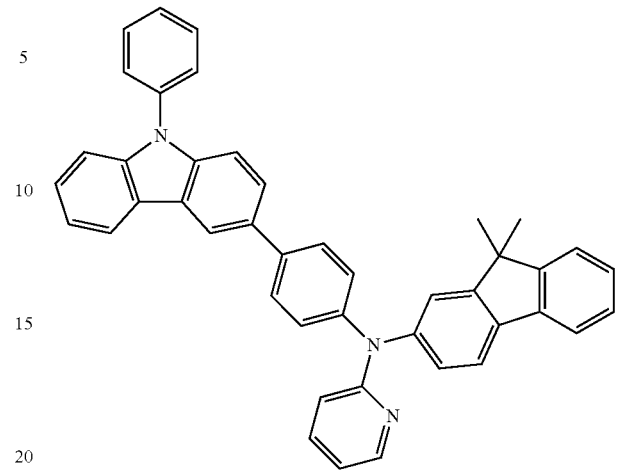
320

At least one of the HIL, HTL, and H-functional layer may further include a charge-generating material, in addition to the above-described hole-injecting material, hole-transporting material, and/or a material having both hole-injecting and hole-transporting capabilities to improve the conductivity of a film.

The charge-generating material may include, e.g., quinone derivative such as tetracyanoquinonedimethane (TCNQ) and 2,3,5,6-tetrafluoro-tetracyano-1,4-benzoquinonedimethane (F4-TCNQ); a metal oxide such as tungsten oxide and molybdenum oxide; and a cyano-group-containing compound such as Compound 200 below.

<Compound 200>

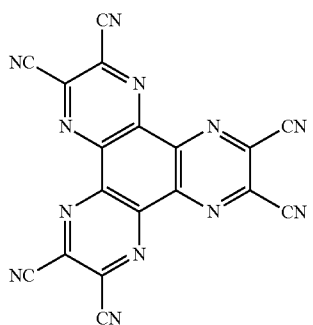

<F4-TCNQ>

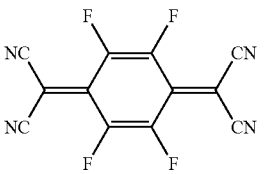

When the HTL or the H-functional layer further includes the charge-generating material, the charge-generating material may be homogeneously dispersed or heterogeneously distributed in the HTL or the H-functional layer.

The buffer layer may be between the EML 133 and at least one selected from the HIL 131, HTL 132, and H-functional layer. The buffer layer may compensate for an optical resonance distance of light according to a wavelength of the light emitted from the EML 133, and thus may increase efficiency. The buffer layer may include a suitable hole-injecting material or hole-transporting material. In an implementation, the buffer layer may include the same material as one of the materials included in the HIL 131, HTL 132, and H-functional layer that underlies the buffer layer.

Then, the EML 133 may be formed on the HTL 132, H-functional layer, or buffer layer by vacuum deposition, spin coating, casting, LB deposition, or the like. When the EML 133 is formed using vacuum deposition or spin coating, the deposition and coating conditions may be similar to those for the formation of the HIL 131, though the conditions for deposition and coating may vary according to the material that is used to form the EML 133.

The EML 133 may include a suitable light-emitting material. For example, the EML 133 may include an anthracene-based compound represented by Formula 1. In an implementation, the EML 133 may further include a suitable host and a dopant.

Examples of the suitable host may include tris(8-quinolinato)aluminum (Alq₃), 4,4'-N,N'-dicarbazole-biphenyl (CBP), poly(n-vinylcarbazole) (PVK), 9,10-di(naphthalene-2-yl)anthracene (ADN), 4,4',4"-tris(carbazole-9-yl) triphenylamine (TCTA), 1,3,5-tris(nitrogen atom-phenylbenzimidazole-2-yl)benzene (TPBI), 3-tert-butyl-9,10-di(napth-2-yl) anthracene (TBADN), 9,9'-(1,3-phenylene)bis-9H-carbazole (mCP), E3, 1,3-bis[2-(4-tert-butyphenyl)-1,3,4-oxadiazo-5-yl] (OXD-7), distyryl arylene (DSA), dmCBP (see Formula below), and Compounds 501 to 509 below.

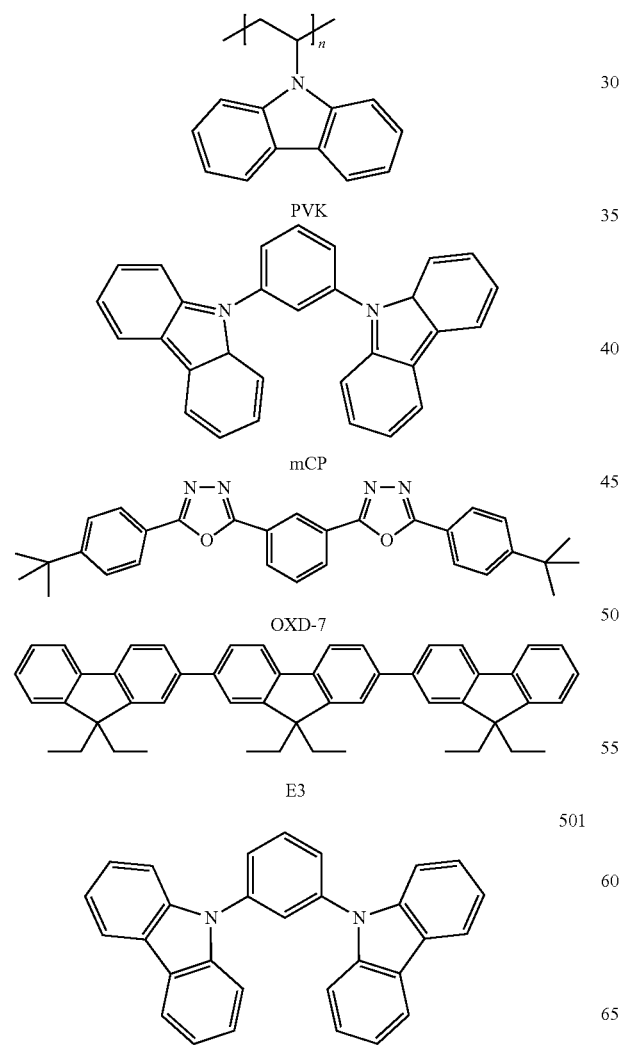
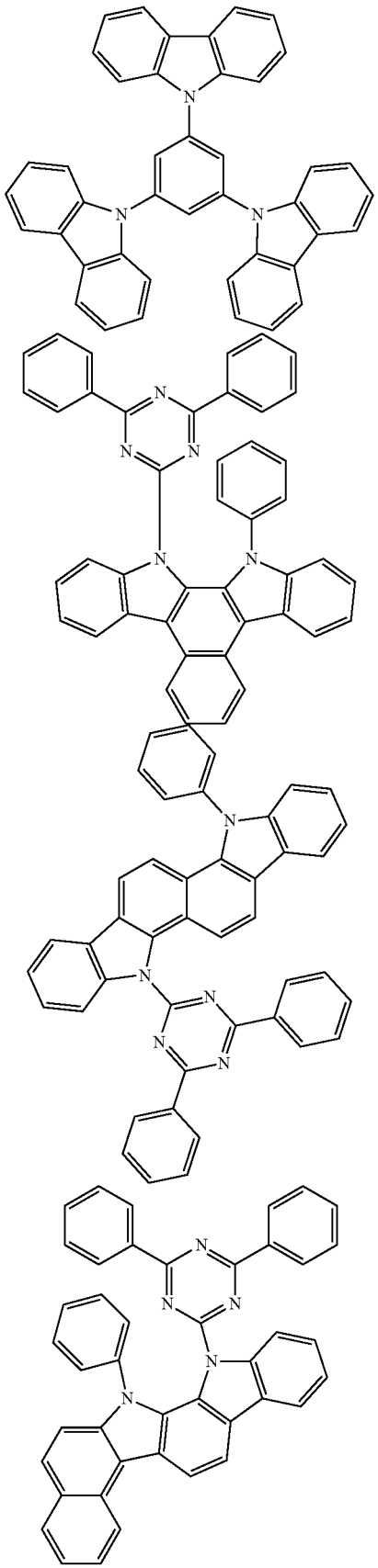

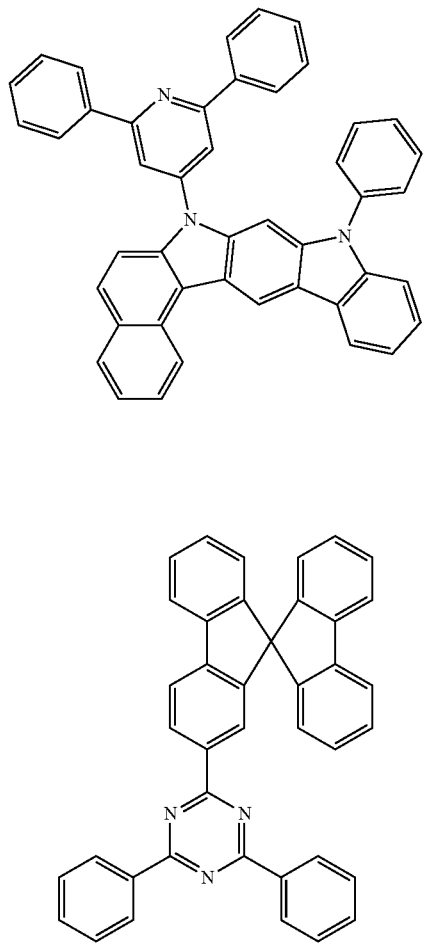

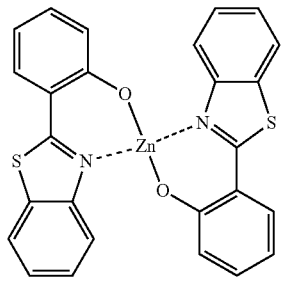

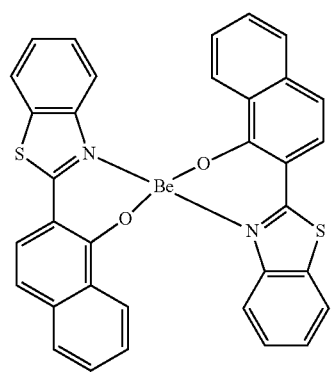

The dopant may include at least one of a fluorescent dopant and a phosphorescent dopant. The phosphorescent dopant may include an organic metal complex including iridium (Ir), platinum (Pt), osmium (Os), rhenium (Re), titanium (Ti), zirconium (Zr), and hafnium (Hf), or a combination of two or more of these.

Examples of suitable blue dopants may include F$_2$Irpic, (F$_2$ppy)$_2$Ir(tmd), Ir(dfppz)$_3$, ter-fluorene (fluorene), 4,4'-bis (4-diphenyl aminostyryl) biphenyl (DPAVBi), 2,5,8,11-tetra-tert-butyl perylene (TBPe), and 4,4'-bis(2,2-diphenyl vinyl)-1,1'-biphenyl (DPVBi).

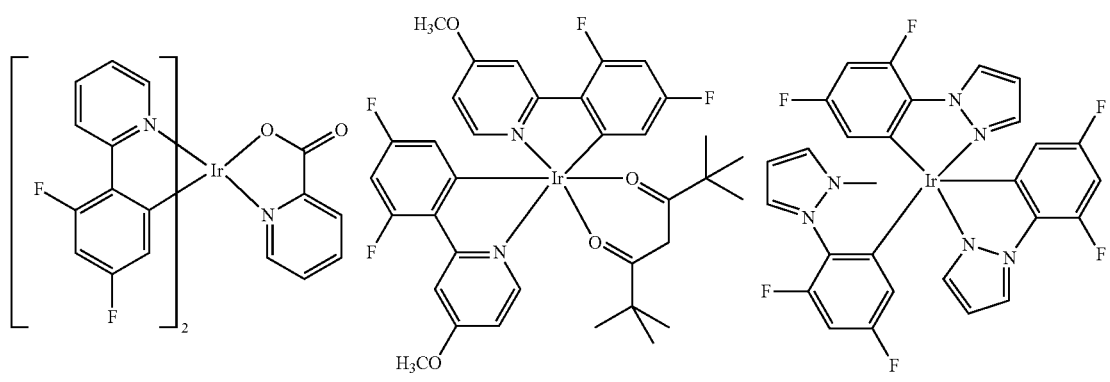

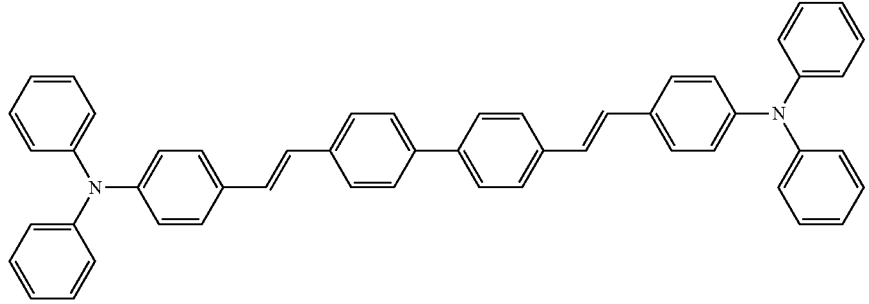
DPAVBi
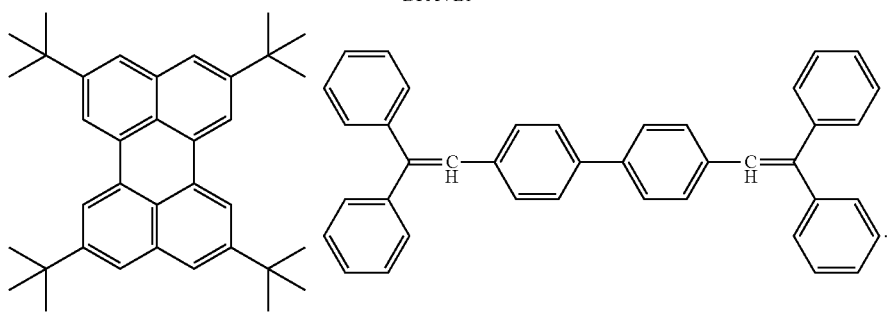
TBPe                DPVBi
As a suitable red dopant, PtOEP, Ir(piq)₃, BtpIr, or the like may be used. In some embodiments, DCM or DCJTB described below may also be used as a suitable red dopant.
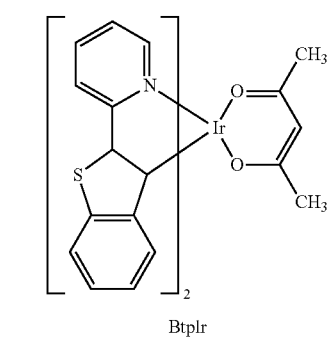
BtpIr
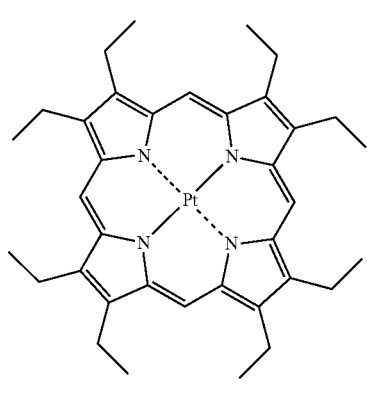
PtOEP
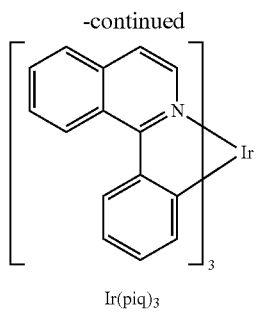
Ir(piq)₃
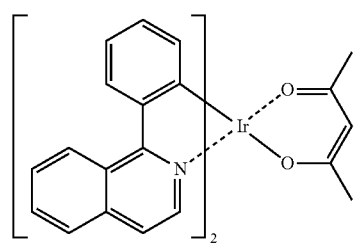
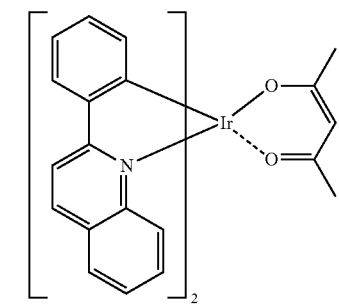
Ir(pq)₂(acac)

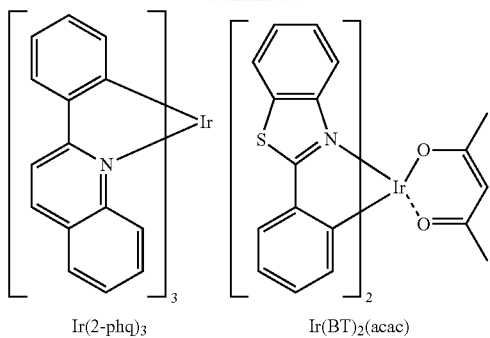

Ir(2-phq)$_3$    Ir(BT)$_2$(acac)

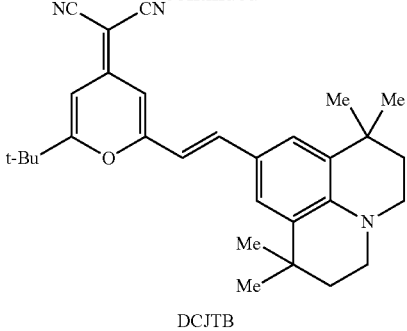

DCJTB

As a suitable green dopant, Ir(ppy)$_3$ (ppy=phenylpyridine), Ir(ppy)$_2$(acac), Ir(mpyp)$_3$, or the like may be used. In some embodiments, C545T below may also be used as the green dopant.

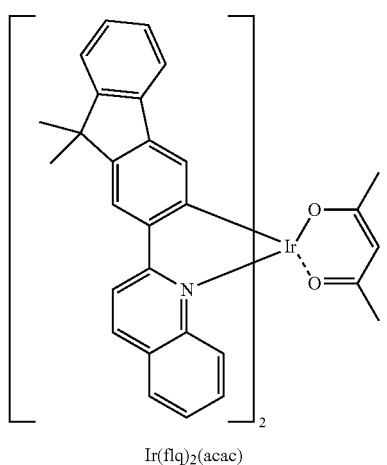

Ir(flq)$_2$(acac)

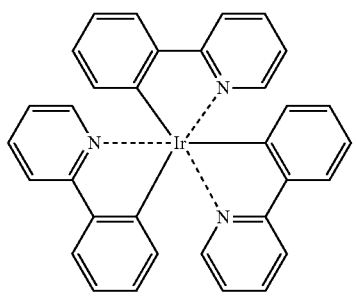

Ir(ppy)$_3$

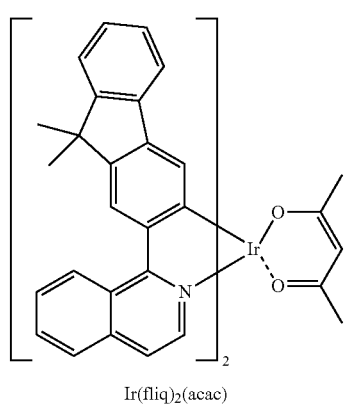

Ir(fliq)$_2$(acac)

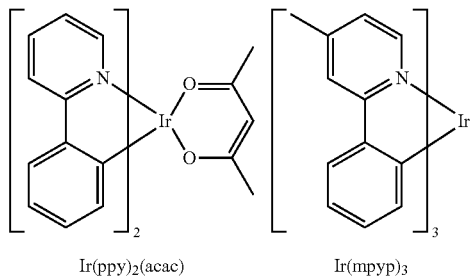

Ir(ppy)$_2$(acac)    Ir(mpyp)$_3$

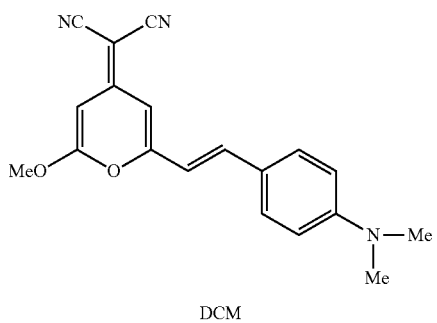

DCM

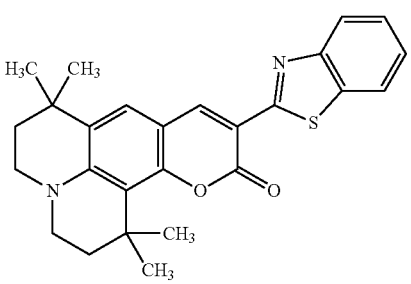

C545T

Meanwhile, a dopant that may be included in the EML 133 may include a metal complex as described or illustrated below.

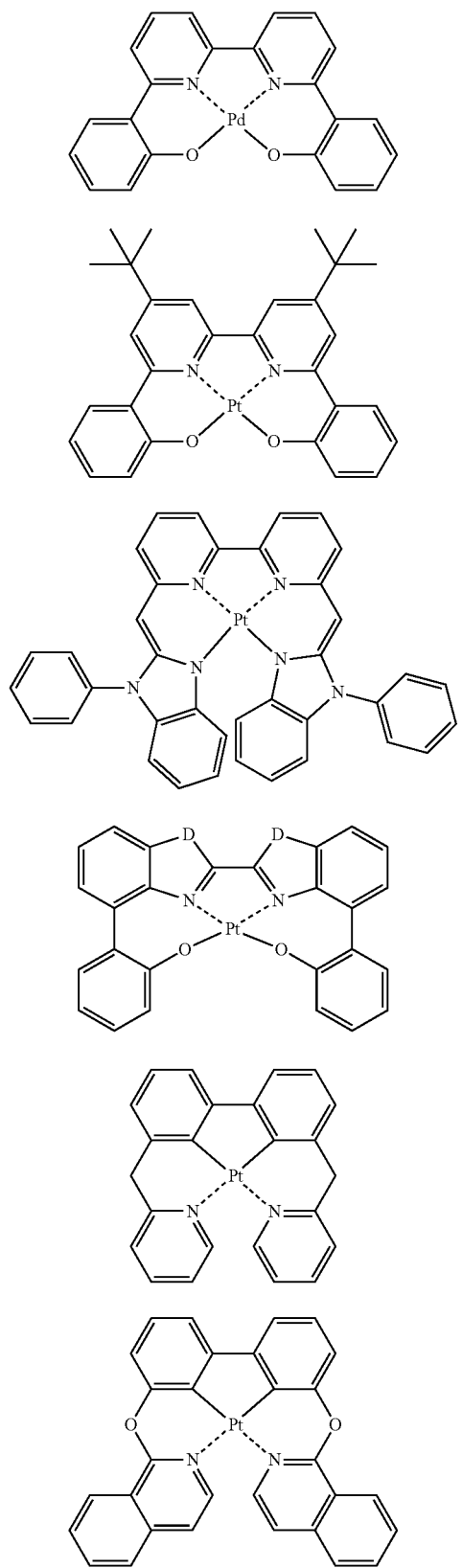
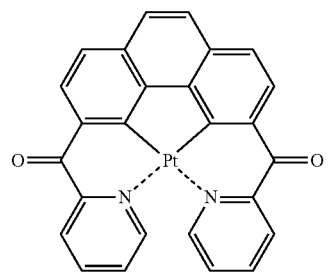
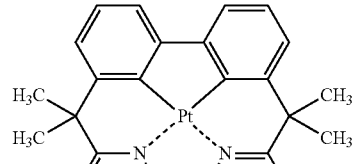
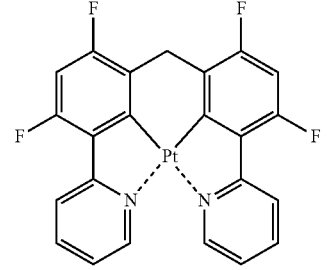
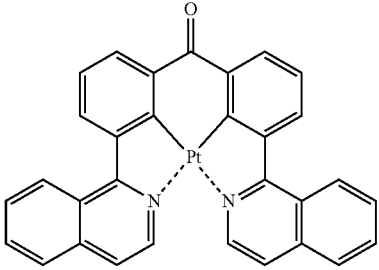
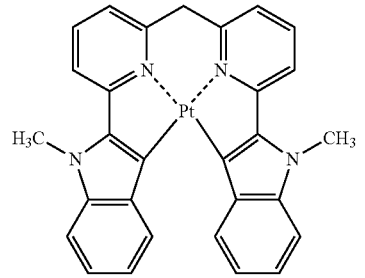
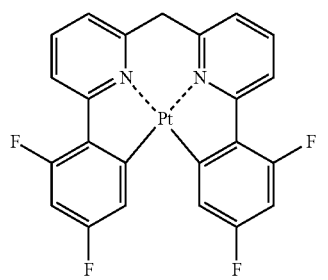

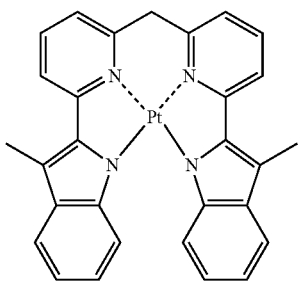
D13
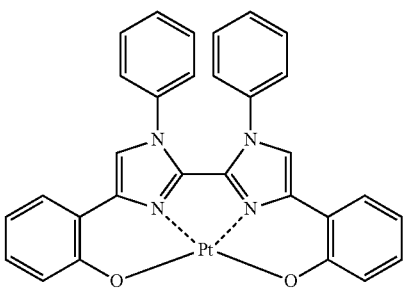
D18
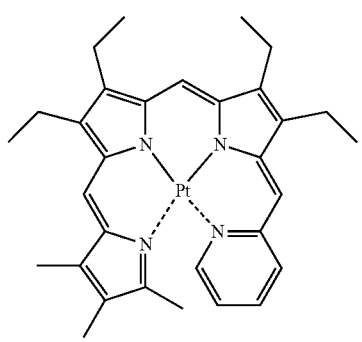
D14
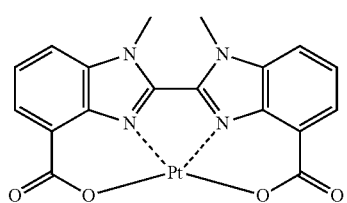
D19
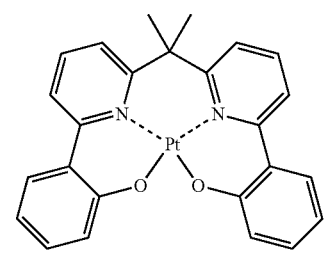
D15
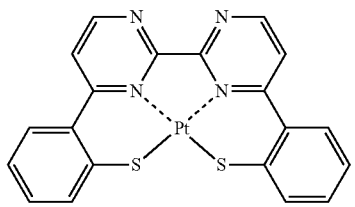
D20
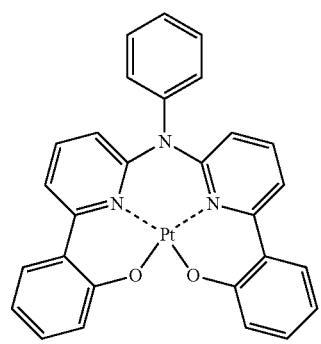
D16
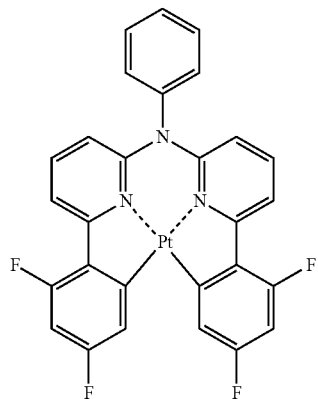
D21
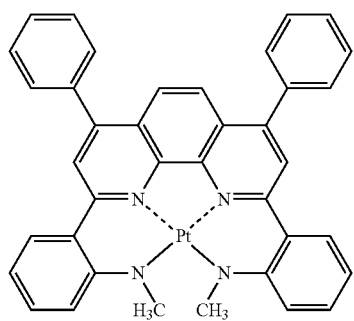
D17
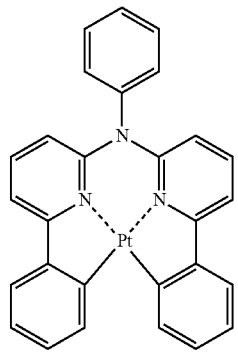
D22

-continued
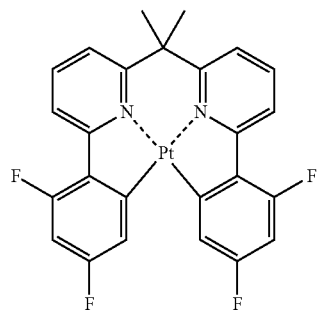
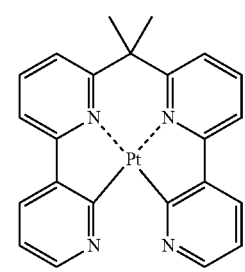
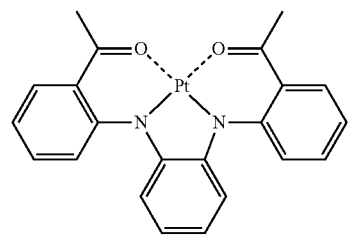
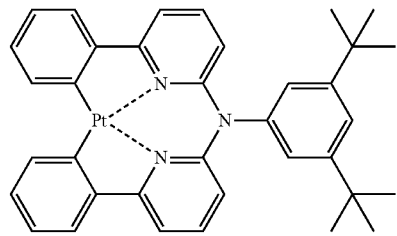
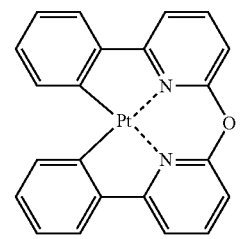
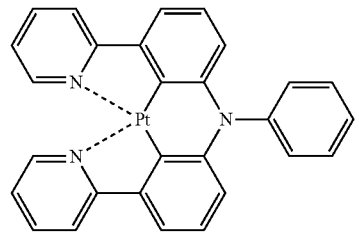
-continued
D29
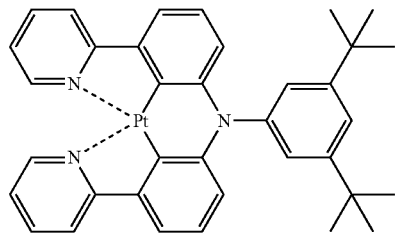
D30
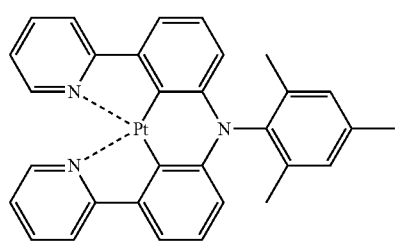
D31
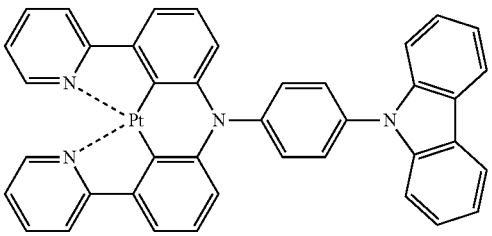
D32
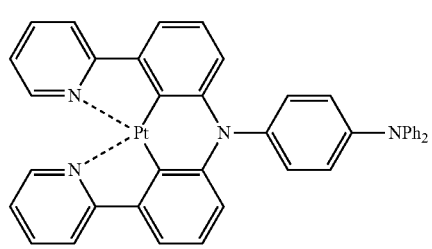
D33
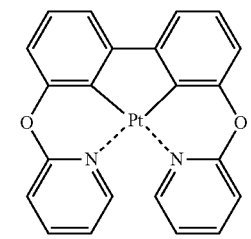
D34
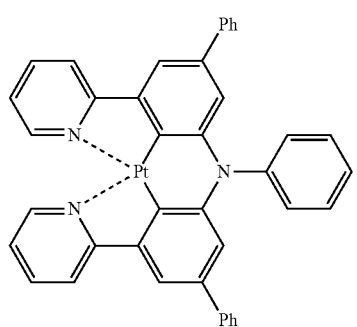

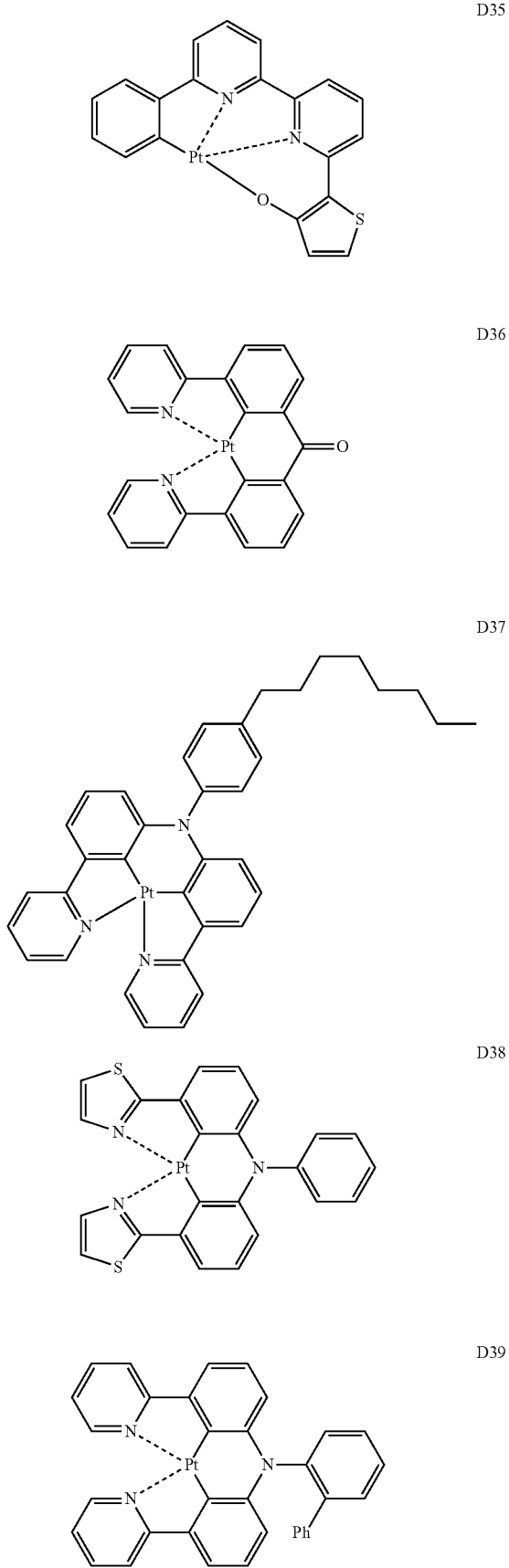

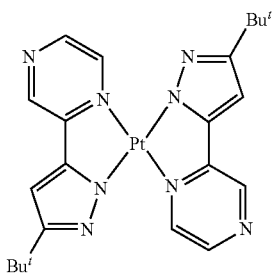
D45
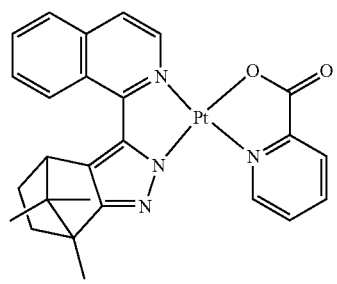
D46
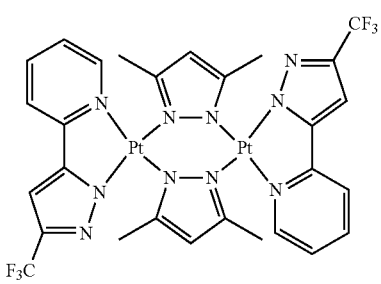
D50
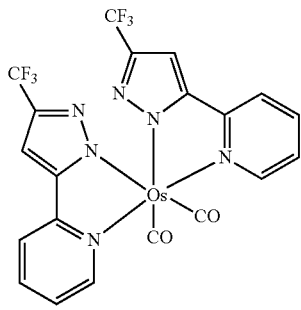
Os(fppz)₂(CO)₂
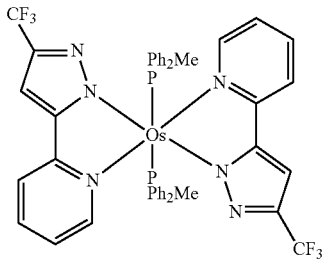
Os(fppz)₂(PPh₂Me)₂
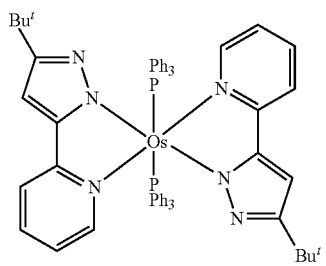
Os(bppz)₂(PPh₃)₂
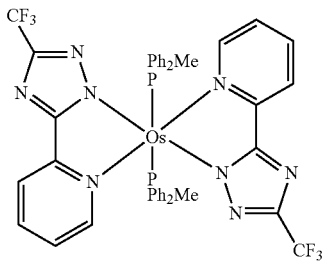
Os(fptz)₂(PPh₂Me)₂

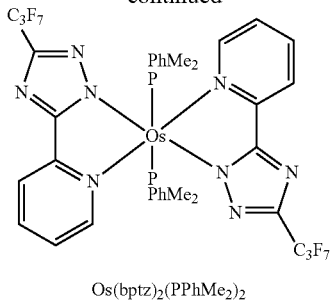

Os(bptz)₂(PPhMe₂)₂

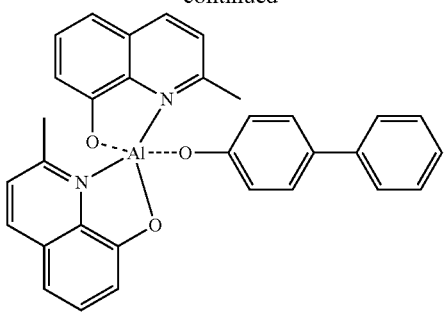

BAlq

When the EML 133 includes the host and the dopant, an amount of the dopant may be about 0.01 wt % to about 15 wt %, based on 100 wt % of the EML 133.

A thickness of the EML 133 may be about 100 Å to about 1,000 Å, e.g., about 200 Å to about 600 Å. When the thickness of the EML 133 is within these ranges, the EML 133 may have good light-emitting ability without a substantial increase in driving voltage.

Meanwhile, when the organic light-emitting device is a full color organic light-emitting device, the EML 133 may be patterned into a red EML, a green EML, and a blue EML according to a red subpixel, a green subpixel, and a blue subpixel, respectively. In an implementation, the anthracene-based compound represented by Formula 1 above may be included as a host in the green EML or the blue EML.

Meanwhile, the EML 133 may have a multilayer structure in which the red EML, the green EML, and the blue EML are layered to emit white light, or a single layer structure in which a red light emitting material, a green light emitting material, and a blue light emitting material are included together. An organic light-emitting device including the EML 133 may further include a red color filter, a green color filter, and a blue color filter to emit full color.

Then the ETL 134 may be formed on the EML 133 by using various methods such as vacuum deposition, spin coating, and casting. When the ETL 134 is formed by using the vacuum deposition or spin coating, the deposition and coating conditions for forming the ETL 134 may be similar to those for the formation of the HIL 131, though the deposition and coating conditions may vary according to the compound that is used to form the ETL 134. The electron transporting layer material may include a suitable electron transporting material that stably transports electrons injected from an electron injection electrode (cathode). Examples of the suitable electron transporting material may include quinoline derivatives, such as tris(8-quinolinolate)aluminum (Alq₃), 3-(biphenyl-4-yl)-5-(4-tert-butyl phenyl)-4-phenyl-4H-1,2,4-triazole (TAZ), bis(2-methyl-8-quinolinolato-N1,O8)-(1,1'-biphenyl) (Balq), beryllium bis(benzoquinolin-10-olate) (Bebq₂), 9,10-di(naphthalene-2-yl)anthracene (ADN), Compound 101, Compound 102, and Bphen.

<Compound 101>

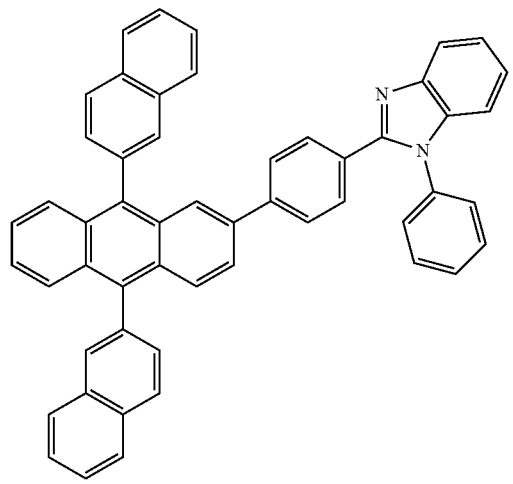

<Compound 102>

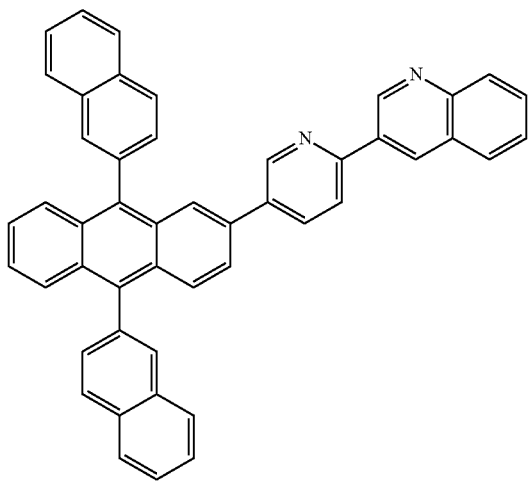

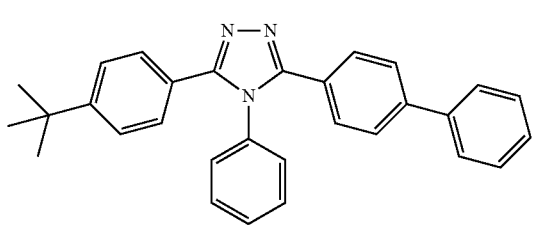

TAZ

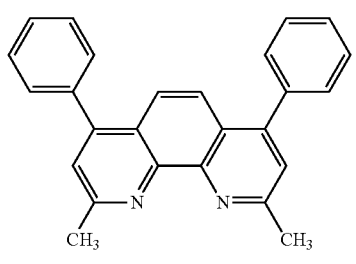

BCP

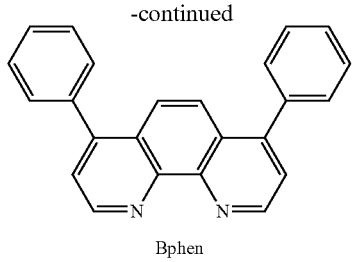

Bphen

A thickness of the ETL 134 may be about 100 Å to about 1,000 Å, e.g., about 150 Å to about 500 Å. When the thickness of the ETL 134 is within the range above, the ETL 134 may have good electron transporting ability without a substantial increase in driving voltage.

The ETL may further include a metal-containing material in addition to the electron-transporting organic compound described above. The metal-containing material may include a Li complex. Examples of the Li complex may include lithium quinolate (LiQ) and Compound 203:

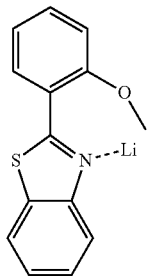

<Compound 203>

In an implementation, the EIL 135, which facilitates injection of electrons from the negative electrode may be layered on the ETL 134.

A material for forming the EIL 135 may include a suitable material for forming the EIL 134, e.g., LiF, NaCl, CsF, $Li_2O$, or BaO. The deposition and coating conditions for forming the EIL 134 may be similar to those for the formation of the HIL, though the deposition and coating conditions may vary according to the compound that is used to form the EIL 134.

A thickness of the EIL may be from about 1 Å to about 100 Å, e.g., about 3 Å to about 90 Å. When the thickness of the EIL 134 is within these ranges, the EIL 134 may have satisfactory electron injecting ability without a substantial increase in driving voltage.

A second electrode may be disposed on the organic layer 130. The second electrode may be an electron injection electrode (cathode). In this regard, a material for forming the second electrode may include a metal, an alloy, an electro-conductive compound, which have a low work function, or a combination thereof. In greater detail, lithium (Li), magnesium (Mg), aluminum (Al), aluminum (Al-lithium), calcium (Ca), magnesium-indium (Mg—In), magnesium-silver (Mg—Ag), or the like may be used as the material for forming the second electrode. In some embodiments, to manufacture a top-emission light-emitting device, a transmission-type second electrode may be formed of indium tin oxide (ITO) or indium zinc oxide (IZO).

When a phosphorescent dopant is used in the EML 133, a hole-blocking layer (HBL) may be formed between the HTL 132 and EML 133 or the H-functional layer and EML 133 by using vacuum deposition, spin coating, casting, LB deposition, or the like, in order to help reduce and/or prevent diffusion of triplet excitons or holes into the ETL 134. When the HBL is formed using vacuum deposition or spin coating, the conditions for deposition and coating may be similar to those for the formation of the HIL 131, although the conditions for deposition and coating may vary according to the material that is used to form the HBL. A suitable hole-blocking material may be used, e.g., oxadiazole derivatives, triazole derivatives, and phenanthroline derivatives. In some embodiments, BCP shown below may be used as a hole-blocking material.

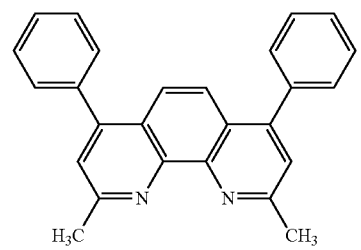

BCP

A thickness of the HBL may be about 20 Å to about 1,000 Å, e.g., about 30 Å to about 300 Å. When the thickness of the HBL is within these ranges, the HBL may have improved hole blocking ability without a substantial increase in driving voltage.

As used herein, specific examples of an unsubstituted $C_1$-$C_{60}$ alkyl group (or the $C_1$-$C_{60}$ alkyl group) may include a linear or a branched $C_1$-$C_{60}$ alkyl group such as methyl, ethyl, propyl, an iso-butyl, a sec-butyl, pentyl, iso-amyl, and hexyl, and a substituted $C_1$-$C_{60}$ alkyl group is the unsubstituted $C_1$-$C_{60}$ alkyl group, wherein one or more of a hydrogen atoms of the unsubstituted $C_1$-$C_{60}$ alkyl group are substituted with one of a deuterium, a halogen atom, a hydroxyl group, a cyano group, a nitro group, an amino group, an amidino group, hydrazine, hydrazone, a carboxylic acid group or a salt thereof, a sulfonic acid group or a salt thereof, phosphoric acid or a salt thereof, $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of deuterium, a halogen atom, a hydroxyl group, a cyano group, a nitro group, an amino group, an amidino group, hydrazine, hydrazone, a carboxylic acid group or a salt thereof, a sulfonic acid group or a salt thereof, and phosphoric acid or a salt thereof;

a $C_3$-$C_{10}$ cycloalkyl group, a $C_2$-$C_{10}$ hetercycloalkyl group, a $C_3$-$C_{10}$ cycloalkenyl group, a $C_2$-$C_{10}$ hetercycloalkenyl group, a $C_6$-$C_{60}$ aryl group, a $C_6$-$C_{60}$ aryloxy group, a $C_6$-$C_{60}$arylthio group, and a $C_2$-$C_{60}$ heteroaryl group;

a $C_3$-$C_{10}$ cycloalkyl group, a $C_2$-$C_{10}$ hetercycloalkyl group, a $C_3$-$C_{10}$ cycloalkenyl group, a $C_2$-$C_{10}$ hetercycloalkenyl group, a $C_6$-$C_{60}$ aryl group, a $C_6$-$C_{60}$ aryloxy group, a $C_6$-$C_{60}$arylthio group, and a $C_2$-$C_{60}$ heteroaryl group, each substituted with at least one of deuterium, a halogen atom, a hydroxyl group, a cyano group, a nitro group, an amino group, an amidino group, hydrazine group, a hydrazone group, a carboxylic acid group or a salt thereof, a sulfonic acid group or a salt thereof, phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, anthryl group, a fluorenyl group, a dimethyl fluorenyl group, a diphenyl fluorenyl group, a carbazolyl group, a phenyl carbazolyl group, a pyridinyl group, a pyrimidyl group, a pyrazinyl group, a pyridazinyl group, a triazinyl group, a quinolyl group, and an isoquinolyl group ; and —N($Q_{11}$)($Q_{12}$); and —Si($Q_{13}$)($Q_{14}$)($Q_{15}$), in which $Q_{11}$ and $Q_{12}$ are each independently a $C_6$-$C_{60}$ aryl group or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group.

As used herein, an unsubstituted $C_1$-$C_{60}$ alkoxy group (or the $C_1$-$C_{60}$ alkoxy group) has a formula of —OA (wherein, A is the unsubstituted $C_1$-$C_{60}$ alkyl group as described above), and specific examples of the unsubstituted $C_1$-$C_{60}$ alkoxy group include methoxy, ethoxy, and iso-propyloxy, and at least one a hydrogen atom of the alkoxy groups may be substituted with the substituents described above in conjunction with the substituted $C_1$-$C_{60}$ alkyl group.

As used herein, an unsubstituted $C_2$-$C_{60}$ alkenyl group (or a $C_2$-$C_{60}$ alkenyl group) is a hydr°Carbon chain having a carbon-carbon double bond in the center or at a terminal of an unsubstituted $C_2$-$C_{60}$ alkyl group. Examples of the unsubstituted $C_2$-$C_{60}$ alkenyl group are an ethenyl group, a propenyl group, and a butenyl group. At least one hydrogen atom in the unsubstituted $C_2$-$C_{60}$ alkenyl group may be substituted with those substituents described above in conjunction with the substituted $C_1$-$C_{60}$ alkyl group.

As used herein, an unsubstituted $C_2$-$C_{60}$ alkynyl group (or a $C_2$-$C_{60}$ alkynyl group) is a $C_2$-$C_{60}$ alkyl group having at least one carbon-carbon triple bond in the center or at a terminal thereof. Examples of the unsubstituted $C_2$-$C_{60}$ alkynyl group are an ethynyl group, a propynyl group, and the like. At least one hydrogen atom in the unsubstituted $C_2$-$C_{60}$ alkynyl group may be substituted with those substituents described above in conjunction with the substituted $C_1$-$C_{60}$ alkyl group.

As used herein, an unsubstituted $C_3$-$C_{30}$ cycloalkyl group is a monovalent group having a saturated carb°Cyclic aromatic system having 3 to 30 carbon atoms. Examples of the unsubstituted $C_3$-$C_{30}$ cycloalkyl group include cyclopropyl, cyclobutyl, cyclopentyl, cyclohexyl, cycloctyl, and the like. At least one hydrogen atom in the unsubstituted $C_3$-$C_{30}$ cycloalkyl group may be substituted with those substituents described above in conjunction with the substituted $C_1$-$C_{60}$ alkyl group.

As used herein, an unsubstituted $C_3$-$C_{30}$ cycloalkenyl group is an unsaturated hydr°Carbon ring group that is not an aromatic ring, having at least one carbon-carbon double bond. Examples of the unsubstituted $C_3$-$C_{30}$ cycloalkenyl group include cyclopropenyl, cyclobutenyl, cyclopentenyl, cyclohexenyl, cycloheptenyl, a 1,3-cyclohexadienyl group, a 1,4-cyclohexadienyl group, a 2,4-cycloheptadienyl group, a 1,5-cycloctadienyl group, and the like. At least one hydrogen atom of the cycloalkenyl group may be substituted with those substituents described above in conjunction with the substituted $C_1$-$C_{60}$ alkyl group.

As used herein, an unsubstituted $C_6$-$C_{60}$ aryl group may be a monovalent group having a carbocyclic aromatic system having 6 to 60 carbon atoms including at least one aromatic ring, and an unsubstituted $C_6$-$C_{60}$ arylene group is a divalent group having a carbocyclic aromatic system having 6 to 60 carbon atoms including at least one aromatic ring. When the unsubstituted $C_6$-$C_{60}$ aryl group and the unsubstituted $C_6$-$C_{60}$ arylene group include at least two rings, two or more rings may be fused to each other. At least one hydrogen atom of the unsubstituted $C_6$-$C_{60}$ aryl group and the unsubstituted $C_6$-$C_{60}$ arylene group may be substituted with those substituents described above in conjunction with the substituted $C_1$-$C_{60}$ alkyl group.

Examples of a substituted or unsubstituted $C_6$-$C_{60}$ aryl group may include a phenyl group, a $C_1$-$C_{10}$ alkyl phenyl group (for example, an ethyl phenyl group), a $C_1$-$C_{10}$ alkyl biphenyl group (for example, an ethyl biphenyl group), a halophenyl group (for example, an o-, m- and p-fluorophenyl group, and a dichlorophenyl group), a dicyanophenyl group, a trifluoromethoxy phenyl group, an o-, m-, and p-tolyl group, an o-, m- and p-cumenyl group, a mesityl group, a phenoxy phenyl group, an (α,α-dimethyl benzene) phenyl group, an (N,N'-dimethyl)aminophenyl group, an (N,N'-diphenyl)aminophenyl group, a pentalenyl group, an indenyl group, a naphthyl group, a halonaphthyl group (for example, a fluoronaphthyl group), a $C_1$-$C_{10}$ alkyl naphthyl group (for example, a methyl naphthyl group), a $C_1$-$C_{10}$ alkoxy naphthyl group (for example, a methoxy naphthyl group), an anthracenyl group, an azulenyl group, a heptalenyl group, an acenaphthylenyl group, a phenalenyl group, a fluorenyl group, an anthraquinolyl group, a methyl anthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, an ovalenyl group, and the like, and examples of the substituted $C_6$-$C_{60}$ aryl group may be inferred based on the examples of the unsubstituted $C_6$-$C_{60}$ aryl group and those substituents described above in conjunction with the substituted $C_1$-$C_{60}$ alkyl group. The substituted or unsubstituted $C_6$-$C_{60}$ arylene group may be inferred based on the examples of the substituted or unsubstituted $C_6$-$C_{60}$ aryl group.

As used herein, an unsubstituted $C_2$-$C_{60}$ heteroaryl group is a monovalent group having a system formed of at least one aromatic ring that includes at least one heteroatom selected from N, O, P, and S as ring-forming atoms and carbon atoms as other ring atoms, and an unsubstituted $C_2$-$C_{60}$ heteroarylene group is a divalent group having a system formed of at least one aromatic ring that includes at least one heteroatom selected from N, O, P, and S as ring-forming atoms and carbon atoms as other ring atoms. Here, when the unsubstituted $C_2$-$C_{60}$ heteroaryl group and the unsubstituted $C_2$-$C_{60}$ heteroarylene group include two or more rings, the two or more rings may be fused to each other. At least one hydrogen atom of the unsubstituted $C_2$-$C_{60}$ heteroaryl group and the unsubstituted $C_2$-$C_{60}$ heteroarylene group may be substituted with those substituents described above in conjunction with the substituted $C_1$-$C_{60}$ alkyl group.

Examples of the unsubstituted $C_2$-$C_{60}$ heteroaryl group include, a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, an imidazopyrimidinyl group, and the like. Examples of the unsubstituted $C_2$-$C_{60}$ heteroarylene group may be inferred based on the examples of a substituted or unsubstituted $C_2$-$C_{60}$ arylene group.

A substituted or unsubstituted $C_6$-$C_{60}$ aryloxy group represents —$OA_2$ (where, $A_2$ is a substituted or unsubstituted $C_6$-$C_{60}$ aryl group), and a substituted or unsubstituted $C_6$-$C_{60}$ arylthio group represents —$SA_3$ (where, $A_3$ is a substituted or unsubstituted $C_6$-$C_{60}$ aryl group).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLE

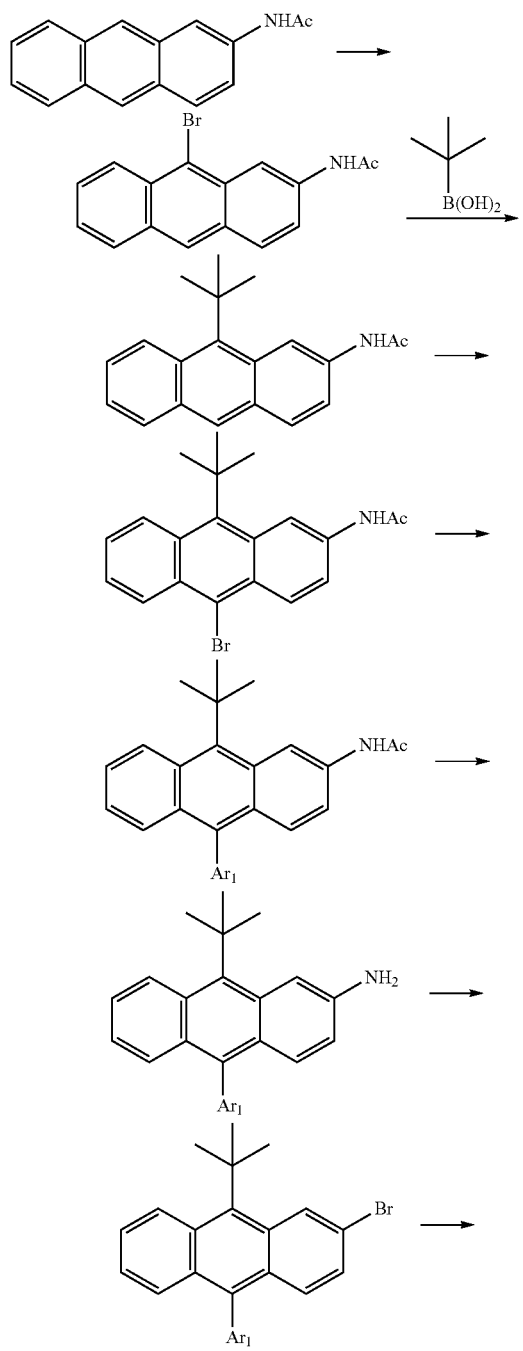

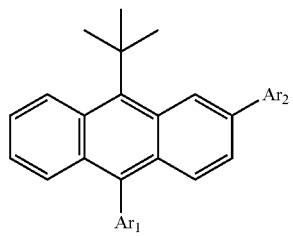

The $9^{th}$ carbon of an anthracene ring was selectively brominated by using acetamino anthracene. Then, a tert-butyl group was introduced by using alkyl boronic acid through a Suzuki reaction. Then, the $10^{th}$ carbon of the anthracene ring was brominated, and then an aryl group ($Ar_1$) was introduced thereto by using an aryl boronic acid or an aryl boronic acid ester. Then, the acetamino group on the $2^{nd}$ carbon atom of the anthracene ring was converted to amine, and the amine was converted to bromine by using a Sandmeyer reaction. Then, an anthracene-based compound represented by Formula 1 was synthesized by using an aryl boronic acid or an aryl boronic acid ester, and through a Suzuki reaction. Hereinafter, the Synthesis Example of the anthracene-based compound represented by Formula 1 will be described in more detail.

Synthesis of Intermediate A

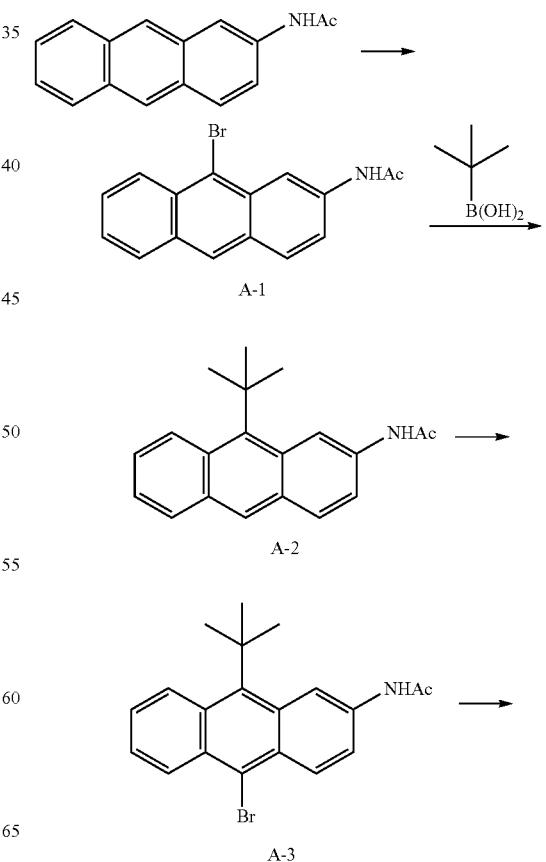

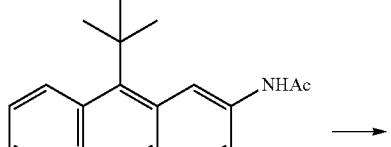

A-4

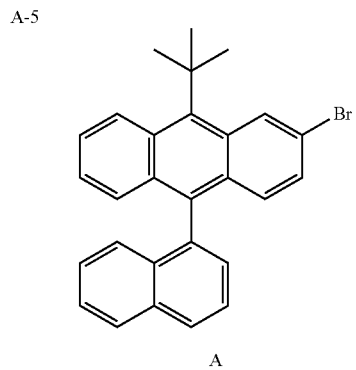

A-5

Synthesis of Intermediate A-1

9.4 g (40.0 mmol) of 2-acetaminoanthracene was dissolved in 100 mL of dichloromethane, and 7.1 g (40.0 mmol) of N-bromosuccinimide was slowly dropwise added thereto at a temperature of 0° C. over 30 minutes. After the addition was completed, the resultant reaction mixture was stirred at room temperature for 3 hours. 100 mL of 10% aqueous solution of $Na_2S_2O_3$ was added to the reaction mixture and the reaction mixture was extracted 3 times by using 50 mL of dichloromethane to collect an organic layer. The collected organic layer was dried with magnesium sulfate and a solvent was evaporated therefrom to obtain residues, and then the residues were separated and purified by using silica gel column chromatography to obtain 9.42 g of Intermediate A-1 (yield 75%), and the compound produced was confirmed through liquid chromatography-mass spectrometry (LCMS).

LCMS($C_{16}H_{12}BrNO$): calculated 313.0; observed 313.0

Synthesis of Intermediate A-2

9.42 g (30.0 mmol) of Intermediate A-1, 3.67 g (36.0 mmol) tert-butyl boronic acid, 1.01 g (4.5 mmol) of Pd(OAc)$_2$, 2.1 g (7.5 mmol) P(Cy)$_3$, and 22.2 g (105.0 mmol) of $K_3PO_4$ were dissolved in 100 mL of a mixed solvent of toluene/distilled water (14/1 v/v) under nitrogen atmosphere and then stirred at a temperature of 100° C. for 5 hours. 100 mL of distilled water was added to the reaction mixture, and the reaction mixture was extracted three times with 60 mL of diethyl ether to collect an organic layer. The collected organic layer was dried with magnesium sulfate and a solvent was evaporated therefrom to obtain a residue, and the residue was separated and purified by using a silica gel column chromatography to obtain 5.94 g of Intermediate A-2 (yield 68%). The compound produced was confirmed through LCMS.

LCMS($C_{20}H_{21}NO$): calculated 291.2; observed 291.2

Synthesis of Intermediate A-3

5.8 g (20.0 mmol) of Intermediate A-2 was dissolved in 60 mL of dichloromethane, 3.56 g (20.0 mmol) of N-bromosuccinimide was slowly dropwise added thereto at a temperature of 0° C., and then stirred for 3 hours at room temperature to prepare a reaction mixture. 50 mL of distilled water was added to the reaction mixture and then the reaction mixture was extracted 3 times with 50 mL of dichloromethane to collect an organic layer. The collected organic layer was dried with magnesium sulfate and a solvent was evaporated therefrom to obtain a residue, which was then separated and purified by using a silica gel column chromatography to obtain 5.78 g of Intermediate A-3 (yield 78%). The compound produced was confirmed through LCMS.

LCMS($C_{20}H_{20}BrNO$): calculated 369.1; observed 369.1

Synthesis of Intermediate A-4

5.55 g (15.0 mmol) of Intermediate A-3, 0.87 g (0.75 mmol) of Pd(PPh$_3$)$_4$, 6.22 g (45.0 mmol) of $K_2CO_3$, and 3.1 g (18.0 mmol) of 1-naphthalene boronic acid were dissolved in 50 mL of a mixed solvent of THF/H$_2$O (2/1), and then stirred at a temperature of 70° C. for 5 hours to prepare a reaction solution. After the reaction was completed, the reaction solution was cooled to room temperature, and the reaction solution was extracted 3 times with 50 mL of water and 50 mL of diethyl ether to collect an organic layer. The collected organic layer was dried with magnesium sulfate and a solvent was evaporated therefrom to obtain a residue, which was then separated and purified by using a silica gel column chromatography to obtain 5.07 g of Intermediate A-4 (yield 81%), and the compound produced was confirmed through LCMS.

LCMS($C_{30}H_{27}NO$): calculated 417.2; observed 417.2

Synthesis of Intermediate A-5

4.17 g (10.0 mmol) of Intermediate A-4 was dissolved in 30 mL of methanol and 0.58 mL (8.0 mmol) of SOCl$_2$ was added thereto at room temperature to prepare a reaction mixture. The reaction mixture was heated under reflux for 3 hours. After the reaction was completed, the reaction solution was cooled to room temperature, and then a solvent was evaporated therefrom to remove the solvent and obtain a residue, and then the residue was separated and purified through a silica gel column chromatography to obtain 3.45 g of Intermediate A-5 (yield 92%). The compound produced was confirmed through LCMS.

LCMS($C_{28}H_{25}N$): calculated 375.2; observed 375.2

Synthesis of Intermediate A 3.37 g (9.0 mmol) of Intermediate A-5 was dissolved in 70 mL of acetic acid, and a solution, in which 1.24 g (18.0 mmol) of $NaNO_2$ was dissolved in 7 mL of concentrated sulfuric acid, was slowly dropwise added thereto at a temperature of 0° C. to prepare a reaction mixture. The reaction mixture was stirred at room temperature for about 20 minutes, and then a solution in which 2.6 g (18.0 mmol) of CuBr was dissolved in 40 mL of 47 wt % HBr aqueous solution was slowly added thereto, followed by stirring at a temperature of 80° C. for 4 hours to prepare a reaction product. The reaction product was cooled to a temperature of 50° C., and then additionally stirred for 5 hours, followed by cooling the reaction mixture to a temperature of 0° C. The reaction product was diluted with 100 mL of ethyl acetate, neutralized by using $NaHCO_3$ aqueous solution, and then extracted three times with ethyl acetate to collect an organic layer. The collected organic layer was dried with magnesium sulfate and a solvent was evaporated therefrom to obtain a residue, which was then separated and purified by using silica gel column chromatography to obtain 3.44 g of Intermediate A (yield 87%). The compound produced was confirmed through LCMS and $^1$H NMR.

LCMS($C_{28}H_{23}Br$): calculated 438.1; observed 438.1

$^1$H NMR (400 MHz, $CDCl_3$) □ 8.31 (d, 1H), 8.27 (s, 1H), 8.19 (d, 1H), 7.83 (d, 1H), 7.74-7.67 (m, 3H), 7.57-7.52 (m, 1H), 7.46-7.44 (m, 1H), 7.36-7.32 (m, 2H), 7.27 (d, 1H), 7.06 (dt, 1H), 6.98 (dt, 1H), 1.57 (s, 9H)

Synthesis Example 1: Synthesis of Compound 3

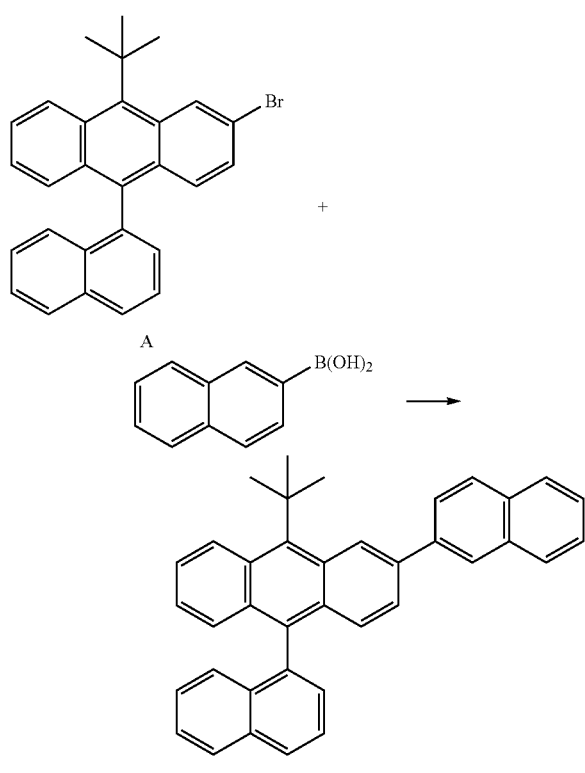

4.39 g (10.0 mmol) of Intermediate A, 0.57 g (0.5 mmol) of $Pd(PPh_3)_4$, 4.15 g (30.0 mmol) of $K_2CO_3$, and 1.89 g (11.0 mmol) of 2-naphthalene boronic acid were dissolved in 30 mL of mixed solvent of $THF/H_2O$ (2/1), and then stirred at a temperature of 70° C. for 5 hours to prepare a reaction solution. After the reaction solution was cooled to room temperature, the reaction solution was extracted three times with 30 mL of water and 40 mL of diethyl ether 40 mL to collect an organic layer. The collected organic layer was dried with magnesium sulfate and a solvent was evaporated therefrom to obtain a residue, which was then separated and purified by using silica gel column chromatography to obtain 4.08 g of Compound 3 (yield 84%). The produced compound was confirmed through LCMS and $^1$H NMR.

LCMS($C_{38}H_{30}$): calculated 486.2; observed 486.2

$^1$H NMR (400 MHz, $CDCl_3$) □8.31 (d, 1H), 8.25 (s, 1H), 8.18-8.14 (m, 2H), 7.98-7.95 (m, 2H), 7.90 (d, 1H), 7.84-7.78 (m, 3H), 7.74-7.64 (m, 4H), 7.61-7.44 (m, 4H), 7.36-7.34 (m, 1H), 7.08 (dt, 1H), 6.98 (dt, 1H), 1.59 (s, 9H)

Synthesis Example 2: Synthesis of Compound 5

4.45 g of Compound 5 (yield 82%) was obtained by using the same method as in the synthesis of Compound 3, except that 9-phenanthrene boronic acid was used instead of 2-naphthalene boronic acid. The produced compound was confirmed through LCMS and $^1$H NMR.

LCMS($C_{42}H_{32}$): calculated 536.3; observed 536.3

$^1$H NMR (400 MHz, $CDCl_3$) □ 8.65 (d, 1H), 8.42 (d, 1H), 8.32 (s, 1H), 8.26 (d, 1H), 8.19 (d, 1H), 7.98 (d, 1H), 7.86-7.77 (m, 4H), 7.74-7.59 (m, 6H), 7.57-7.44 (m, 3H), 7.36-7.32 (m, 1H), 7.13-7.05 (m, 2H), 6.98 (dt, 1H), 1.59 (s, 9H)

Synthesis Example 3: Synthesis of Compound 13

4.57 g of Compound 13 (yield 78%) was obtained by using the same method as in the synthesis of Compound 3, except that 2-triphenylene boronic acid was used instead of 2-naphthalene boronic acid. The produced compound was confirmed through LCMS and $^1$H NMR.

LCMS($C_{46}H_{34}$): calculated 586.3; observed 586.3

$^1$H NMR (400 MHz, $CDCl_3$) □ 8.73-8.68 (m, 4H), 8.59-8.55 (m, 1H), 8.37-8.30 (m, 3H), 8.22 (d, 1H), 7.99 (d, 1H), 7.84-7.62 (m, 10H), 7.55 (dt, 1H), 7.46 (m, 1H), 7.34 (dt (1H), 7.06 (m, 1H), 6.97 (m, 1H), 1.59 (s, 9H)

Synthesis Example 4: Synthesis of Compound 14

4.36 g of Compound 14 (yield 85%) was obtained by using the same method as in the synthesis of Compound 3, except that 2-triphenylene boronic acid was used instead of 2-naphthalene boronic acid. The produced compound was confirmed through LCMS and $^1$H NMR.

LCMS($C_{40}H_{32}$): calculated 512.7; observed 512.7

$^1$H NMR (400 MHz, $CDCl_3$) □ 8.32-8.29 (m, 2H), 8.19 (d, 1H), 7.98 (d, 1H), 7.83 (d, 1H), 7.74-7.68 (m, 6H), 7.65-7.49 (m, 7H), 7.46 (d, 1H), 7.42-7.32 (m, 2H), 7.06 (dt, 1H), 6.99 (dt, 1H), 1.59 (s, 9H)

Synthesis Example 5: Synthesis of Compound 16

4.55 g of Compound 16 (yield 81%) was obtained by using the same method as in the synthesis of Compound 3, except that 4-naphthalene-1-phenyl boronic acid was used instead of 2-naphthalene boronic acid. The produced compound was confirmed through LCMS and $^1$H NMR.

LCMS(C₄₄H₃₄): calculated 562.3; observed 562.3,

¹H NMR (400 MHz, CDCl₃) ☐ 8.31-8.27 (m, 2H), 8.17 (d, 1H), 7.99 (d, 1H), 7.84-7.80 (m, 3H), 7.72-7.60 (m, 9H), 7.57-7.44 (m, 3H), 7.38-7.32 (m, 2H), 7.25-7.20 (m, 1H), 7.08 (dt, 1H), 7.01-6.94 (m, 2H), 1.59 (s, 9H)

Synthesis Example 6: Synthesis of Compound 22

4.96 g of Compound 22 (yield 72%) was obtained by using the same method as in the synthesis of Compound 3, except that Intermediate I-1 below was used instead of 2-naphthalene boronic acid. The produced compound was confirmed through LCMS and ¹H NMR.

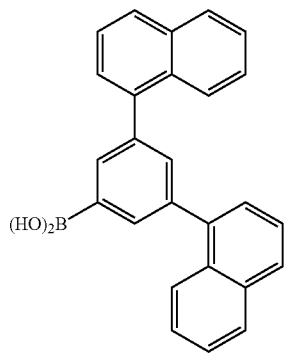

I-1

LCMS(C₅₄H₄₀): calculated 688.3; observed 688.3,

¹H NMR (400 MHz, CDCl₃) ☐ 8.40 (s, 1H), 8.30 (d, 1H), 8.21 (d, 1H), 8.01 (d, 1H), 7.98 (s, 1H), 7.93-7.90 (m, 4H), 7.84-7.68 (m, 9H), 7.57-7.51 (m, 3H), 7.44 (d, 1H), 7.40-7.32 (m, 3H), 7.23 (dt, 2H), 7.14 (dt, 2H), 7.07 (dt, 1H), 6.99-6.95 (m, 1H), 1.60 (s, 9H)

Synthesis Example 7: Synthesis of Compound 23

4.27 g of Compound 23 (yield 76%) was obtained by using the same method as in the synthesis of Compound 3, except that 4-phenyl naphthalene-1-boronic acid was used instead of 2-naphthalene boronic acid. The produced compound was confirmed through LCMS and ¹H NMR.

LCMS(C₄₄H₃₄): calculated 562.7; observed 562.7,

¹H NMR (400 MHz, CDCl₃) ☐ 8.44 (s, 1H), 8.29 (d, 1H), 8.20 (d, 1H), 8.10 (d, 1H), 8.04-8.01 (m, 2H), 7.84-7.81 (m, 2H), 7.74-7.68 (m, 6H), 7.57-7.52 (m, 2H), 7.49-7.42 (m, 3H), 7.39-7.30 (m, 2H), 7.06 (dt, 1H), 7.00-6.94 (m, 3H), 1.59 (s, 9H)

Synthesis Example 8: Synthesis of Compound 30

5.46 g of Compound 30 (yield 74%) was obtained by using the same method as in the synthesis of Compound 3, except that Intermediate I-2 below was used instead of 2-naphthalene boronic acid. The produced compound was confirmed through LCMS and ¹H NMR.

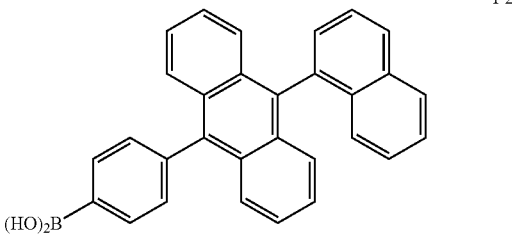

I-2

LCMS(C₅₈H₄₂): calculated 738.3; observed 738.3,

¹H NMR (400 MHz, CDCl₃) ☐ 8.31-8.29 (m, 2H), 8.21 (d, 1H), 7.98 (d, 1H), 7.84-7.64 (m, 16H), 7.57-7.51 (m, 2H), 7.46-7.43 (m, 2H), 7.37-7.27 (m, 6H), 7.08 (dt, 1H), 7.00-6.94 (m, 2H), 1.60 (s, 9H)

Synthesis Example 9: Synthesis of Compound 49

5.14 g of Compound 49 (yield 76%) was obtained by using the same method as in the synthesis of Compound 3, except that 9,9'-diphenyl fluorene-2-boronic acid was used instead of 2-naphthalene boronic acid. The produced compound was confirmed through LCMS and ¹H NMR.

LCMS(C₅₃H₄₀): calculated 676.3; observed 676.3,

¹H NMR (400 MHz, CDCl₃) ☐ 8.31 (d, 1H), 8.26 (s, 1H), 8.20 (d, 1H), 7.94 (d, 1H), 7.90-7.82 (m, 3H), 7.75-7.62 (m, 5H), 7.56-7.42 (m, 3H), 7.34 (dt, 1H), 7.22-7.05 (m, 13H), 6.97 (dt, 1H), 6.86 (d, 1H), 1.58 (s, 9H)

Synthesis Example 10: Synthesis of Compound 62

4.37 g of Compound 62 (yield 67%) was obtained by using the same method as in the synthesis of Compound 3, except that Intermediate I-3 was used instead of 2-naphthalene boronic acid. The produced compound was confirmed through LCMS and ¹H NMR.

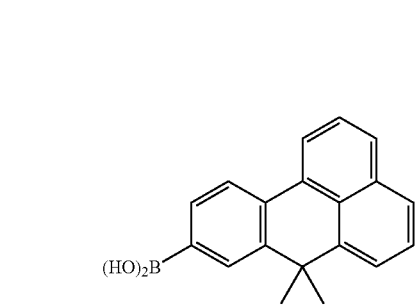

I-3

LCMS(C₅₁H₄₀): calculated 652.3; observed 652.3,

¹H NMR (400 MHz, CDCl₃) ☐ 8.79 (d, 1H), 8.73 (d, 1H), 8.56 (d, 1H), 8.32 (d, 1H), 8.21 (d, 1H), 8.11 (s, 1H), 7.95-7.91 (m, 2H), 7.88-7.79 (m, 4H), 7.74-7.63 (m, 7H), 7.55 (dt, 1H), 7.45 (d, 1H), 7.34-7.26 (m, 2H), 7.07 (dt, 1H), 6.98 (dt, 1H), 1.75 (s, 6H), 1.59 (s, 9H)

Synthesis of Intermediate B

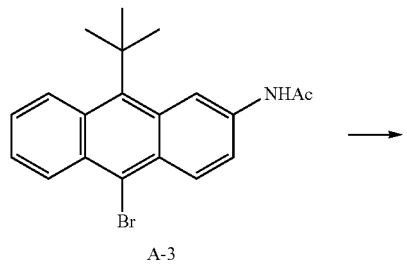

A-3

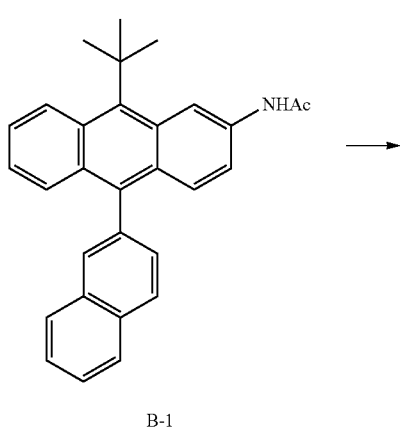

B-1

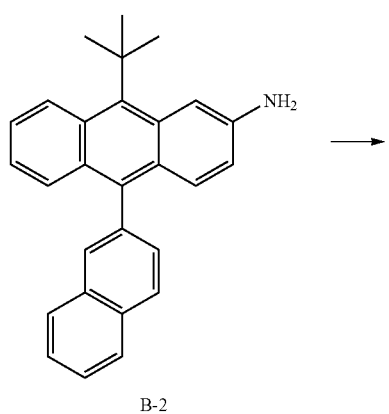

B-2

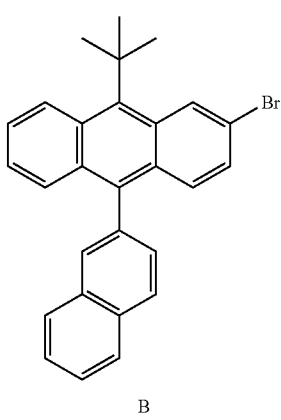

B

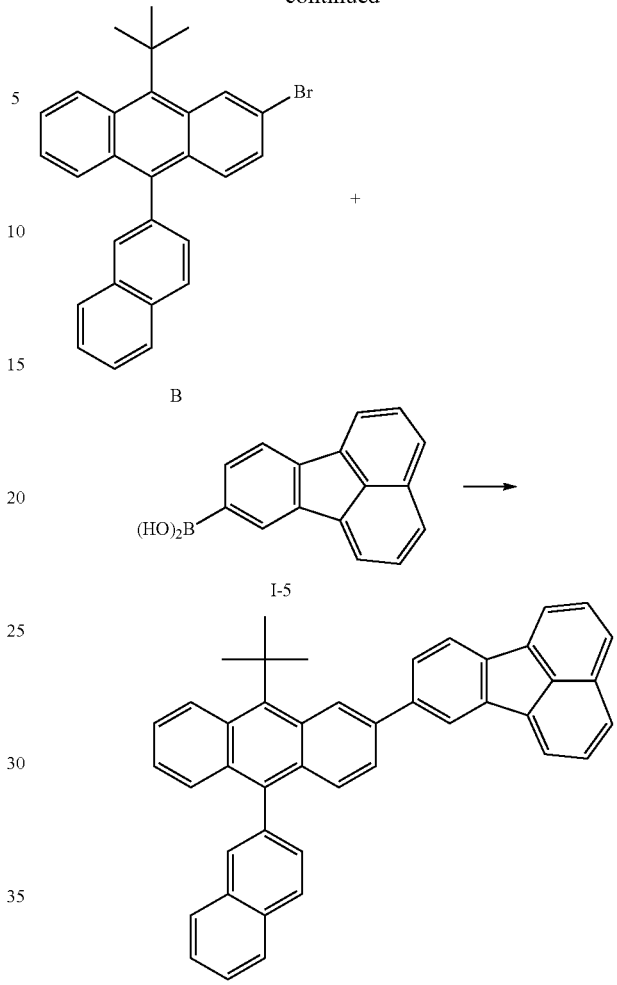

Synthesis of Intermediate B-1

Intermediate B-1 was synthesized by using the same method as in the synthesis of Intermediate A-4, except that 1-naphthalene boronic acid was used instead of 2-naphthalene boronic acid.

Synthesis of Intermediate B-2

Intermediate B-2 was synthesized by using the same method as in the synthesis of Intermediate A-5, except that Intermediate B-1 was used instead of Intermediate A-4.

Synthesis of Intermediate B

Intermediate B was synthesized by using the same method as in the synthesis of Intermediate A, except that Intermediate B-2 was used instead of Intermediate A-5. Intermediate B was confirmed through LCMS and $^1$H NMR.

LCMS($C_{28}H_{23}Br$): calculated 438.1; observed 438.1, $^1$H NMR (400 MHz, CDCl$_3$) □ 8.29 (s, 1H), 8.19 (d, 1H), 8.15 (s, 1H), 7.97-7.88 (m, 5H), 7.62-7.49 (m, 3H), 7.35 (d, 1H), 7.27 (d, 1H), 7.13 (dt, 1H), 1.57 (s, 9H)

Synthesis Example 11: Synthesis of Compound 88

4.37 g of Compound 88 (yield 67%) was synthesized by using the same method as in the synthesis of Compound 1, except that Intermediate B was used instead of Intermediate A and that Intermediate I-5 was used instead of 2-naphthalene boronic acid. The compound produced was confirmed through LCMS and $^1$H NMR.

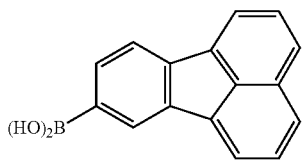

I-5

LCMS($C_{44}H_{32}$): calculated 560.3; observed 560.3, $^1$H NMR (400 MHz, CDCl$_3$) □ 8.39 (s, 1H), 8.22 (d, 1H), 8.15 (s, 1H), 8.12 (s, 1H), 8.02-7.88 (m, 8H), 7.83-7.74 (m, 4H), 7.68-7.50 (m, 6H), 7.14 (dt, 1H), 1.61 (s, 9H)

Synthesis Example 12: Synthesis of Compound 108

4.38 g of Compound 108 (yield 76%) was synthesized by using the same method as in the synthesis of Compound 1, except that Intermediate B was used instead of Intermediate A and that Intermediate I-6 was used instead of 2-naphthalene boronic acid. The compound produced was confirmed through LCMS and $^1$H NMR.

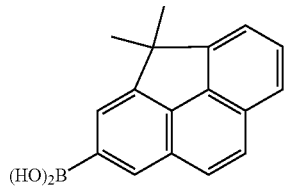

I-6

LCMS($C_{45}H_{36}$): calculated 576.3; observed 576.3, $^1$H NMR (400 MHz, CDCl$_3$) □ 8.22-8.18 (m, 2H), 8.15-8.13 (m, 2H), 7.97-7.88 (m, 5H), 7.75-7.70 (m, 3H), 7.64-7.50 (m, 5H), 7.42 (s, 1H), 7.38 (d, 1H), 7.31 (dd, 1H), 7.12 (dt, 1H), 1.82 (s, 6H), 1.60 (s, 9H) Synthesis of Intermediate C

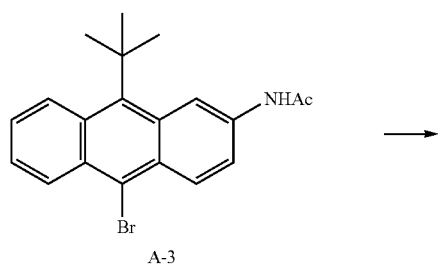

A-3

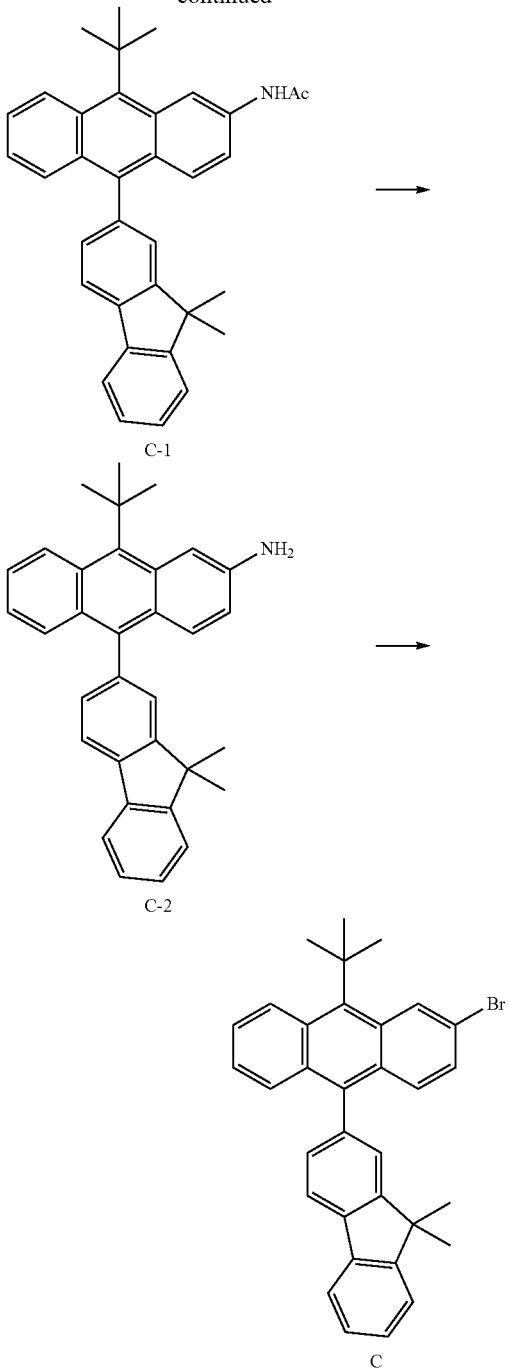

C-1

C-2

C

Synthesis of Intermediate C-1

Intermediate C-1 was prepared by using the same method as in the synthesis of Intermediate A-4, except that 9,9'-dimethyl fluorene-2-boronic acid was used instead of 1-naphthalene boronic acid.

Synthesis of Intermediate C-2

Intermediate C-2 was prepared by using the same method as in the synthesis of Intermediate A-5, except that Intermediate C-1 was used instead of Intermediate A-4.

Synthesis of Intermediate C

Intermediate C was prepared by using the same method as in the synthesis of Intermediate A, except that Intermediate C-2 was used instead of Intermediate A-5. Intermediate C was confirmed through LCMS and $^1$H NMR.

LCMS($C_{33}H_{29}Br$): calculated 504.1; observed 504.1, $^1$H NMR (400 MHz, CDCl$_3$) ☐ 8.29 (s, 1H), 8.20 (d, 1H), 7.96-7.92 (m, 2H), 7.83-7.79 (m, 3H), 7.52 (dt, 1H), 7.37-7.30 (m, 2H), 7.22 (d, 1H), 7.16-7.09 (m, 3H), 1.61 (s, 6H), 1.57 (s, 9H) Synthesis of Intermediate D

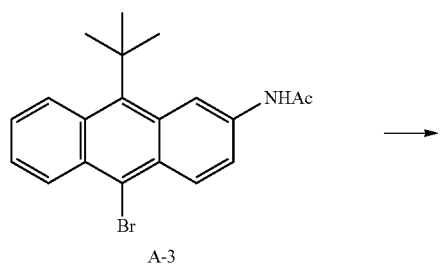

A-3

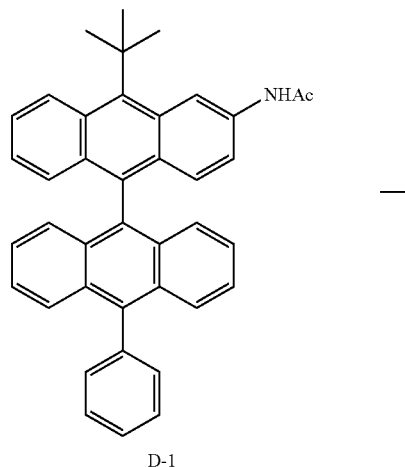

D-1

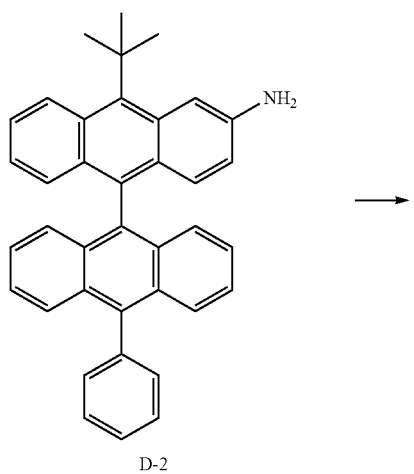

D-2

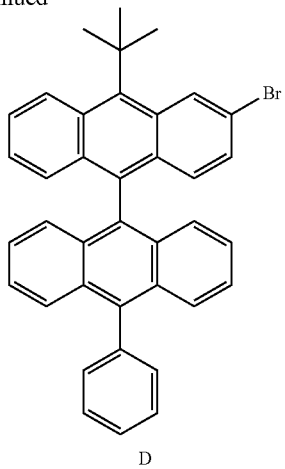

D

Synthesis of Intermediate D-1

Intermediate D-1 was prepared by using the same method as in the synthesis of Intermediate A-4, except that Intermediate I-7 below was used instead of 1-naphthalene boronic acid.

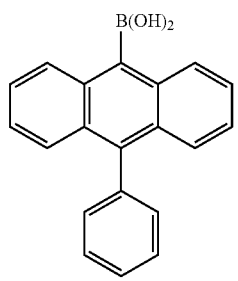

I-7

Synthesis of Intermediate D-2

Intermediate D-2 was prepared by using the same method as in the synthesis of Intermediate A-5, except that Intermediate C-1 below was used instead of Intermediate A-4.

Synthesis of Intermediate D

Intermediate D was prepared by using the same method as in the synthesis of Intermediate A, except that Intermediate C-2 was used instead of Intermediate A-5. Intermediate D was confirmed through LCMS and $^1$H NMR.

LCMS($C_{38}H_{29}Br$): calculated 564.1; observed 564.1, $^1$H NMR (400 MHz, CDCl$_3$) ☐ 8.28 (s, 1H), 8.20 (d, 1H), 7.93 (d, 2H), 7.80-7.76 (m, 2H), 7.60-7.55 (m, 3H), 7.50-7.25 (m, 9H), 7.07 (dt, 1H), 6.94 (d, 1H), 1.57 (s, 9H)

Synthesis Example 13: Synthesis of Compound 121

4.57 g of Compound 121 (yield 73%) was prepared by using the same method as in the synthesis of Intermediate A, except that pyrene-1-boronic acid was used instead of 2-naphthalene boronic acid. The prepared compound was confirmed through LCMS and $^1$H NMR.

LCMS($C_{49}H_{38}$): calculated 626.3; observed 626.3,

¹H NMR (400 MHz, CDCl₃) □ 8.46 (s, 1H), 8.19 (d, 1H), 8.14-8.09 (m, 4H), 8.02-7.99 (m, 3H), 7.96-7.85 (m, 4H), 7.81-7.79 (m, 3H), 7.60 (d, 1H), 7.54-7.50 (m, 1H), 7.38-7.31 (m, 2H), 7.16-7.08 (m, 3H), 1.63 (s, 6H), 1.59 (s, 9H).

Synthesis Example 14: Synthesis of Compound 123

5.36 g of Compound 123 (yield 79%) was prepared by using the same method as in the synthesis of Compound 1, except that Intermediate D was used instead of Intermediate A, and that 9,9'-dimethyl fluorene-2-boronic acid was used. The prepared compound was confirmed through LCMS and ¹H NMR.

LCMS($C_{53}H_{42}$): calculated 678.3; observed 678.3.

¹H NMR (400 MHz, CDCl₃) □ 8.23-8.20 (m, 2H), 8.05 (d, 1H), 7.93 (d, 2H), 7.81-7.74 (m, 5H), 7.67 (d, 1H), 7.60-7.53 (m, 4H), 7.51-7.45 (m, 2H), 7.41-7.26 (m, 5H), 7.16-7.05 (m, 3H), 6.92 (d, 1H), 1.60 (s, 9H), 1.56 (s, 6H)

Example 1

As an anode, a Corning 15 Ω/cm² (1,200 Å) ITO glass substrate was cut into a size of 50 mm×50 mm×0.7 mm, and the ITO glass substrate was ultrasonically washed using isopropyl alcohol and distilled water for 5 minutes, followed by irradiation of UV for about 30 minutes and exposure to ozone for about 10 minutes for cleaning. The ITO glass substrate was then loaded onto a vacuum deposition device.

4,4',4"-tris(2-naphthyl(phenyl)amino)triphenylamine (2-TNATA) was vacuum deposited on the ITO glass substrate to form an HIL having a thickness of 600 Å, and N,N'-bis-[N-(1-naphthyl)N-phenylamino]biphenyl (NPB) was vacuum deposited on the HIL to form an HTL having a thickness of 300 Å.

Compound 3 (host) and 2,3,6,7-tetrahydro-1,1,7,7-tetramethyl-1H,5H,11H-10(2-benzothiazolyl)quinolizine-[9,9a,1gh]coumarin (hereinafter C545T) (dopant) were vacuum deposited on the HTL in a ratio of 98:2 to form an EML having a thickness of 300 Å.

Tris(8-hydroxyquinolinato)aluminum (Alq₃) was vacuum deposited on the EML to form an ETL having a thickness of 300 Å, LiF was vacuum deposited on the ETL to form an EIL having a thickness of 10 Å, and Al was vacuum deposited on the EIL to form a cathode having a thickness of 3,000 Å to manufacture an organic light-emitting device.

Example 2

An organic light-emitting device was manufactured in the same manner as in Example 1, except that Compound 5 was used instead of Compound 3 when forming the EML.

Example 3

An organic light-emitting device was manufactured in the same manner as in Example 1, except that Compound 13 was used instead of Compound 3 when forming the EML.

Example 4

An organic light-emitting device was manufactured in the same manner as in Example 1, except that Compound 14 was used instead of Compound 3 when forming the EML.

Example 5

An organic light-emitting device was manufactured in the same manner as in Example 1, except that Compound 16 was used instead of Compound 3 when forming the EML.

Example 6

An organic light-emitting device was manufactured in the same manner as in Example 1, except that Compound 22 was used instead of Compound 3 when forming the EML.

Example 7

An organic light-emitting device was manufactured in the same manner as in Example 1, except that Compound 23 was used instead of Compound 3 when forming the EML.

Example 8

An organic light-emitting device was manufactured in the same manner as in Example 1, except that Compound 30 was used instead of Compound 3 when forming the EML.

Example 9

An organic light-emitting device was manufactured in the same manner as in Example 1, except that Compound 49 was used instead of Compound 3 when forming the EML.

Example 10

An organic light-emitting device was manufactured in the same manner as in Example 1, except that Compound 53 was used instead of Compound 3 when forming the EML.

Example 11

An organic light-emitting device was manufactured in the same manner as in Example 1, except that Compound 62 was used instead of Compound 3 when forming the EML.

Example 12

An organic light-emitting device was manufactured in the same manner as in Example 1, except that Compound 88 was used instead of Compound 3 when forming the EML.

Example 13

An organic light-emitting device was manufactured in the same manner as in Example 1, except that Compound 108 was used instead of Compound 3 when forming the EML.

Example 14

An organic light-emitting device was manufactured in the same manner as in Example 1, except that Compound 121 was used instead of Compound 3 when forming the EML.

Example 15

An organic light-emitting device was manufactured in the same manner as in Example 1, except that Compound 123 was used instead of Compound 3 when forming the EML.

Example 16

An organic light-emitting device was manufactured in the same manner as in Example 1, except that N,N,N',N'- tetraphenyl-pyrene-1,6-diamine (hereinafter, TPD) was used instead of Compound C545T when forming the EML.

Example 17

An organic light-emitting device was manufactured in the same manner as in Example 16, except that Compound 14 was used instead of Compound 3 when forming the EML.

Example 18

An organic light-emitting device was manufactured in the same manner as in Example 16, except that Compound 16 was used instead of Compound 3 when forming the EML.

Comparative Example 1

An organic light-emitting device was manufactured in the same manner as in Example 1, except that $Alq_a$ was used instead of Compound 3 when forming the EML.

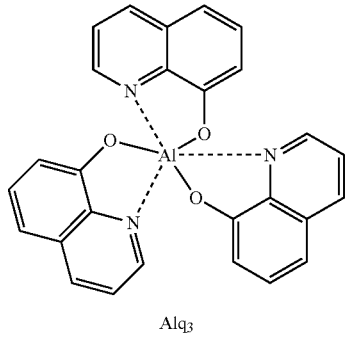

Alq$_3$

Comparative Example 2

An organic light-emitting device was manufactured in the same manner as in Example 1, except that 9,10-di-naptha-lene-2-yl-anthracene (hereinafter, ADN) was used instead of Compound 3 when forming the EML.

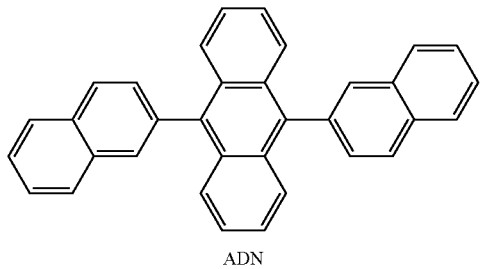 [SMILES: c1ccc2cc(-c3c4ccccc4c(-c4ccc5ccccc5c4)c4ccccc34)ccc2c1]

ADN

Comparative Example 3

An organic light-emitting device was manufactured in the same manner as in Example 1, except that 2-tert-butyl-9,10-di-naphthalene-2-yl-anthracene (hereinafter, TBADN) was used instead of Compound 3 when forming the EML.

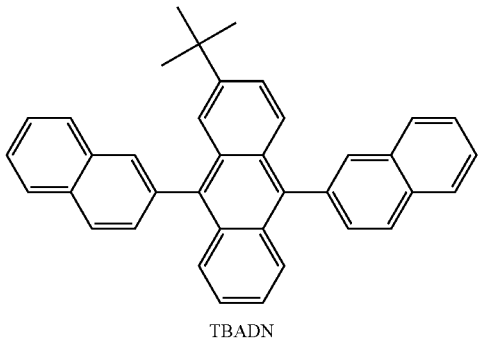 [SMILES: CC(C)(C)c1ccc2c(-c3ccc4ccccc4c3)c3ccccc3c(-c3ccc4ccccc4c3)c2c1]

TBADN

Comparative Example 4

An organic light-emitting device was manufactured in the same manner as in Example 16, except that Compound X was used instead of Compound 3 when forming the EML.

<Compound X>

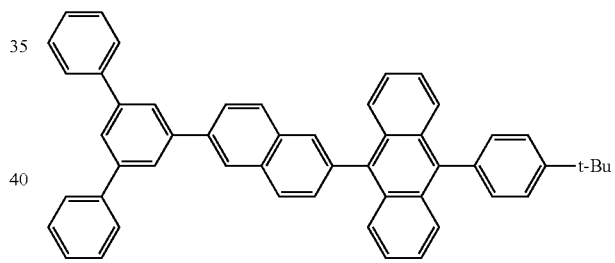

Evaluation Example

Driving voltage, current density, brightness, efficiency, and emitted light color of organic light-emitting devices of Examples 1 and 18, and Comparative Examples 1 and 4 were measured and evaluated by supplying power from a current voltmeter (Keithley SMU 236) and using a spectrophotometer, PR650 Spectroscan Source Measurement Unit (available from PhotoResearch). Results are shown in Table 1 below (half life is time taken until brightness is reduced to 50% when an initial brightness measured under a current condition of 10 mA/cm² is 100%):

TABLE 1

| | Host material Dopant material | Driving voltage (V) | Current density (mA/cm²) | Brightness (cd/m²) | Efficiency (cd/A) | Emitted light color | Lifespan (hr) |
|---|---|---|---|---|---|---|---|
| Example 1 | Compound 3 C545T | 6.12 | 50 | 7,680 | 15.36 | green | 295 hr |

TABLE 1-continued

|  | Host material Dopant material | Driving voltage (V) | Current density (mA/cm$^2$) | Brightness (cd/m$^2$) | Efficiency (cd/A) | Emitted light color | Lifespan (hr) |
| --- | --- | --- | --- | --- | --- | --- | --- |
| Example 2 | Compound 5 C545T | 6.03 | 50 | 8,920 | 17.84 | green | 342 hr |
| Example 3 | Compound 13 C545T | 6.01 | 50 | 9,345 | 18.69 | green | 329 hr |
| Example 4 | Compound 14 C545T | 6.18 | 50 | 8,055 | 16.11 | green | 289 hr |
| Example 5 | Compound 16 C545T | 6.16 | 50 | 7,835 | 15.67 | green | 302 hr |
| Example 6 | Compound 22 C545T | 6.18 | 50 | 8,660 | 17.32 | green | 360 hr |
| Example 7 | Compound 23 C545T | 6.13 | 50 | 8,920 | 17.84 | green | 356 hr |
| Example 8 | Compound 30 C545T | 6.04 | 50 | 9,335 | 18.67 | green | 365 hr |
| Example 9 | Compound 49 C545T | 6.06 | 50 | 9,280 | 18.56 | green | 361 hr |
| Example 10 | Compound 53 C545T | 6.03 | 50 | 9,530 | 19.06 | green | 320 hr |
| Example 11 | Compound 62 C545T | 6.01 | 50 | 9,760 | 19.52 | green | 323 hr |
| Example 12 | Compound 88 C545T | 6.00 | 50 | 9,810 | 19.62 | green | 345 hr |
| Example 13 | Compound 108 C545T | 6.11 | 50 | 9,675 | 19.35 | green | 331 hr |
| Example 14 | Compound 121 C545T | 6.09 | 50 | 9,830 | 19.66 | green | 329 hr |
| Example 15 | Compound 123 C545T | 6.16 | 50 | 8,770 | 17.54 | green | 309 hr |
| Example 16 | Compound 3 TPD | 4.32 | 50 | 2,640 | 5.28 | blue | 190 hr |
| Example 17 | Compound 14 TPD | 4.33 | 50 | 2,565 | 5.13 | blue | 201 hr |
| Example 18 | Compound 16 TPD | 4.27 | 50 | 2,650 | 5.30 | blue | 215 hr |
| Comparative Example 1 | Alq$_3$ C545T | 6.84 | 50 | 6,730 | 13.46 | green | 237 hr |
| Comparative Example 2 | ADN C545T | 4.6 | 50 | 2,260 | 4.52 | blue | 140 hr |
| Comparative Example 3 | TBADN TPD | 4.6 | 50 | 2,280 | 4.56 | blue | 50 hr |
| Comparative Example 4 | Compound X TPD | 4.52 | 50 | 2,340 | 4.68 | blue | 186 hr |

As may be seen in Table 1 above, the organic light-emitting devices of Examples 1 to 18 exhibited better driving voltage, brightness, and efficiency, compared to the organic light-emitting devices of Comparative Examples 1 to 4. Furthermore, the organic light-emitting devices of Examples 1 to 18 had a longer lifespan than the organic light-emitting devices of Comparative Example 1 to 4.

By way of summation and review, an OLED may have a structure that includes, e.g., a first electrode, a hole-transporting layer (HTL), an emission layer (EML), an electron-transporting layer (ETL), and a second electrode, which are sequentially stacked on the substrate. Holes injected from the first electrode may move to the EML via the HTL, and electrons injected from the second electrode may move to the EML via the ETL. Carriers such as the holes and the electrons may recombine in the EML to generate excitons. When the excitons drop from an excited state to a ground state, light may be emitted.

As described above, according to the one or more of the above embodiments, the anthracene-based compound has excellent thermal stability, electrical and light-emission properties, and may help prevent crystallization during the formation of an organic layer, thereby providing an organic light-emitting device having low voltage, high brightness, and long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
   a first electrode;
   a second electrode opposite to the first electrode; and
   an organic layer between the first electrode and the second electrode, the organic layer including an emission layer, a hole-transporting region and an electron-transporting region,
   wherein the emission layer includes an anthracene-based compound represented by Formula 1, below, as a host:

<Formula 1>

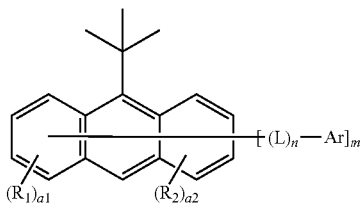

in Formula 1 above,

L is a phenylene group, an anthracenylene group, a pyrenylene group, or a fluorenylene group; or a phenylene group, an anthracenylene group, a pyrenylene group, or a fluorenylene group, each substituted with hydrogen, deuterium, halogen, a hydroxyl group, a cyano group, a nitro group, an amino group, a carboxylic acid group, a substituted or unsubstituted C1-C30 alkyl group, a substituted or unsubstituted C2-C30 alkenyl group, a substituted or unsubstituted C2-C30 alkynyl group, a substituted or unsubstituted C1-C30 alkoxy group, a substituted or unsubstituted C3-C30 cycloalkyl group, a substituted or unsubstituted C3-C30 cycloalkenyl group, a substituted or unsubstituted C6-C30 aryl group, a substituted or unsubstituted C6-C30 aryloxy group, a substituted or unsubstituted C6-C30 arylthio group, a substituted or unsubstituted C2-C10 heterocycloalkyl group, a substituted or unsubstituted C2-C10 heterocycloalkenyl group, or a substituted or unsubstituted C2-C30 heteroaryl group;

n is an integer of 0 to 3;

m is 2 or 3;

one of $*\text{-}(L)_n\text{-}Ar$ being position at carbon number 10 of the anthracene moiety of Formula 1, $R_1$ and $R_2$ are each independently hydrogen, deuterium, halogen, a hydroxyl group, a cyano group, a nitro group, an amino group, a carboxylic acid group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_3$-$C_{30}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{10}$ heterocycloalkyl group, a substituted or unsubstituted $C_2$-$C_{10}$ heterocycloalkenyl group, or a substituted or unsubstituted $C_2$-$C_{30}$ heteroaryl group;

a1 and a2 are each independently an integer of 0 to 2; and

Ar group is independently selected from Formula 4-1 and 4-4 to 4-27, below:

4-1

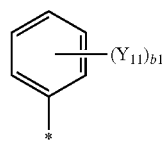

4-4

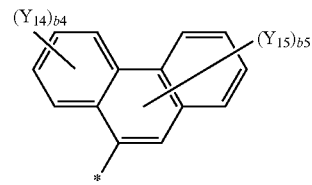

4-5

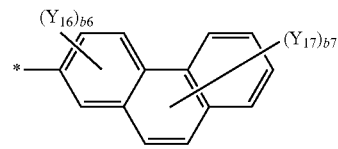

4-6

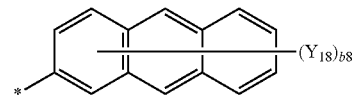

4-7

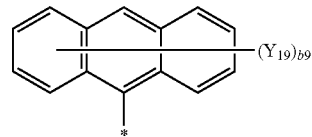

4-8

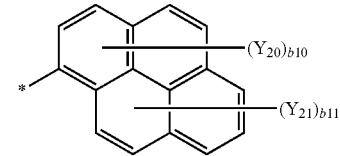

4-9

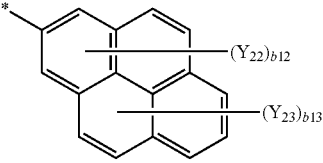

4-10

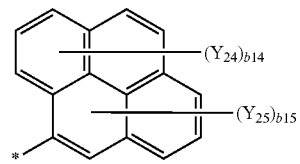

4-11

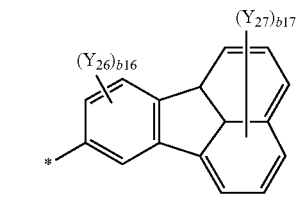

4-12

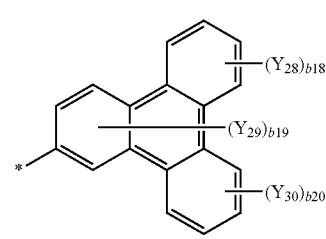

4-13 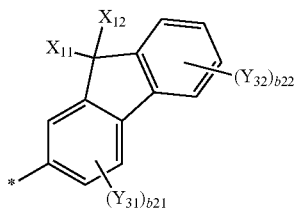
4-14 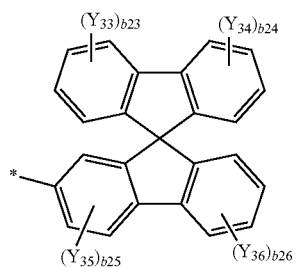
4-15 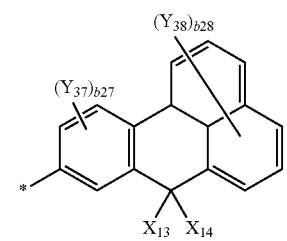
4-16 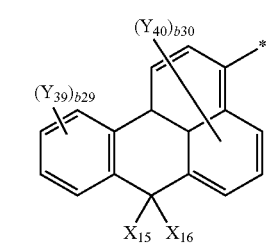
4-17 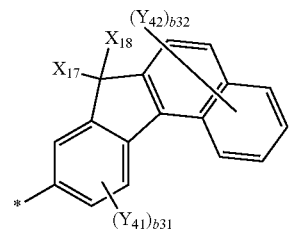
4-18 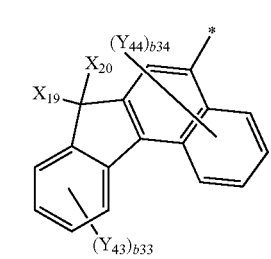
4-19 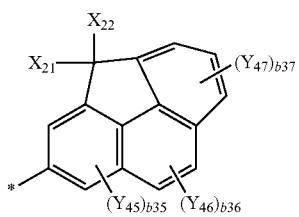
4-20 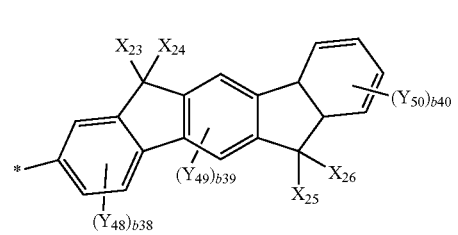
4-21 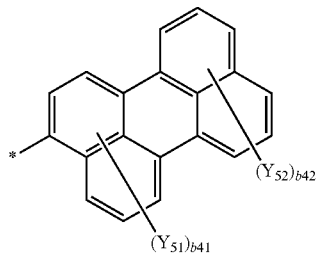
4-22 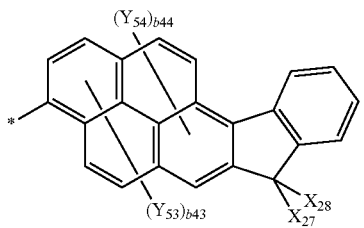
4-23 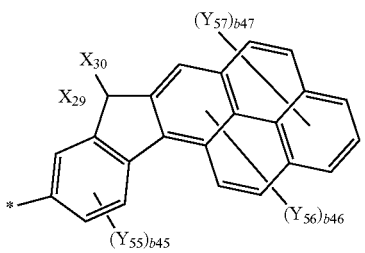
4-24 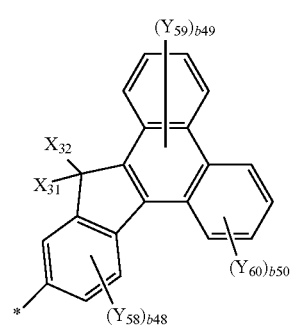

-continued

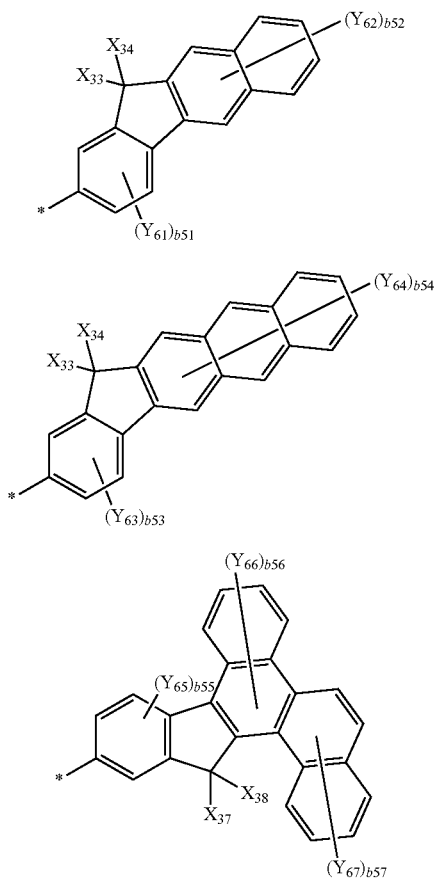

4-25

4-26

4-27 in Formula 4-1 and 4-4 to 4-27 above, $Y_{11}$ and $Y_{13}$ to $Y_{67}$ are each independently:

deuterium, a halogen atom, a cyano group, a nitro group, a methyl group, an ethyl group, a tert-butyl group, or —Si($Q_1$)($Q_2$)($Q_3$), in which $Q_1$ to $Q_3$ are each independently a methyl group or a phenyl group, or a phenyl group, a naphthyl group, a fluorenyl group, a benzofluorenyl group, or a cyclopentaphenanthrenyl group, each substituted with a methyl group;

b1 and b3 to b57 are each independently an integer of 0 to 2;

$X_{11}$ to $X_{38}$ are each independently a methyl group or a phenyl group; and \* is a binding site to an anthracene core or L.

2. The organic light emitting device as claimed in claim 1, wherein L is:

a phenylene group, an anthracenylene group, a pyrenylene group, or a fluorenylene group; or a phenylene group, an anthracenylene group, a pyrenylene group, or a fluorenylene group, each substituted with deuterium, —F, a cyano group, a nitro group, a methyl group, an ethyl group, an n-propyl group, an iso-propyl group, an n-butyl group, a sec-butyl group, an iso-butyl group, or a tert-butyl group.

3. The organic light emitting device as claimed in claim 1, wherein n is an integer of 0 to 2.

4. The organic light emitting device as claimed in claim 1, wherein:

n is an integer of 1 to 3, and a moiety represented by $(L)_n$ is represented by one of Formula 2-1, 2-2, 2-5, 2-8 and 2-9, below:

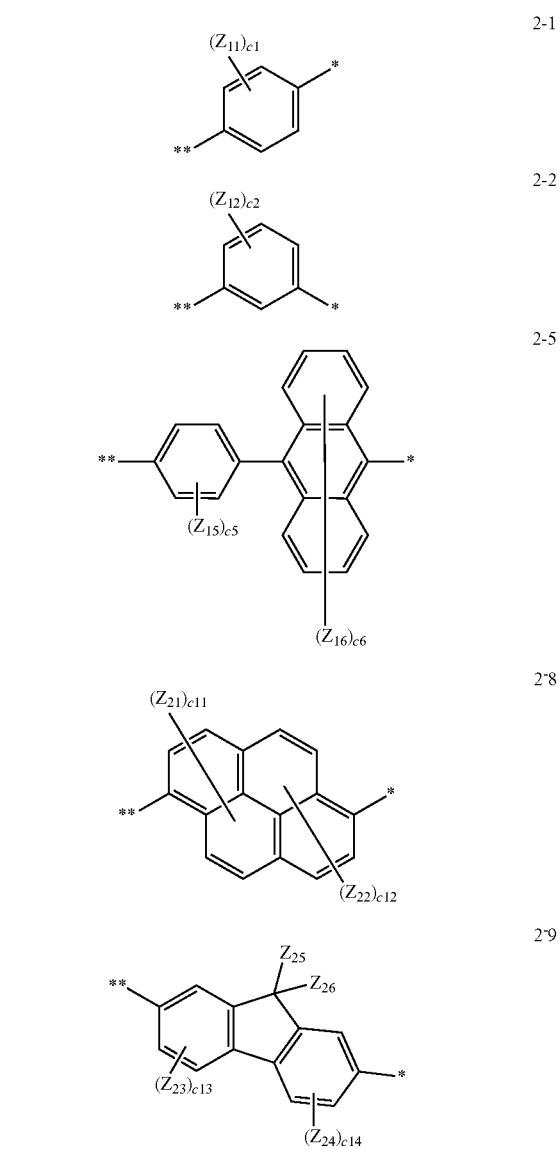

2-1

2-2

2-5

2-8

2-9 in Formulae 2-1, 2-2, 2-5, 2-8 and 2-9 above, $Z_{11}$ to $Z_{26}$ are each independently deuterium, —F, a cyano group, a nitro group, a methyl group, an ethyl group, an n-propyl group, an iso-propyl group, an n-butyl group, a sec-butyl group, an iso-butyl group, or a tert-butyl group;

c1 to c14 are each independently an integer of 0 to 3;

\*\* is a binding site to an anthracene core, and \* is a binding site to Ar.

5. The organic light emitting device as claimed in claim 1, wherein:

n is an integer of 1 to 3, and a moiety represented by $(L)_n$ is represented by one of Formula 3-1, 3-2, 3-5, 3-8 and 3-9, below:

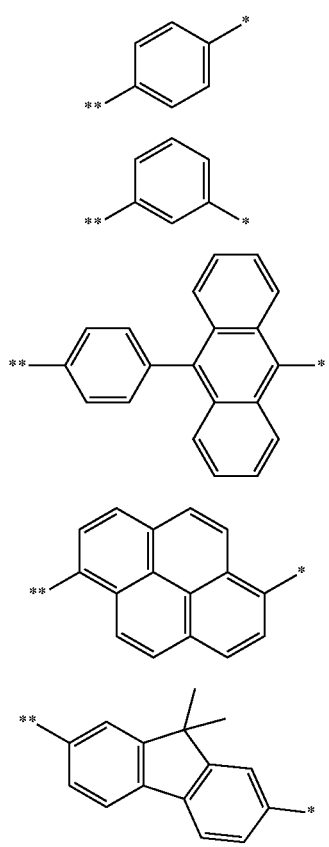

in Formula 3-1, 3-2, 3-5, 3-8 and 3-9 above, ** is a binding site to an anthracene core, and * is a binding site to Ar.

6. The organic light emitting device as claimed in claim 1, wherein the anthracene-based compound represented by Formula 1 is represented by Formula 1a below:

<Formula 1a>

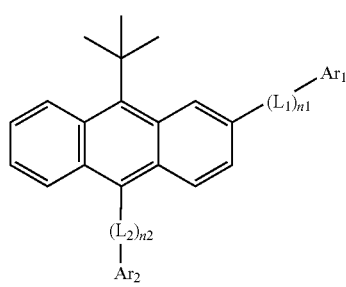

wherein, in Formula 1a above,
$L_1$ and $L_2$ are each independently defined the same as L of Formula 1;
n1 and n2 are each independently an integer of 0 to 2; and
$Ar_1$ and $Ar_2$ are each independently defined the same as Ar of Formula 1.

7. The organic light emitting device as claimed in claim 6, wherein $L_1$ and $L_2$ are each independently:
a phenylene group, an anthracenylene group, a pyrenylene group, or a fluorenylene group; or
a phenylene group, an anthracenylene group, a pyrenylene group, or a fluorenylene group, each substituted with deuterium, —F, a cyano group, a nitro group, a methyl group, an ethyl group, an n-propyl group, an iso-propyl group, an n-butyl group, a sec-butyl group, an iso-butyl group, or a tert-butyl group.

8. The organic light emitting device as claimed in claim 6, wherein:
n1 or n2 is 1 or 2, and
the moieties represented by $(L_1)_{n1}$ and $(L_2)_{n2}$ are each independently represented by one of Formula 3-1, 3-2, 3-5, 3-8 and 3-9, below:

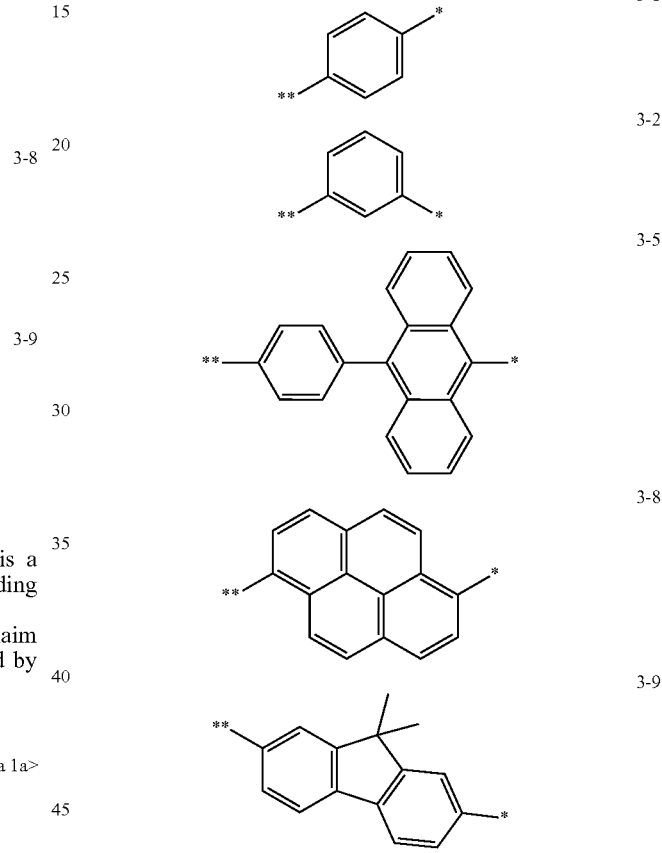

in Formula 3-1, 3-2, 3-5, 3-8 and 3-9 above, ** is a binding site to an anthracene core, and * is a binding site to $Ar_1$ or $Ar_2$.

9. The organic light emitting device as claimed in claim 1, wherein the anthracene-based compound represented by Formula 1 is represented by one of Formula 1b to 1d below:

<Formula 1b>

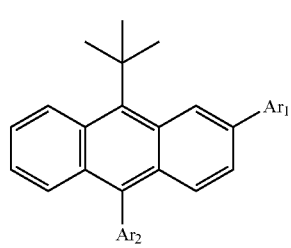

<Formula 1c>

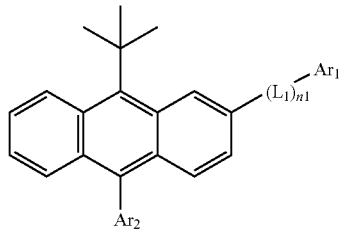

<Formula 1d>

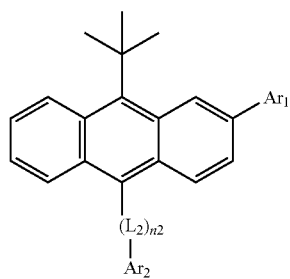

wherein, in Formulae 1b to 1d above, $L_1$ and $L_2$ are each independently defined the same as L of Formula 1;

n1 and n2 are each independently an integer of 1 or 2; and $Ar_1$ and $Ar_2$ are each independently defined the same as Ar of Formula 1.

10. The organic light emitting device as claimed in claim 1, wherein the anthracene-based compound represented by Formula 1 is one of Compound 112 to Compound 126 and Compound 128 to Compound 134, below:

112

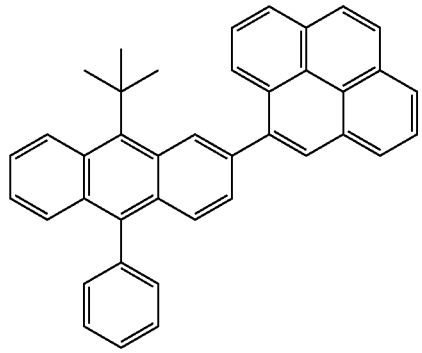

113

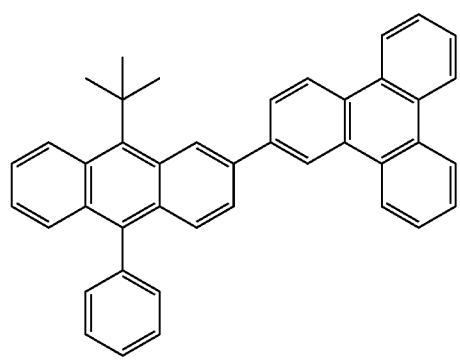

114

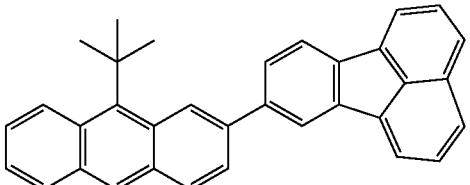

115

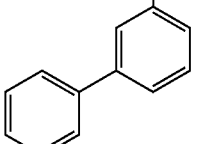

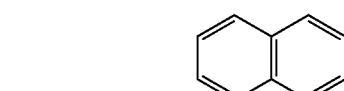

116

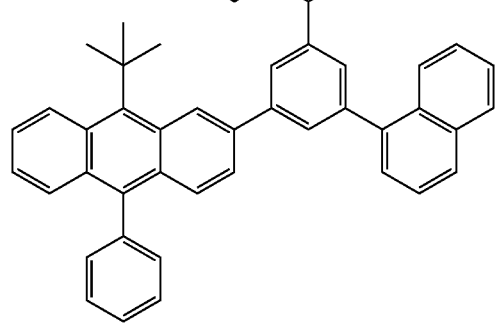

117

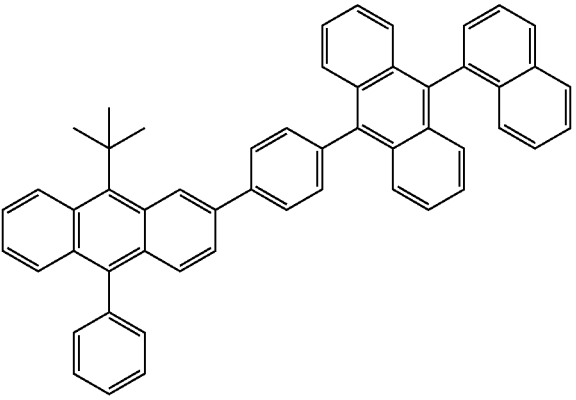

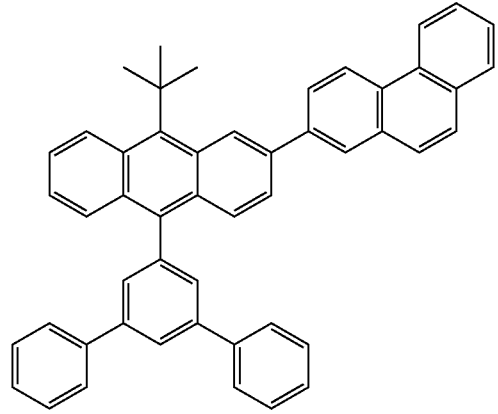

127
-continued
128
-continued
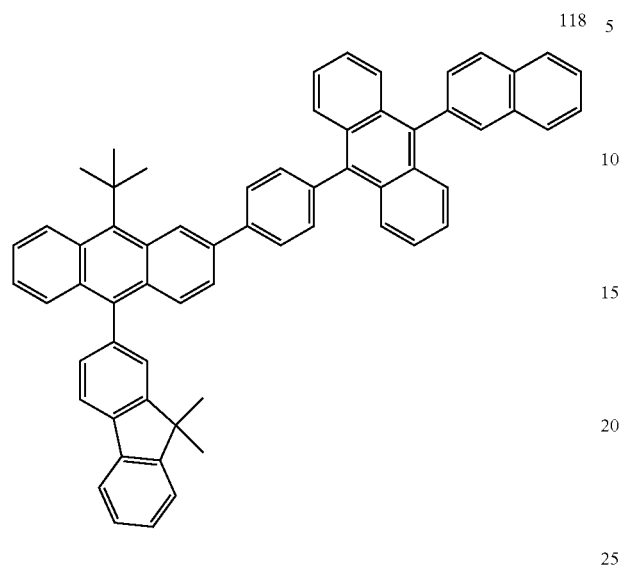
118
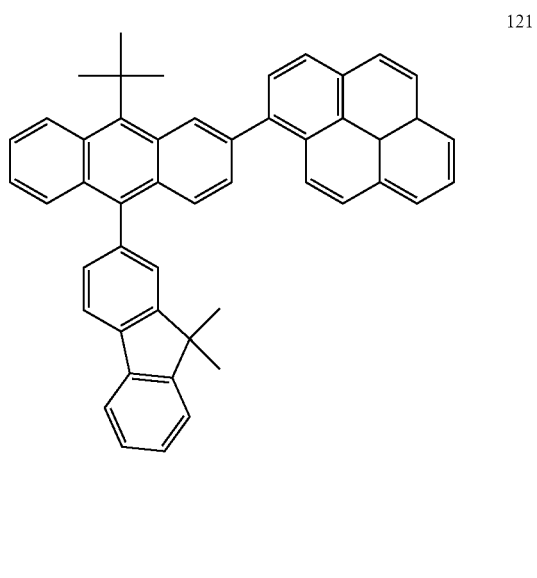
121
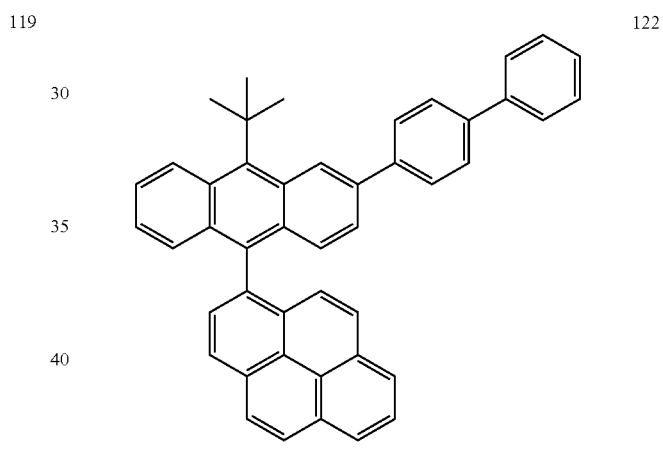
119
122
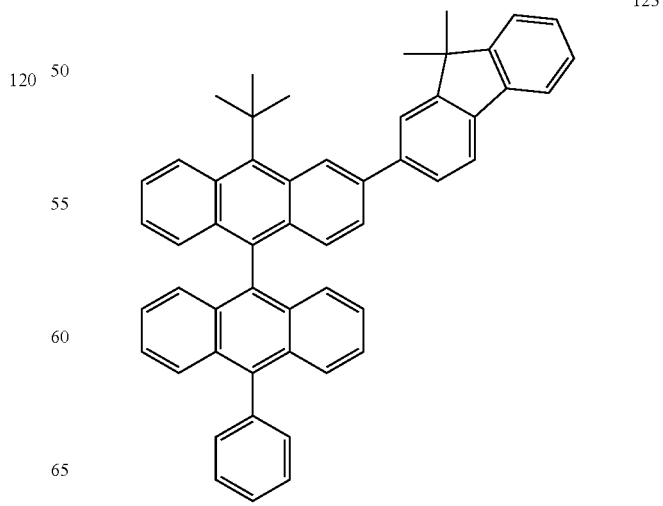
120
123

124
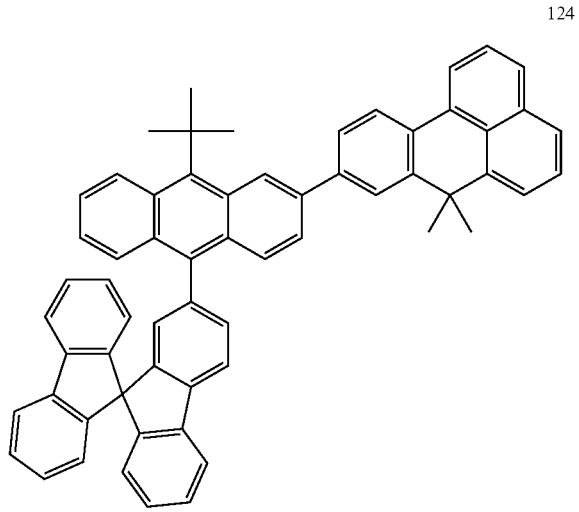
125
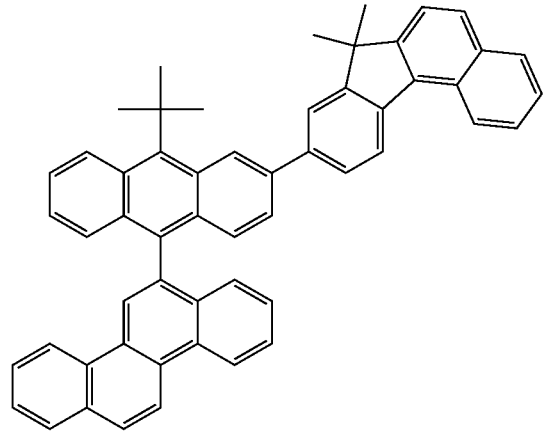
126
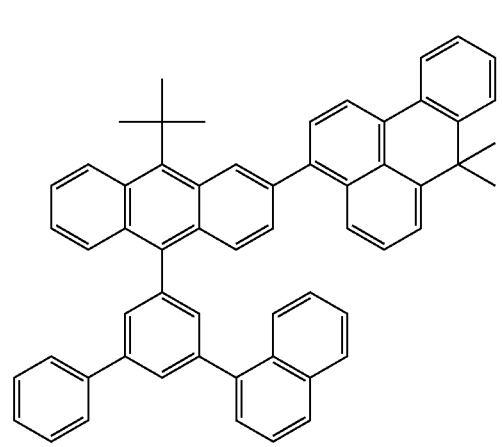
128
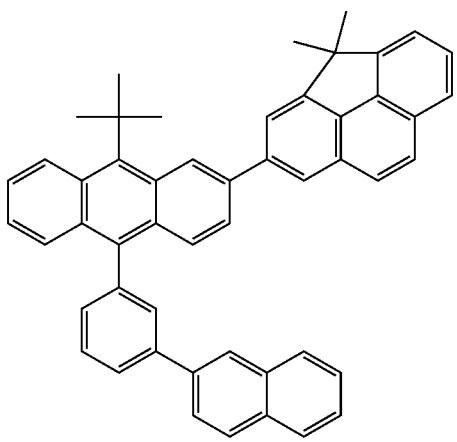
129
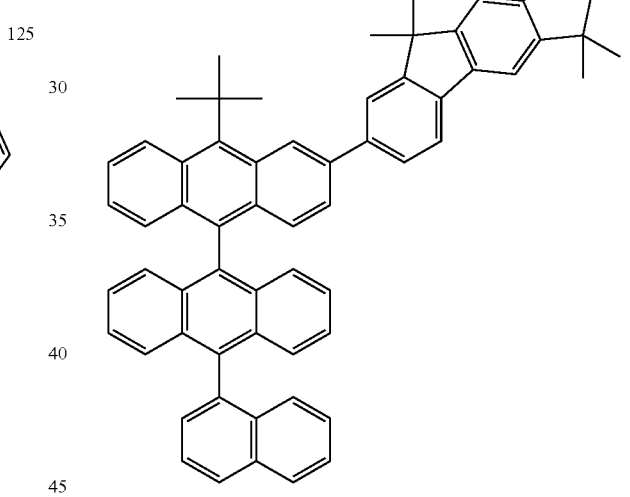
130
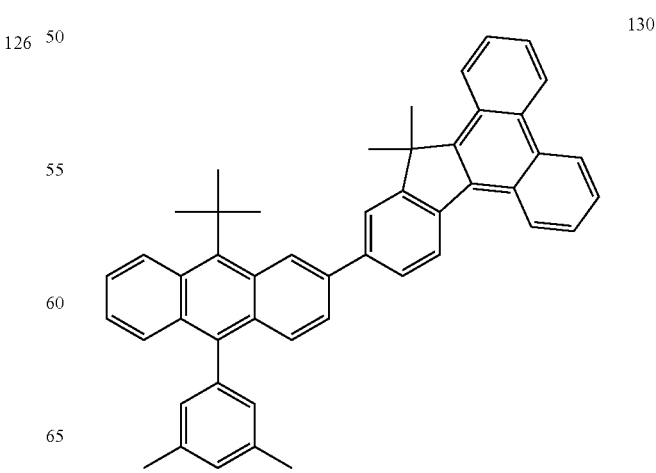

-continued

131

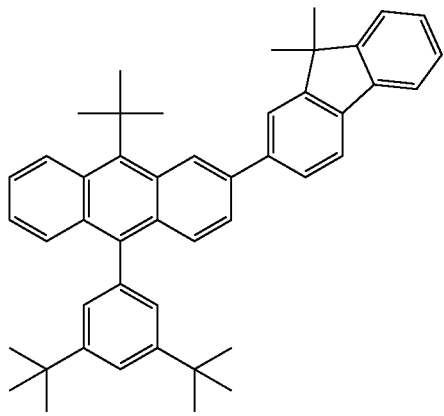

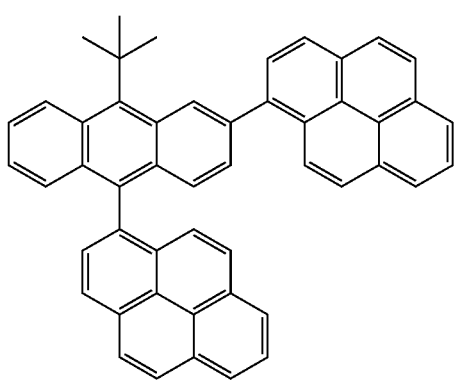

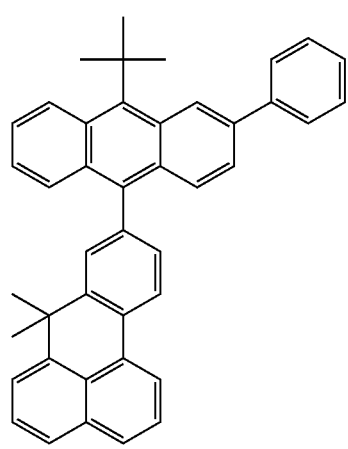

-continued

132

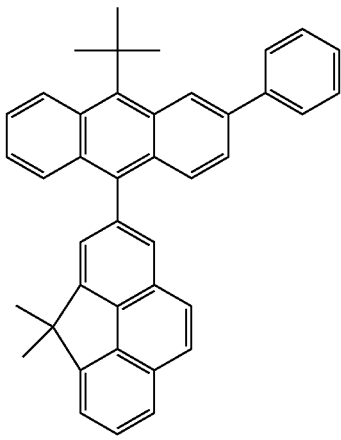

133

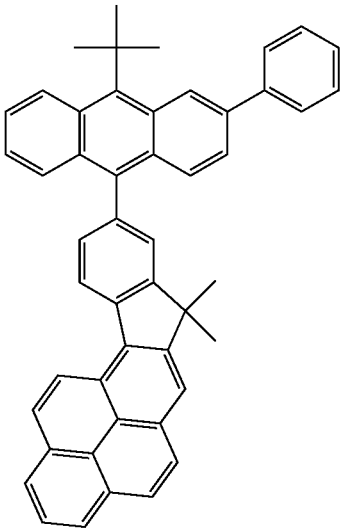

134

11. The organic light-emitting device as claimed in claim 1, wherein the organic layer includes:
a hole-transporting region between the first electrode and the emission layer, the hole-transporting region including at least one of a hole-injecting layer, a hole-transporting layer, a functional layer having both hole-injecting and hole-transporting capabilities, a buffer layer, and an electron blocking layer, and
an electron-transporting region between the emission layer and the second electrode, the electron-transporting region including at least one of a hole-blocking layer, an electron-transporting layer, and an electron-injecting layer.

12. The organic light-emitting device as claimed in claim 1, wherein:
the emission layer further includes a dopant, and
the anthracene-based compound is a host.

* * * * *